United States Patent
Resch et al.

(10) Patent No.: US 10,362,111 B2
(45) Date of Patent: *Jul. 23, 2019

(54) SELECTING A DATA STORAGE RESOURCE OF A DISPERSED STORAGE NETWORK

(71) Applicant: International Business Machines Corporation, Armonk, NY (US)

(72) Inventors: Jason K. Resch, Chicago, IL (US); Wesley Leggette, Chicago, IL (US); Greg Dhuse, Chicago, IL (US)

(73) Assignee: International Business Machines Corporation, Armonk, NY (US)

( * ) Notice: Subject to any disclaimer, the term of this patent is extended or adjusted under 35 U.S.C. 154(b) by 3 days.

This patent is subject to a terminal disclaimer.

(21) Appl. No.: 15/812,706

(22) Filed: Nov. 14, 2017

(65) Prior Publication Data
US 2018/0077238 A1    Mar. 15, 2018

Related U.S. Application Data

(63) Continuation of application No. 14/956,818, filed on Dec. 2, 2015, now Pat. No. 9,826,038.

(60) Provisional application No. 62/109,712, filed on Jan. 30, 2015.

(51) Int. Cl.
*H03M 13/15* (2006.01)
*H04L 29/08* (2006.01)
*H03M 13/37* (2006.01)
*H03M 13/09* (2006.01)

(52) U.S. Cl.
CPC .... *H04L 67/1097* (2013.01); *H03M 13/3761* (2013.01); *H03M 13/09* (2013.01); *H03M 13/1515* (2013.01)

(58) Field of Classification Search
CPC ........................................................ H03M 13/15
USPC ........................................ 714/759, 761, 758
See application file for complete search history.

(56) References Cited

U.S. PATENT DOCUMENTS

| | | |
|---|---|---|
| 4,092,732 A | 5/1978 | Ouchi |
| 5,454,101 A | 9/1995 | Mackay et al. |
| 5,485,474 A | 1/1996 | Rabin |
| 5,774,643 A | 6/1998 | Lubbers et al. |

(Continued)

OTHER PUBLICATIONS

Chung; An Automatic Data Segmentation Method for 3D Measured Data Points; National Taiwan University; pp. 1-8; 1998.

(Continued)

*Primary Examiner* — Fritz Alphonse
(74) *Attorney, Agent, or Firm* — Garlick & Markison; Timothy W. Markison; Patricia A. Markison

(57) ABSTRACT

A method includes receiving, by a storage unit of a set of storage units of a dispersed storage network (DSN) from a computing device of the DSN, a write request of a set of write requests regarding an encoded data slice of a set of encoded data slices. The write request includes a write set information table that includes a listing of which storage unit of the set of storage units is being sent which encoded data slice of the set of encoded data slices for storage therein. The method further includes interpreting the write set information table to determine that a particular encoded data slice assigned to a particular storage unit should be stored by a different storage unit. The method further includes facilitating storing of the particular encoded data slice in the different storage unit.

14 Claims, 60 Drawing Sheets

(56) References Cited

U.S. PATENT DOCUMENTS

| | | | |
|---|---|---|---|
| 5,802,364 | A | 9/1998 | Senator et al. |
| 5,809,285 | A | 9/1998 | Hilland |
| 5,890,156 | A | 3/1999 | Rekieta et al. |
| 5,987,622 | A | 11/1999 | Lo Verso et al. |
| 5,991,414 | A | 11/1999 | Garay et al. |
| 6,012,159 | A | 1/2000 | Fischer et al. |
| 6,058,454 | A | 5/2000 | Gerlach et al. |
| 6,128,277 | A | 10/2000 | Bruck et al. |
| 6,175,571 | B1 | 1/2001 | Haddock et al. |
| 6,192,472 | B1 | 2/2001 | Garay et al. |
| 6,256,688 | B1 | 7/2001 | Suetaka et al. |
| 6,272,658 | B1 | 8/2001 | Steele et al. |
| 6,301,604 | B1 | 10/2001 | Nojima |
| 6,356,949 | B1 | 3/2002 | Katsandres et al. |
| 6,366,995 | B1 | 4/2002 | Vilkov et al. |
| 6,374,336 | B1 | 4/2002 | Peters et al. |
| 6,415,373 | B1 | 7/2002 | Peters et al. |
| 6,418,539 | B1 | 7/2002 | Walker |
| 6,449,688 | B1 | 9/2002 | Peters et al. |
| 6,567,948 | B2 | 5/2003 | Steele et al. |
| 6,571,282 | B1 | 5/2003 | Bowman-Amuah |
| 6,609,223 | B1 | 8/2003 | Wolfgang |
| 6,718,361 | B1 | 4/2004 | Basani et al. |
| 6,760,808 | B2 | 7/2004 | Peters et al. |
| 6,785,768 | B2 | 8/2004 | Peters et al. |
| 6,785,783 | B2 | 8/2004 | Buckland |
| 6,826,711 | B2 | 11/2004 | Moulton et al. |
| 6,879,596 | B1 | 4/2005 | Dooply |
| 7,003,688 | B1 | 2/2006 | Pittelkow et al. |
| 7,024,451 | B2 | 4/2006 | Jorgenson |
| 7,024,609 | B2 | 4/2006 | Wolfgang et al. |
| 7,080,101 | B1 | 7/2006 | Watson et al. |
| 7,103,824 | B2 | 9/2006 | Halford |
| 7,103,915 | B2 | 9/2006 | Redlich et al. |
| 7,111,115 | B2 | 9/2006 | Peters et al. |
| 7,140,044 | B2 | 11/2006 | Redlich et al. |
| 7,146,644 | B2 | 12/2006 | Redlich et al. |
| 7,171,493 | B2 | 1/2007 | Shu et al. |
| 7,222,133 | B1 | 5/2007 | Raipurkar et al. |
| 7,240,236 | B2 | 7/2007 | Cutts et al. |
| 7,272,613 | B2 | 9/2007 | Sim et al. |
| 7,636,724 | B2 | 12/2009 | de la Torre et al. |
| 9,900,316 | B2 * | 2/2018 | Resch .................. H04L 63/101 |
| 2002/0062422 | A1 | 5/2002 | Butterworth et al. |
| 2002/0166079 | A1 | 11/2002 | Ulrich et al. |
| 2003/0018927 | A1 | 1/2003 | Gadir et al. |
| 2003/0037261 | A1 | 2/2003 | Meffert et al. |
| 2003/0065617 | A1 | 4/2003 | Watkins et al. |
| 2003/0084020 | A1 | 5/2003 | Shu |
| 2004/0024963 | A1 | 2/2004 | Talagala et al. |
| 2004/0122917 | A1 | 6/2004 | Menon et al. |
| 2004/0215998 | A1 | 10/2004 | Buxton et al. |
| 2004/0228493 | A1 | 11/2004 | Ma |
| 2005/0100022 | A1 | 5/2005 | Ramprashad |
| 2005/0114594 | A1 | 5/2005 | Corbett et al. |
| 2005/0125593 | A1 | 6/2005 | Karpoff et al. |
| 2005/0131993 | A1 | 6/2005 | Fatula |
| 2005/0132070 | A1 | 6/2005 | Redlich et al. |
| 2005/0144382 | A1 | 6/2005 | Schmisseur |
| 2005/0229069 | A1 | 10/2005 | Hassner et al. |
| 2006/0047907 | A1 | 3/2006 | Shiga et al. |
| 2006/0136448 | A1 | 6/2006 | Cialini et al. |
| 2006/0156059 | A1 | 7/2006 | Kitamura |
| 2006/0224603 | A1 | 10/2006 | Correll |
| 2007/0079081 | A1 | 4/2007 | Gladwin et al. |
| 2007/0079082 | A1 | 4/2007 | Gladwin et al. |
| 2007/0079083 | A1 | 4/2007 | Gladwin et al. |
| 2007/0088970 | A1 | 4/2007 | Buxton et al. |
| 2007/0174192 | A1 | 7/2007 | Gladwin et al. |
| 2007/0214285 | A1 | 9/2007 | Au et al. |
| 2007/0234110 | A1 | 10/2007 | Soran et al. |
| 2007/0283167 | A1 | 12/2007 | Venters et al. |
| 2009/0094251 | A1 | 4/2009 | Gladwin et al. |
| 2009/0094318 | A1 | 4/2009 | Gladwin et al. |
| 2010/0023524 | A1 | 1/2010 | Gladwin et al. |
| 2015/0227414 | A1 | 8/2015 | Varma |
| 2016/0117219 | A1 | 4/2016 | Halbert et al. |
| 2016/0226522 | A1 * | 8/2016 | Resch .................. H04L 67/1097 |

OTHER PUBLICATIONS

Harrison; Lightweight Directory Access Protocol (LDAP): Authentication Methods and Security Mechanisms; IETF Network Working Group; RFC 4513; Jun. 2006; pp. 1-32.

Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

Legg; Lightweight Directory Access Protocol (LDAP): Syntaxes and Matching Rules; IETF Network Working Group; RFC 4517; Jun. 2006; pp. 1-50.

Plank, T1: Erasure Codes for Storage Applications; FAST2005, 4th Usenix Conference on File Storage Technologies; Dec. 13-16, 2005; pp. 1-74.

Rabin; Efficient Dispersal of Information for Security, Load Balancing, and Fault Tolerance; Journal of the Association for Computer Machinery; vol. 36, No. 2; Apr. 1989; pp. 335-348.

Satran, et al.; Internet Small Computer Systems Interface (iSCSI); IETF Network Working Group; RFC 3720; Apr. 2004; pp. 1-257.

Sciberras; Lightweight Directory Access Protocol (LDAP): Schema for User Applications; IETF Network Working Group; RFC 4519; Jun. 2006; pp. 1-33.

Sermersheim; Lightweight Directory Access Protocol (LDAP): The Protocol; IETF Network Working Group; RFC 4511; Jun. 2006; pp. 1-68.

Shamir; How to Share a Secret; Communications of the ACM; vol. 22, No. 11; Nov. 1979; pp. 612-613.

Smith; Lightweight Directory Access Protocol (LDAP): String Representation of Search Filters; IETF Network Working Group; RFC 4515; Jun. 2006; pp. 1-12.

Smith; Lightweight Directory Access Protocol (LDAP): Uniform Resource Locator; IETF Network Working Group; RFC 4516; Jun. 2006; pp. 1-15.

Wildi; Java iSCSi Initiator; Master Thesis; Department of Computer and Information Science, University of Konstanz; Feb. 2007; 60 pgs.

Xin, et al.; Evaluation of Distributed Recovery in Large-Scale Storage Systems; 13th IEEE International Symposium on High Performance Distributed Computing; Jun. 2004; pp. 172-181.

Zeilenga; Lightweight Directory Access Protocol (LDAP): Internationalized String Preparation; IETF Network Norking Group; RFC 4518; Jun. 2006; pp. 1-14.

Zeilenga; Lightweight Directory Access Protocol (LDAP): Technical Specification Road Map; IETF Network Working Group; RFC 4510; Jun. 2006; pp. 1-8.

Zeilenga; Lightweight Directory Access Protocol (LDAP): Directory Information Models; IETF Network Working Group; RFC 4512; Jun. 2006; pp. 1-49.

Zeilenga; Lightweight Directory Access Protocol (LDAP): String Representation of Distinguished Names; IETF Network Working Group; RFC 4514; Jun. 2006; pp. 1-15.

* cited by examiner

DST allocation info 242 | data partition info 320: data ID; No. of partitions; Addr. info for each partition; format conversion indication task execution info 322

| task 326 | task ordering 328 | data partition 330 | set of DT EX mods 332 | Name 334 | interm. result processing 336 | scratch pad storage 338 | intermediate result storage 340 |
|---|---|---|---|---|---|---|---|
| 1_1 | none | 2_1 - 2_z | 1_1, 2_1, 3_1, 4_1, & 5_1 | R1-1 | DST unit 1 | DST unit 1 | DST units 1-5 |
| 1_2 | none | 2_1 - 2_4 | 1_1, 2_1, 3_1, 4_1, & 5_1 | R1-2 | DST unit 1 | DST unit 1 | DST units 1-5 |
| 1_3 | none | 2_1 - 2_4<br>2_5 - 2_z | 1_1, 2_1, 3_1, 4_1, & 5_1<br>1_2, 2_2, 3_2, 4_2, & 5_2 | R1-3 | DST unit 2 | DST unit 2 | DST units 2-6 |
| 1_4 | after 1_3 | R1-3_1 - R1-3_4<br>R1-3_5 - R1-3_z | 1_1, 2_1, 3_1, 4_1, & 5_1<br>1_2, 2_2, 6_1, 7_1, & 7_2 | R1-4 | DST unit 3 | DST unit 3 | DST units 3-7 |
| 1_5 | after 1_4 | R1-4_1 - R1-4_z &<br>2_1 - 2_z | 1_1, 2_1, 3_1, 4_1, & 5_1 | R1-5 | DST unit 1 | DST unit 1 | DST units 1-5 |
| 1_6 | after 1_1 &<br>1_5 | R1-1_1 - R1-1_z &<br>R1-5_1 - R1-5_z | 1_2, 2_2, 3_2, 4_2, & 5_2 | R1-6 | DST unit 2 | DST unit 2 | DST units 2-6 |
| 1_7 | after 1_2 &<br>1_5 | R1-2_1 - R1-2_z &<br>R1-5_1 - R1-5_z | 3_1, 4_1, 5_1, 6_1, & 7_1 | R1-7 | DST unit 7 | DST unit 7 | DST units 3-7 |
| 2 | none | 2_1 - 2_z | 3_1, 4_1, 5_1, 6_1, & 7_1 | R2 | DST unit 7 | DST unit 7 | DST units 7, 1-4 |
| 3_1 | none (same as 1_3) | use R1_3 | | R1-1 | | | |
| 3_2 | after 3_1 | R1-3_1 - R1-3_z | 1_2, 2_2, 3_2, 4_2, & 5_2 | R3-2 | DST unit 5 | DST unit 5 | DST units 5,6, 1-3 |

FIG. 32

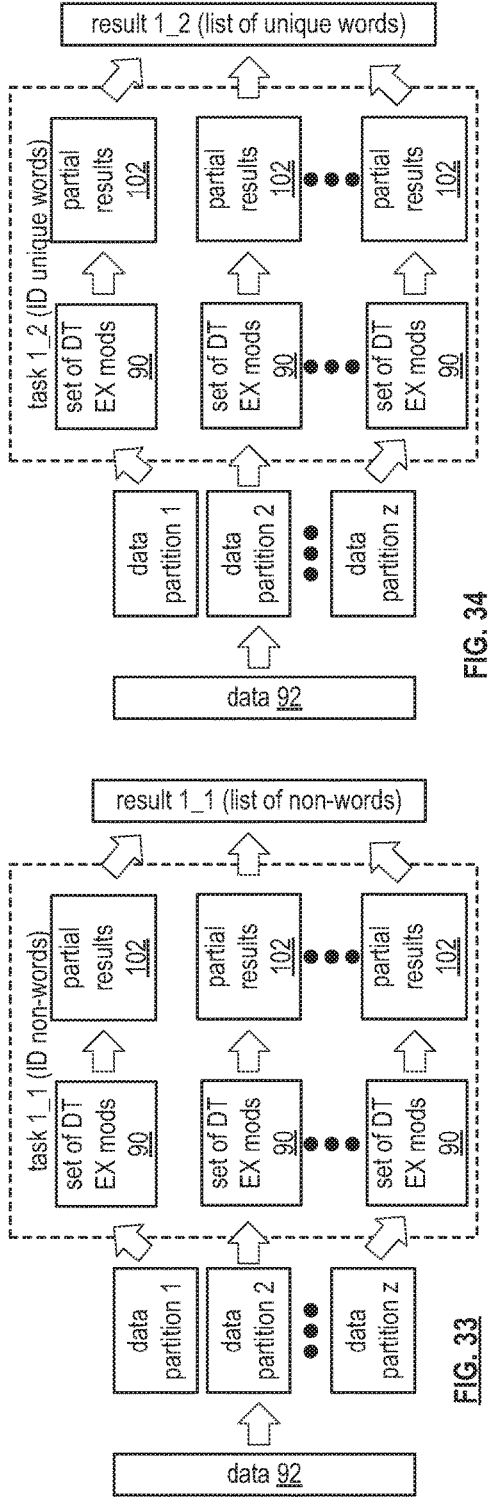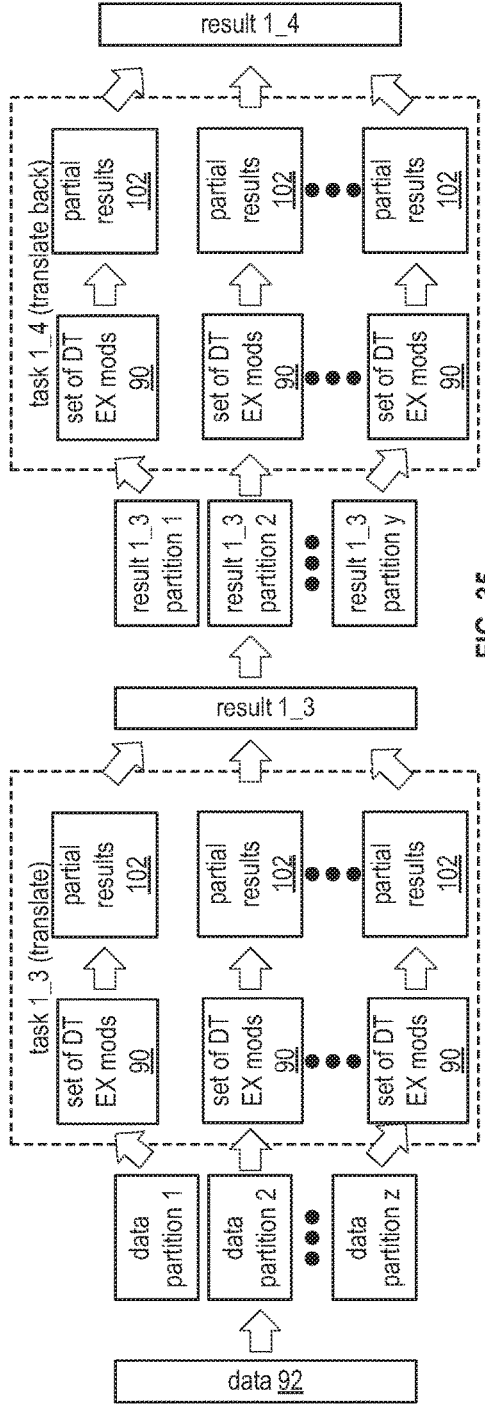

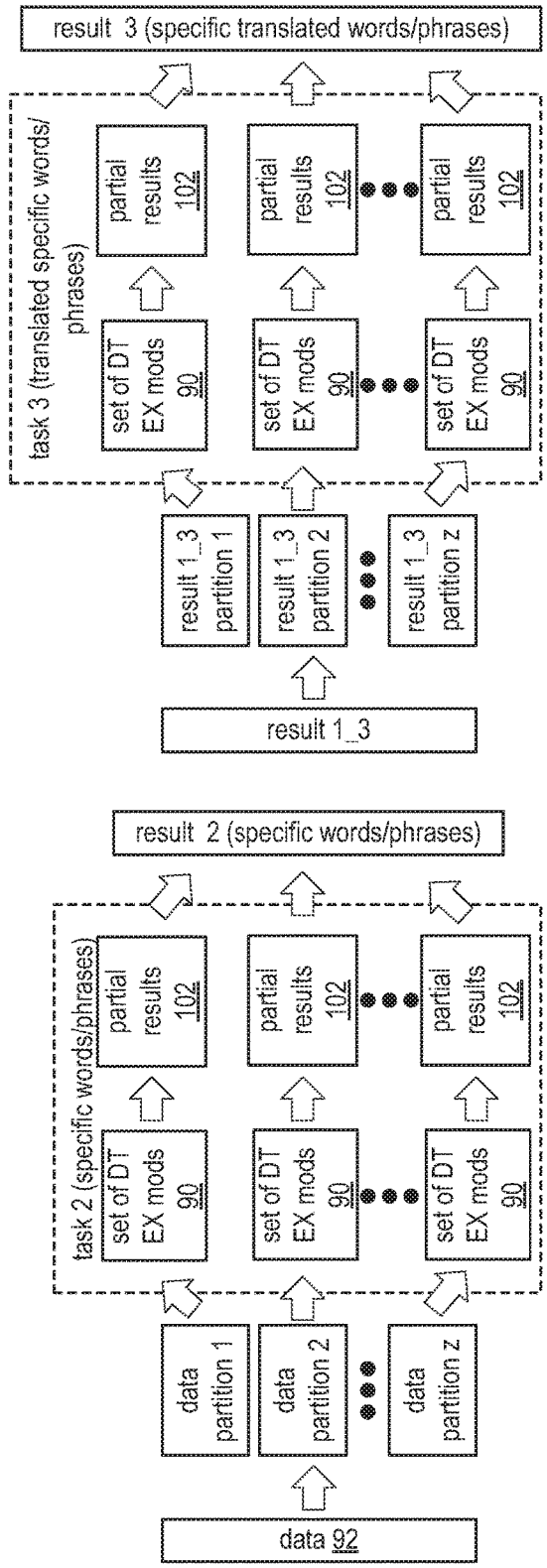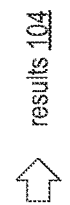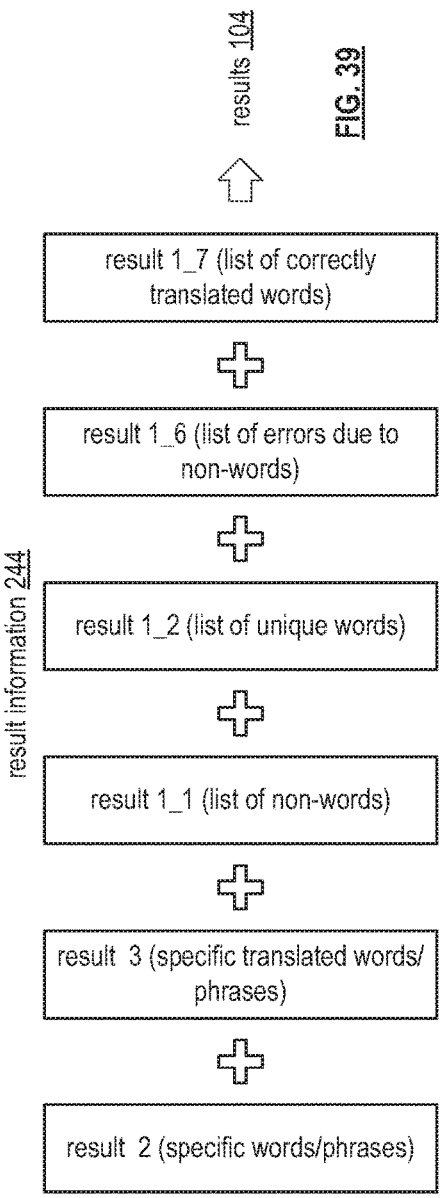

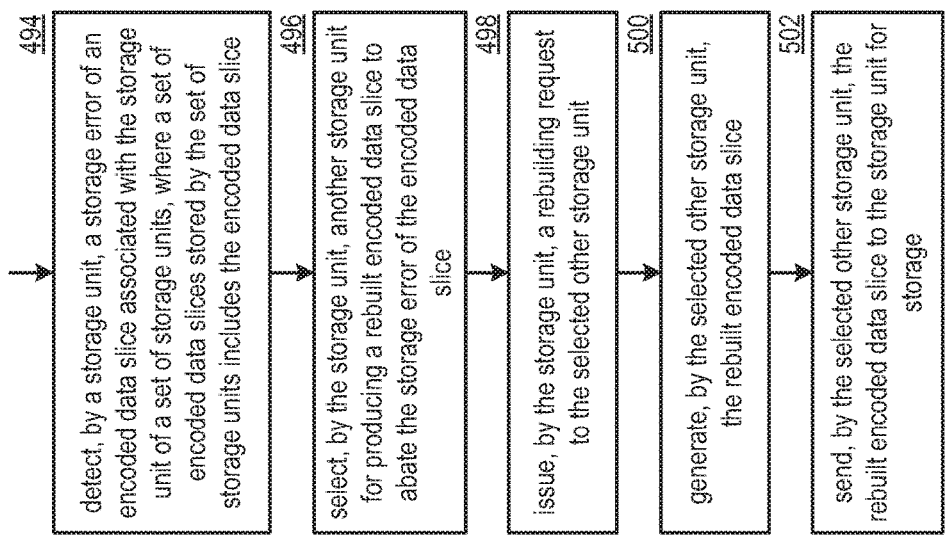

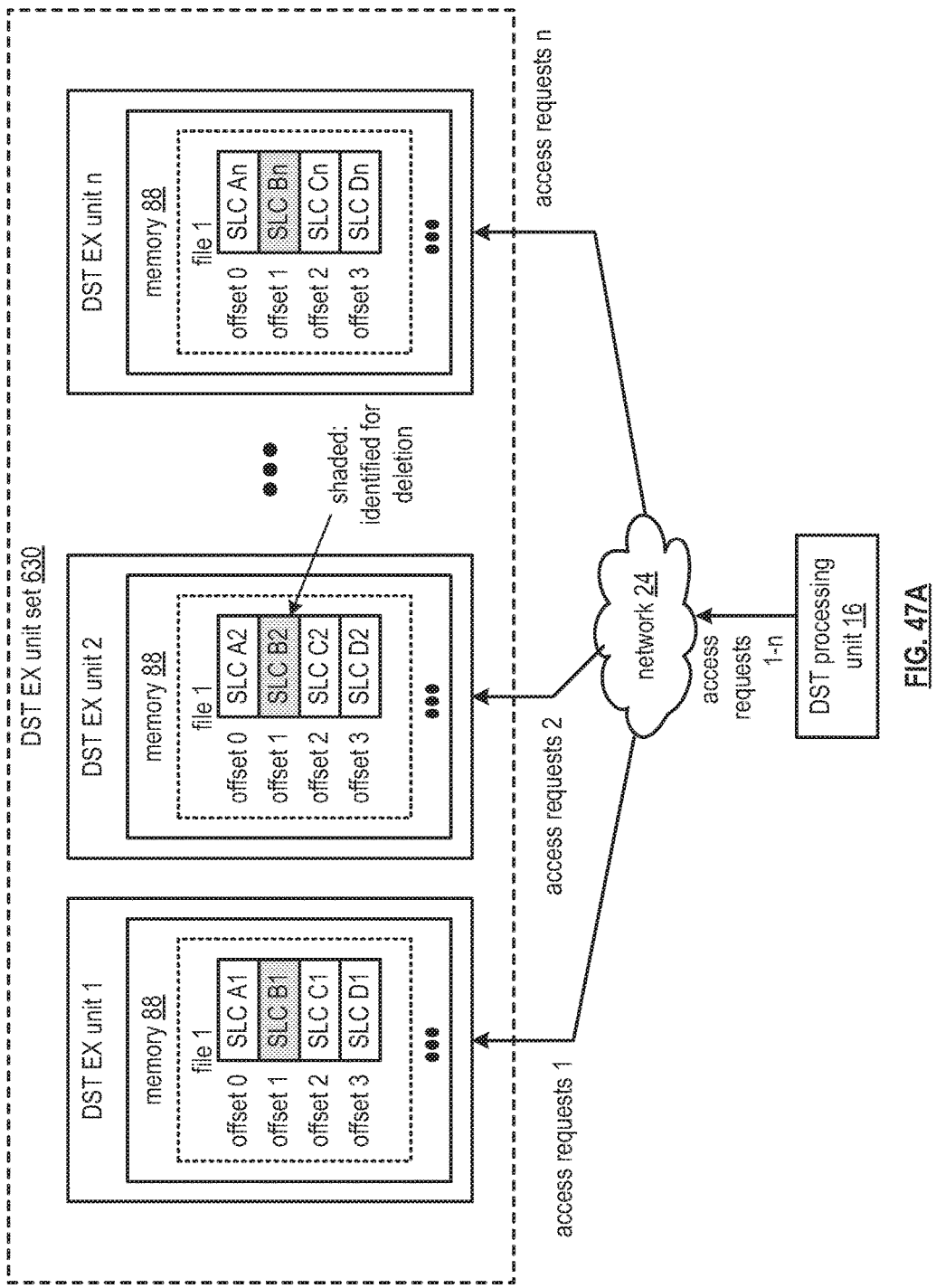

SELECTING A DATA STORAGE RESOURCE OF A DISPERSED STORAGE NETWORK

CROSS REFERENCE TO RELATED PATENTS

The present U.S. Utility Patent Application claims priority pursuant to 35 U.S.C. § 120 as a continuation of U.S. Utility application Ser. No. 14/956,818, entitled "SELECTING A DATA STORAGE RESOURCE OF A DISPERSED STORAGE NETWORK", filed Dec. 2, 2015, which claims priority pursuant to 35 U.S.C. § 119(e) to U.S. Provisional Application No. 62/109,712, entitled "UTILIZING ALTERNATE STORAGE RESOURCES WITHIN A DISPERSED STORAGE NETWORK," filed Jan. 30, 2015, both of which are hereby incorporated herein by reference in their entirety and made part of the present U.S. Utility Patent Application for all purposes.

STATEMENT REGARDING FEDERALLY SPONSORED RESEARCH OR DEVELOPMENT

NOT APPLICABLE

INCORPORATION-BY-REFERENCE OF MATERIAL SUBMITTED ON A COMPACT DISC

NOT APPLICABLE

BACKGROUND OF THE INVENTION

Technical Field of the Invention

This invention relates generally to computer networks and more particularly to dispersed storage of data and distributed task processing of data.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc., on an Internet storage system. The Internet storage system may include a RAID (redundant array of independent disks) system and/or a dispersed storage system that uses an error correction scheme to encode data for storage.

BRIEF DESCRIPTION OF THE SEVERAL VIEWS OF THE DRAWING(S)

FIG. 32 is a diagram of an example of DST allocation information for the example of FIG. 30 in accordance with the present invention;

FIGS. 33-38 are schematic block diagrams of the DSTN module performing the example of FIG. 30 in accordance with the present invention;

FIG. 39 is a diagram of an example of combining result information into final results for the example of FIG. 30 in accordance with the present invention;

Figure 40A:
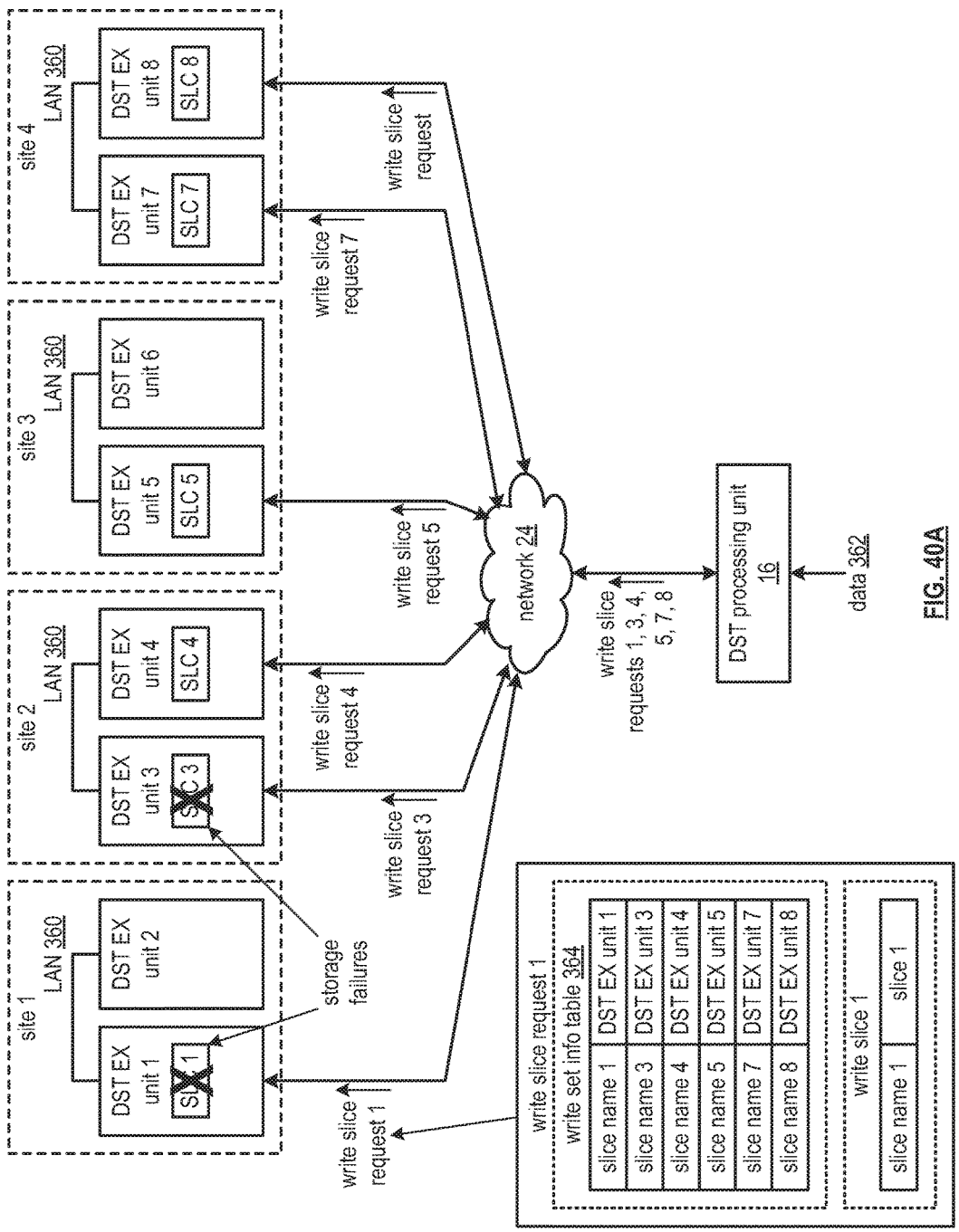
Figure 40B:
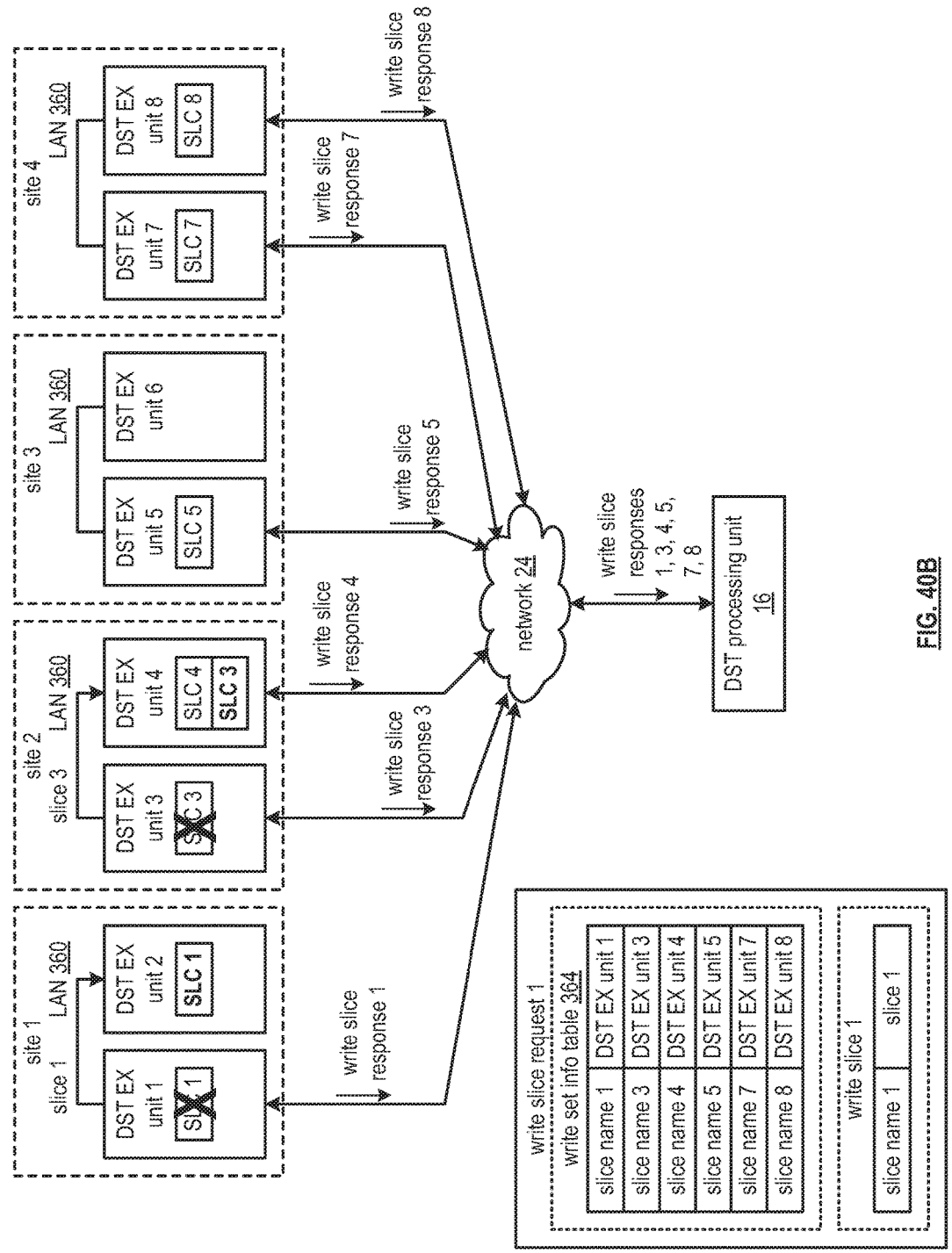
Figure 40C:
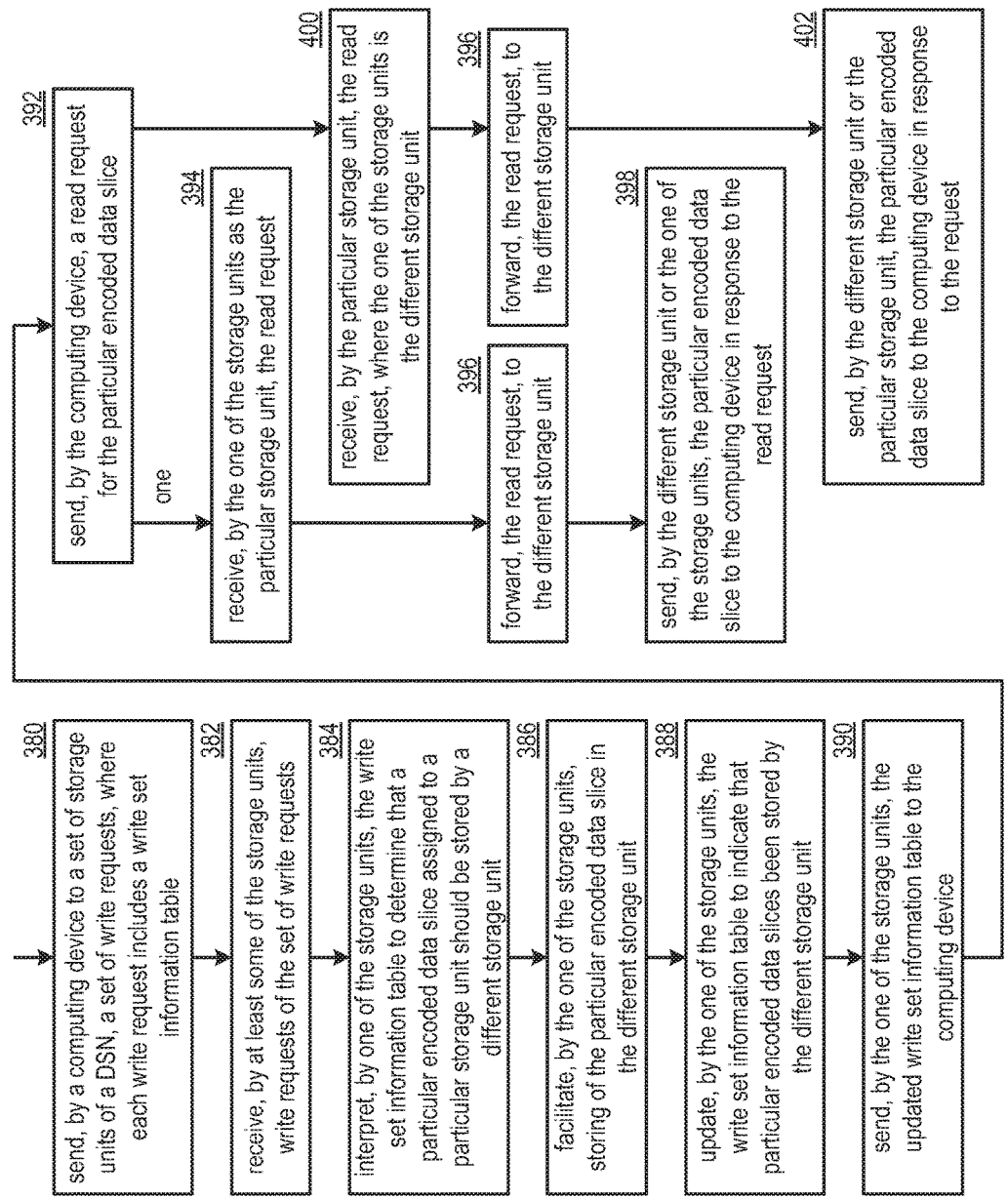
Figure 41A:
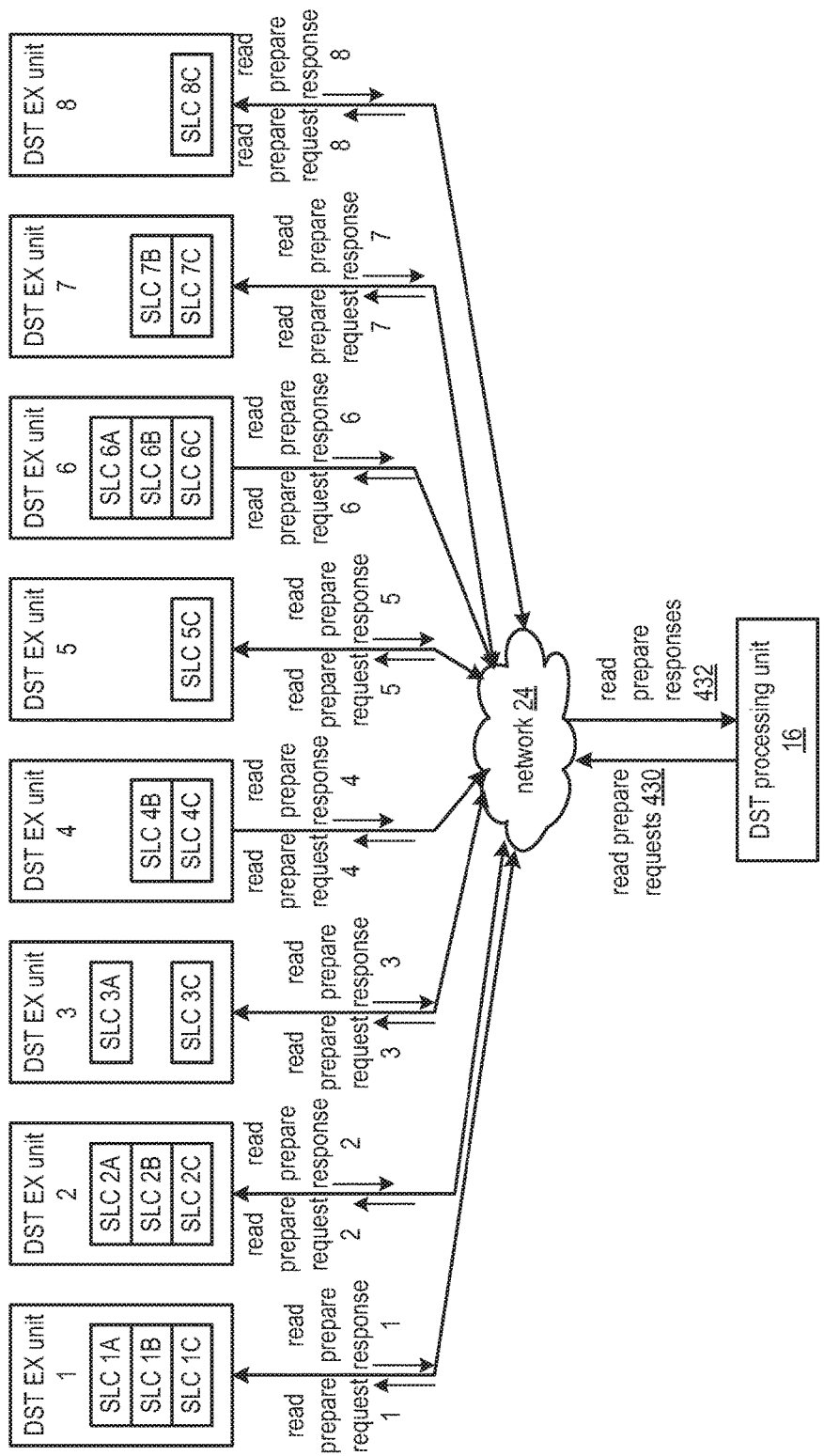
Figure 41B:
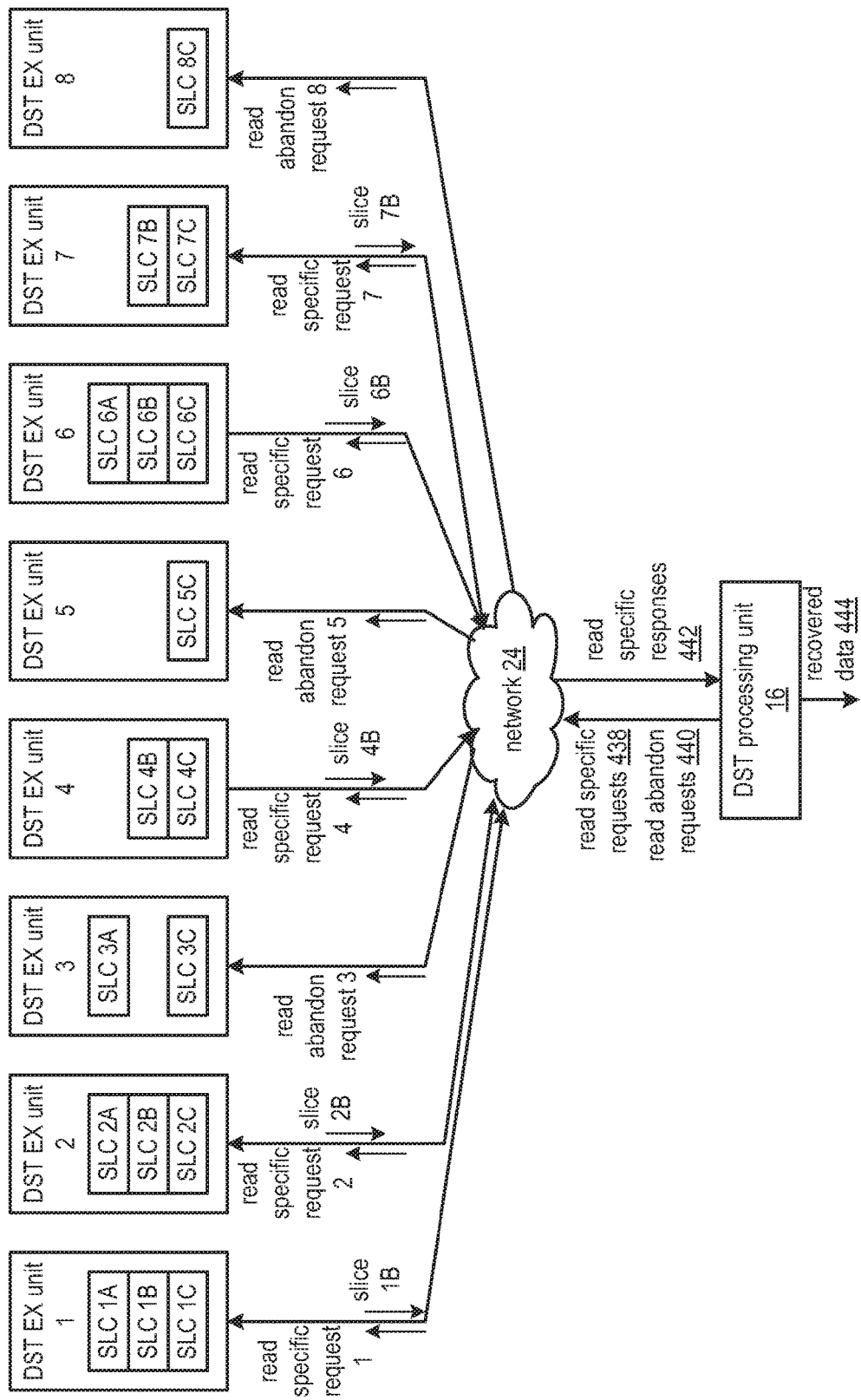
Figure 41C:
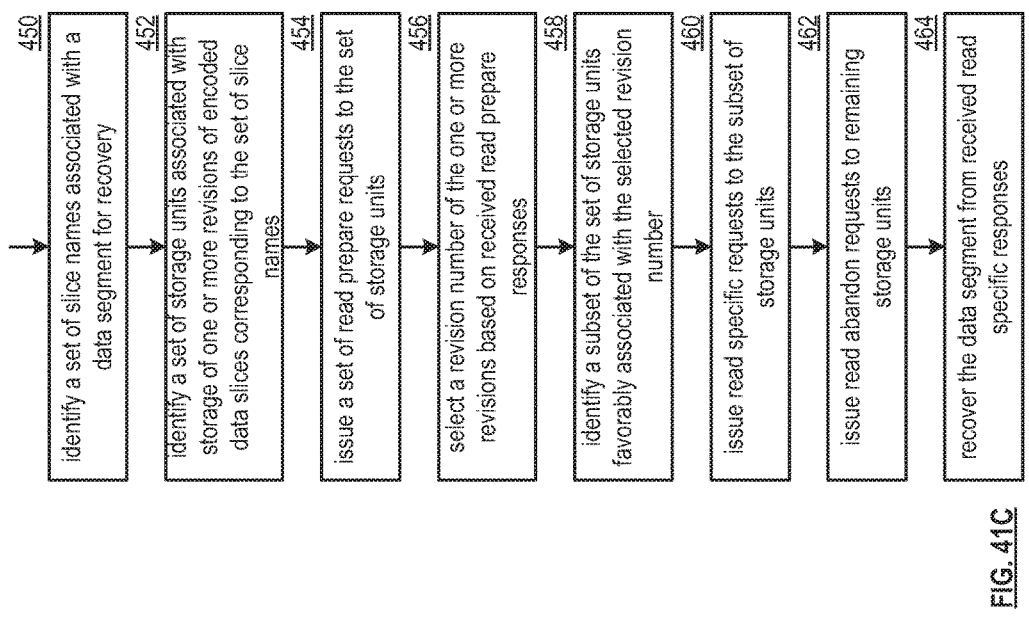
Figure 42A:
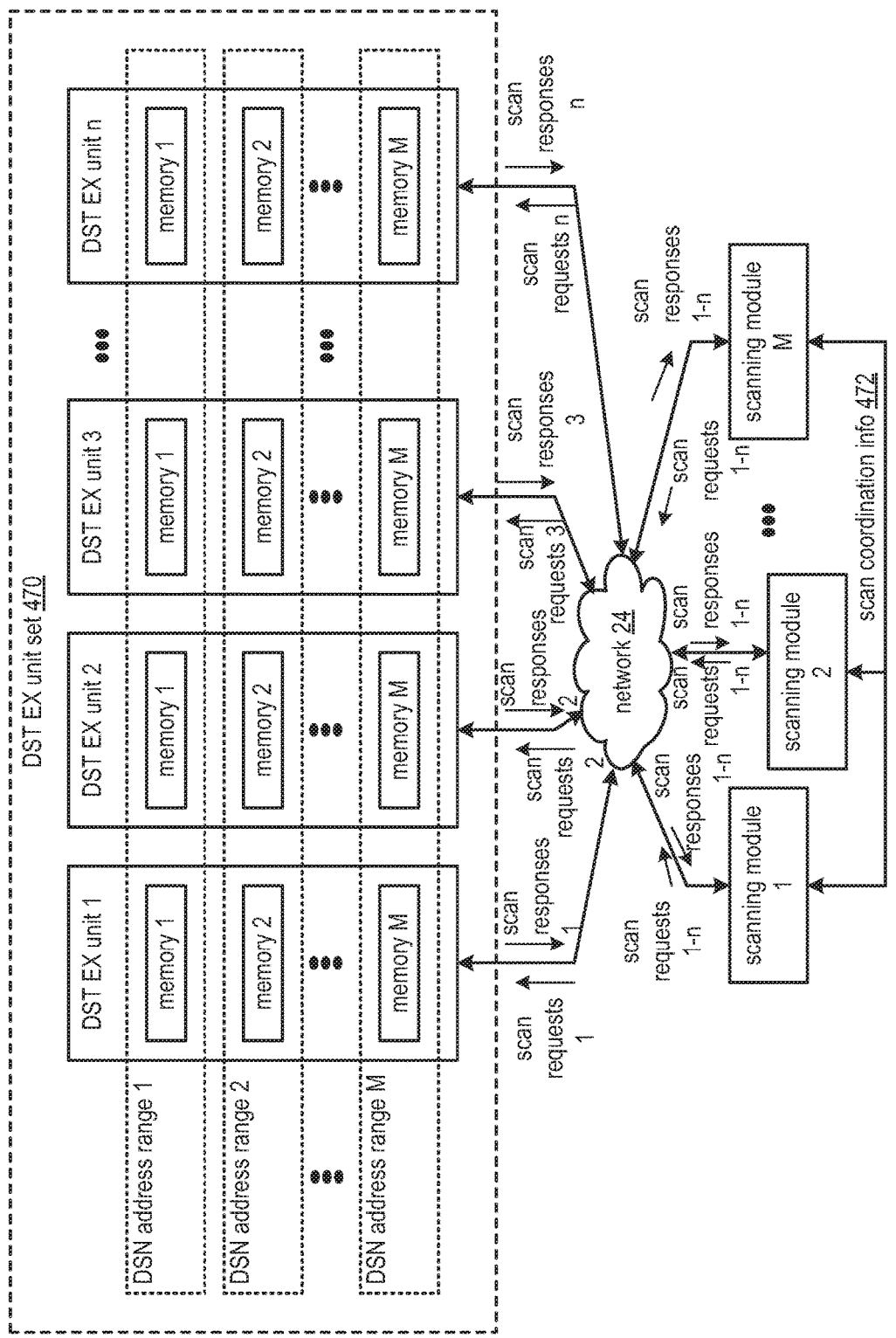
Figure 42B:
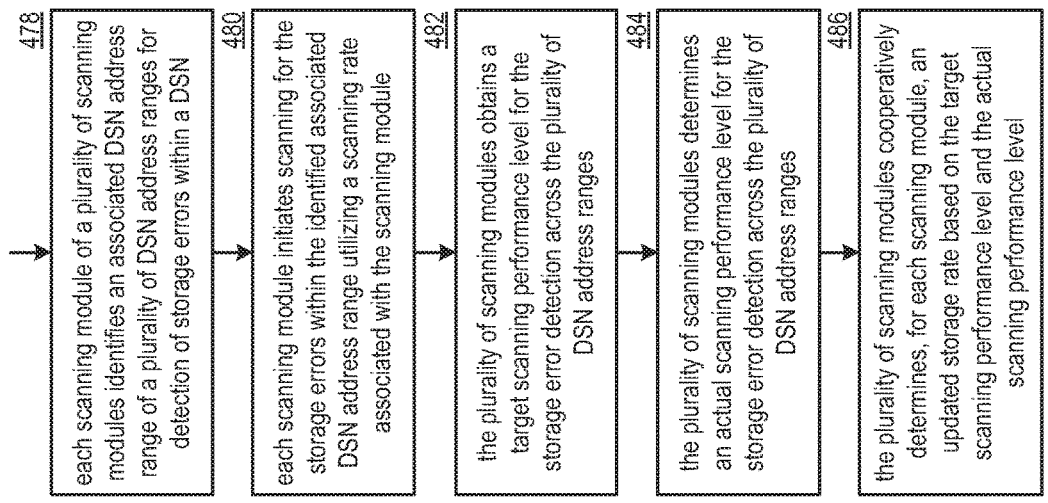
Figure 43A:
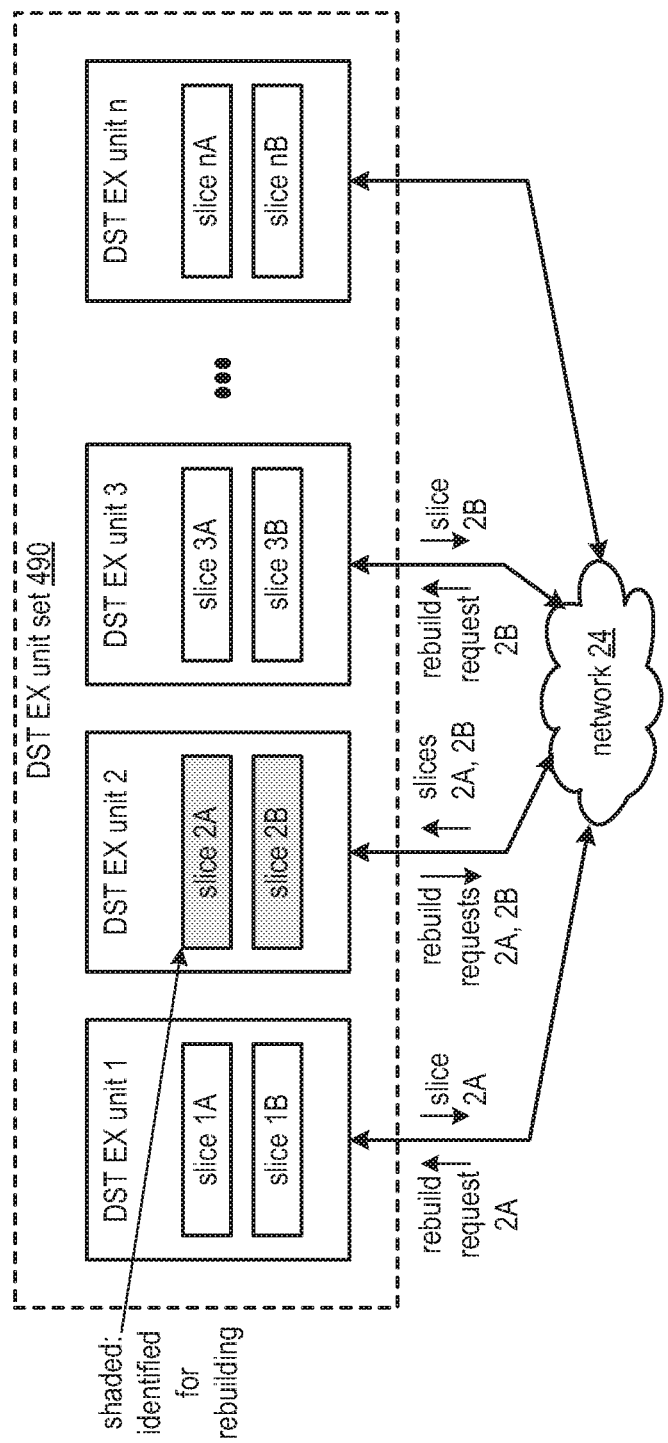
Figure 44A:
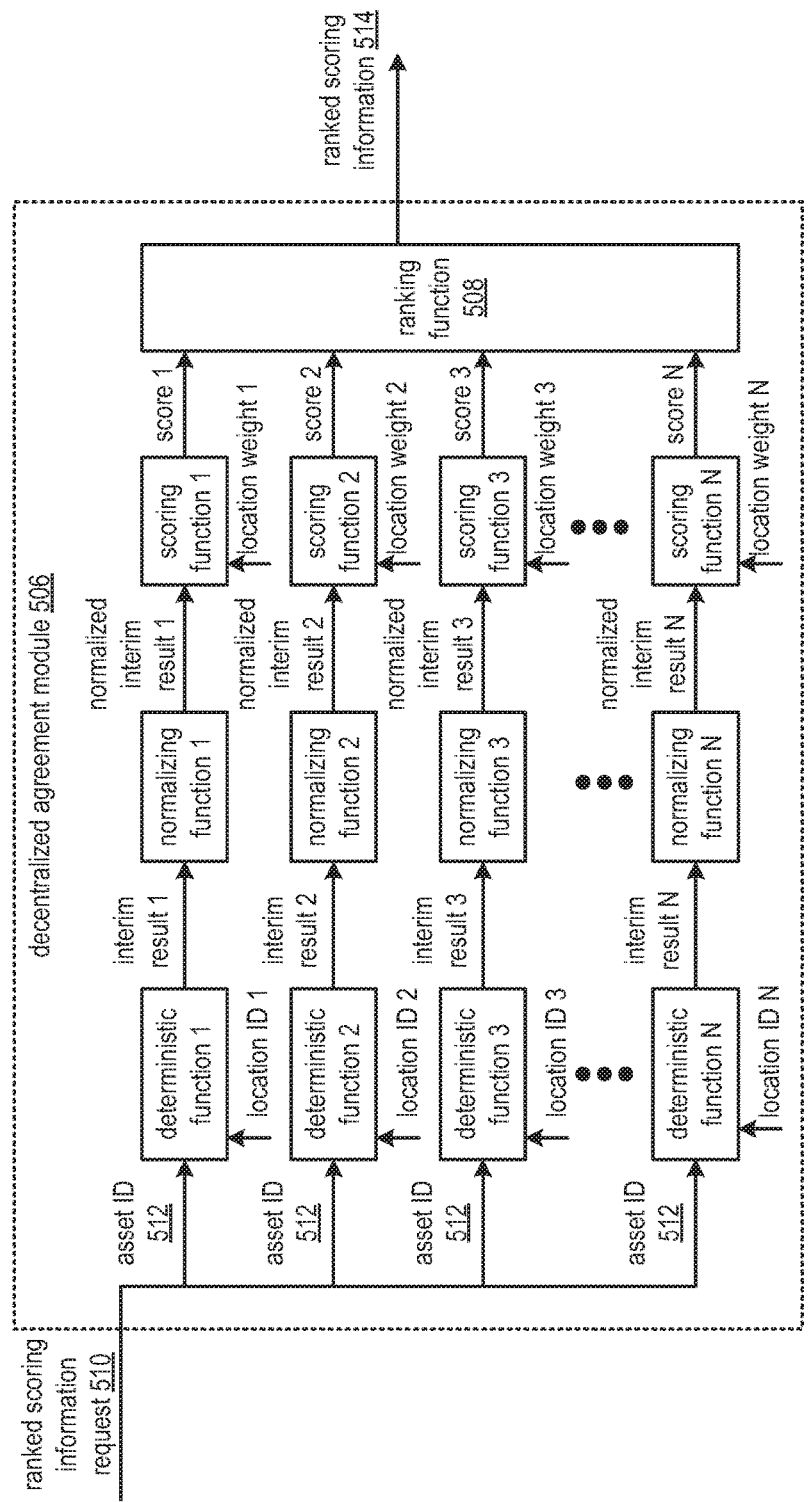
Figure 44B:
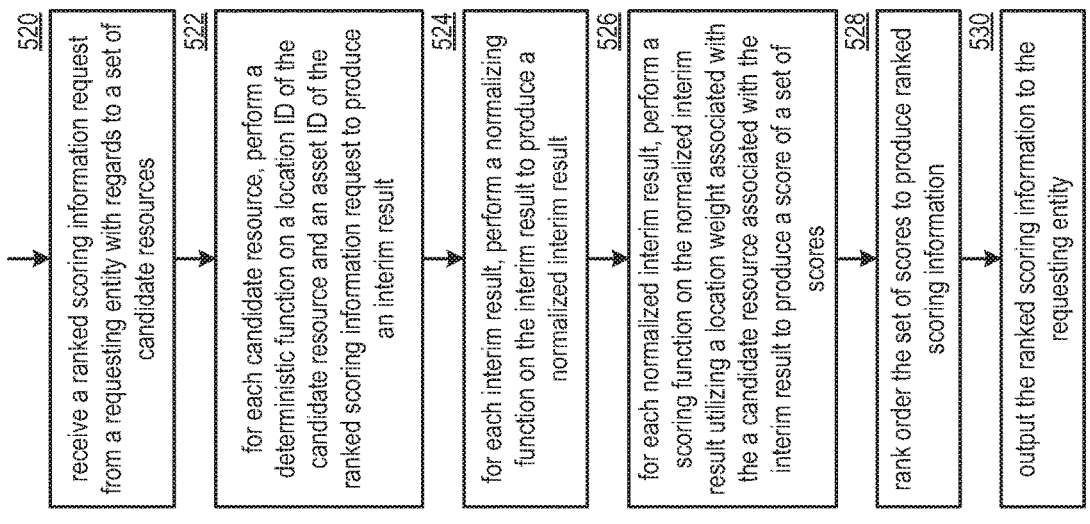
Figure 44C:
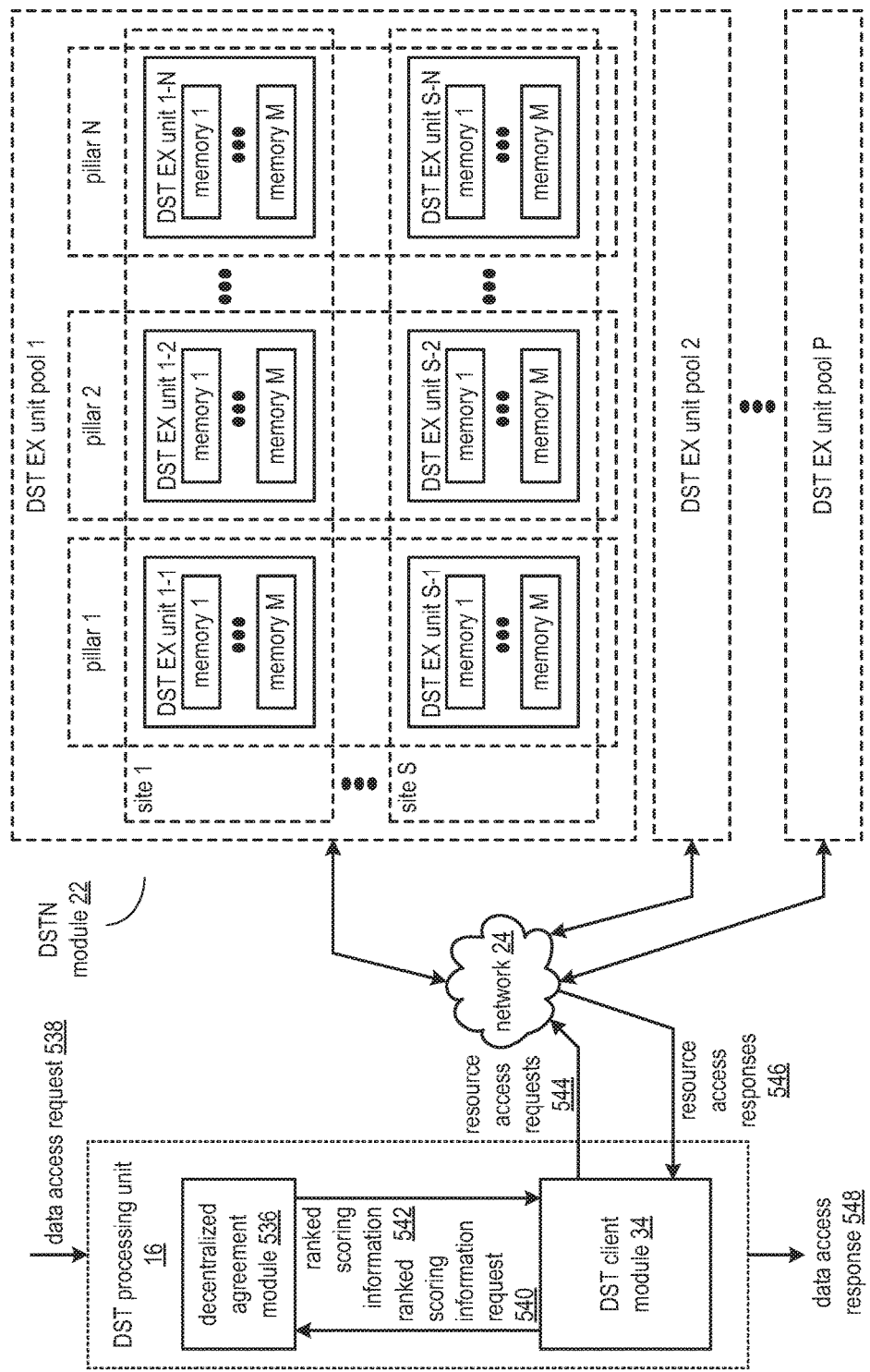
Figure 44D:
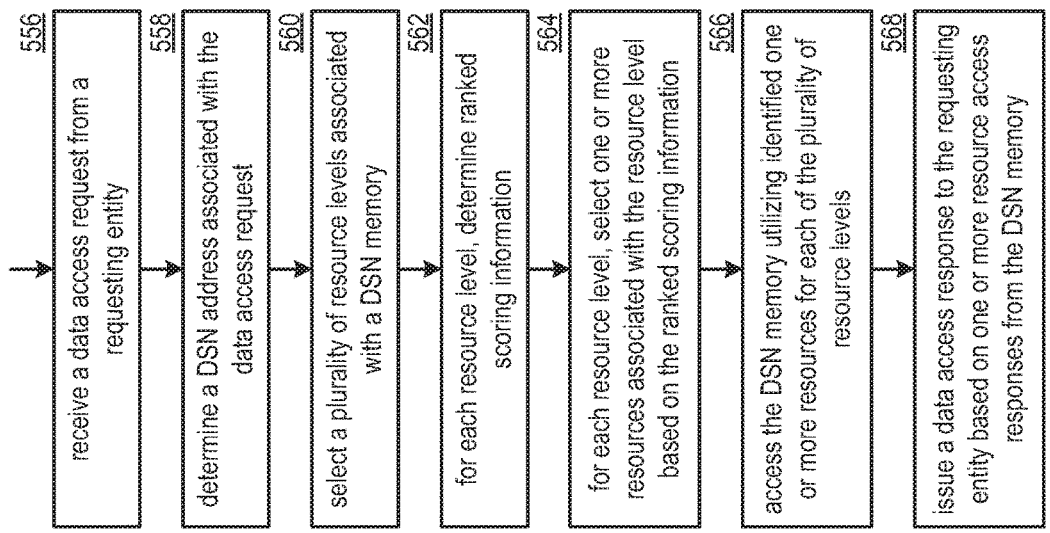
Figure 45A:
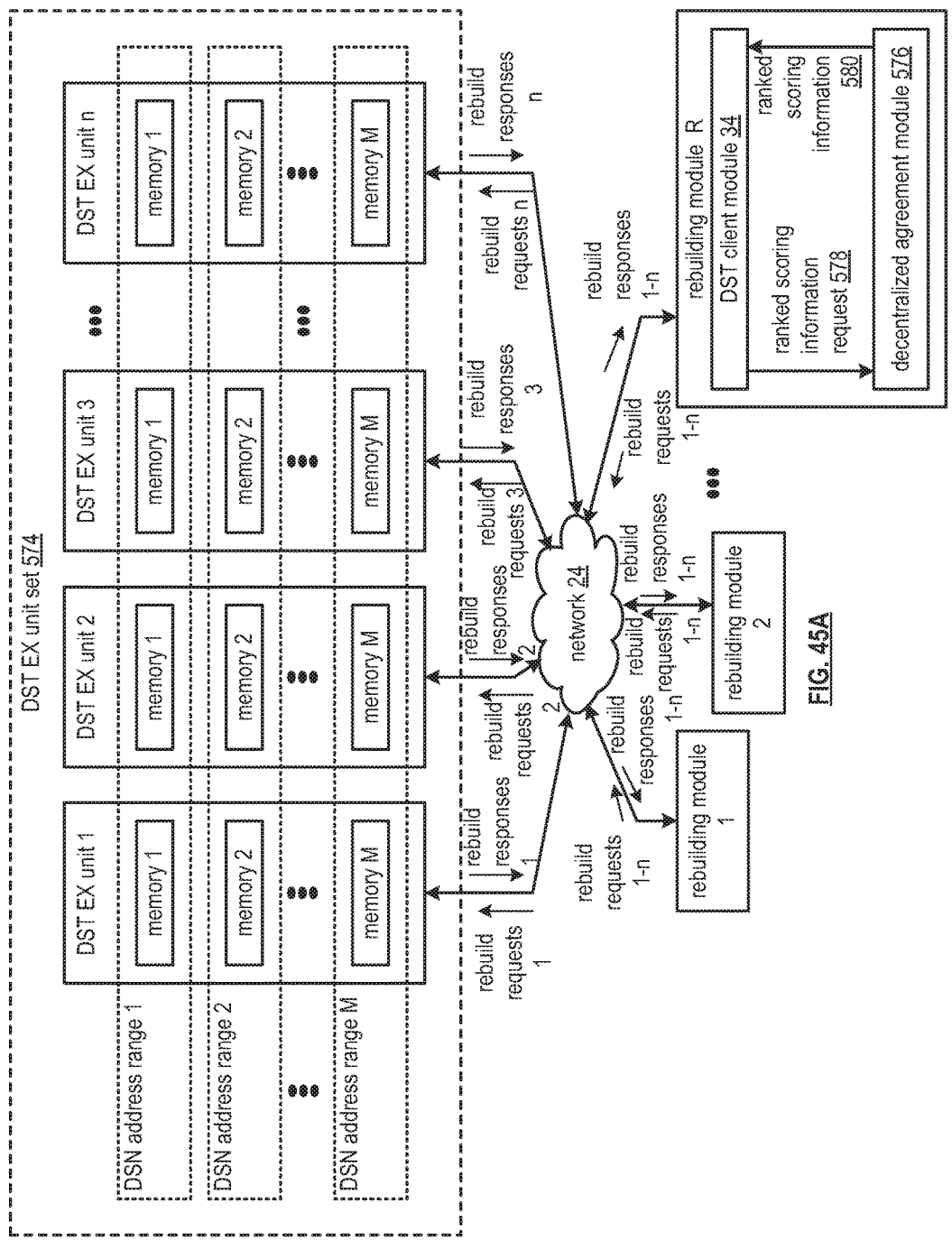
Figure 45B:
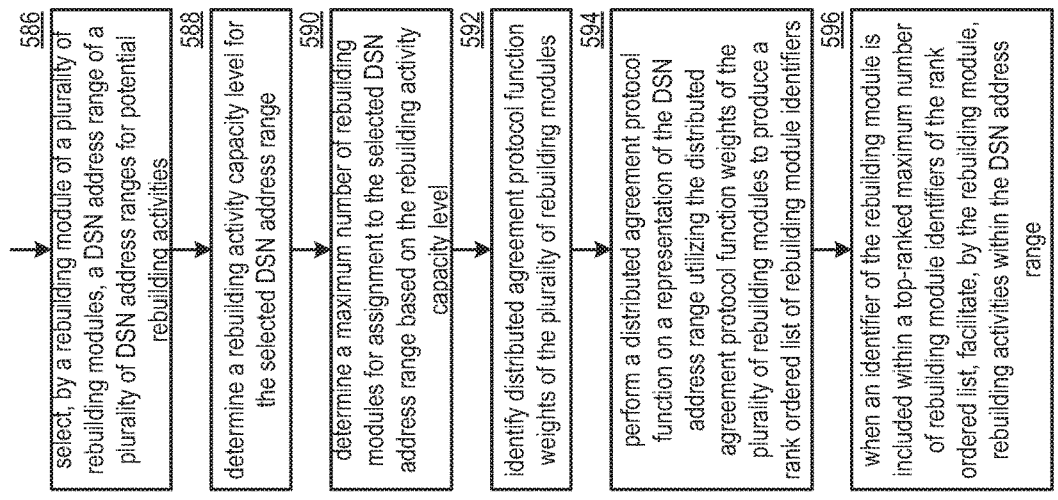
Figure 46A:
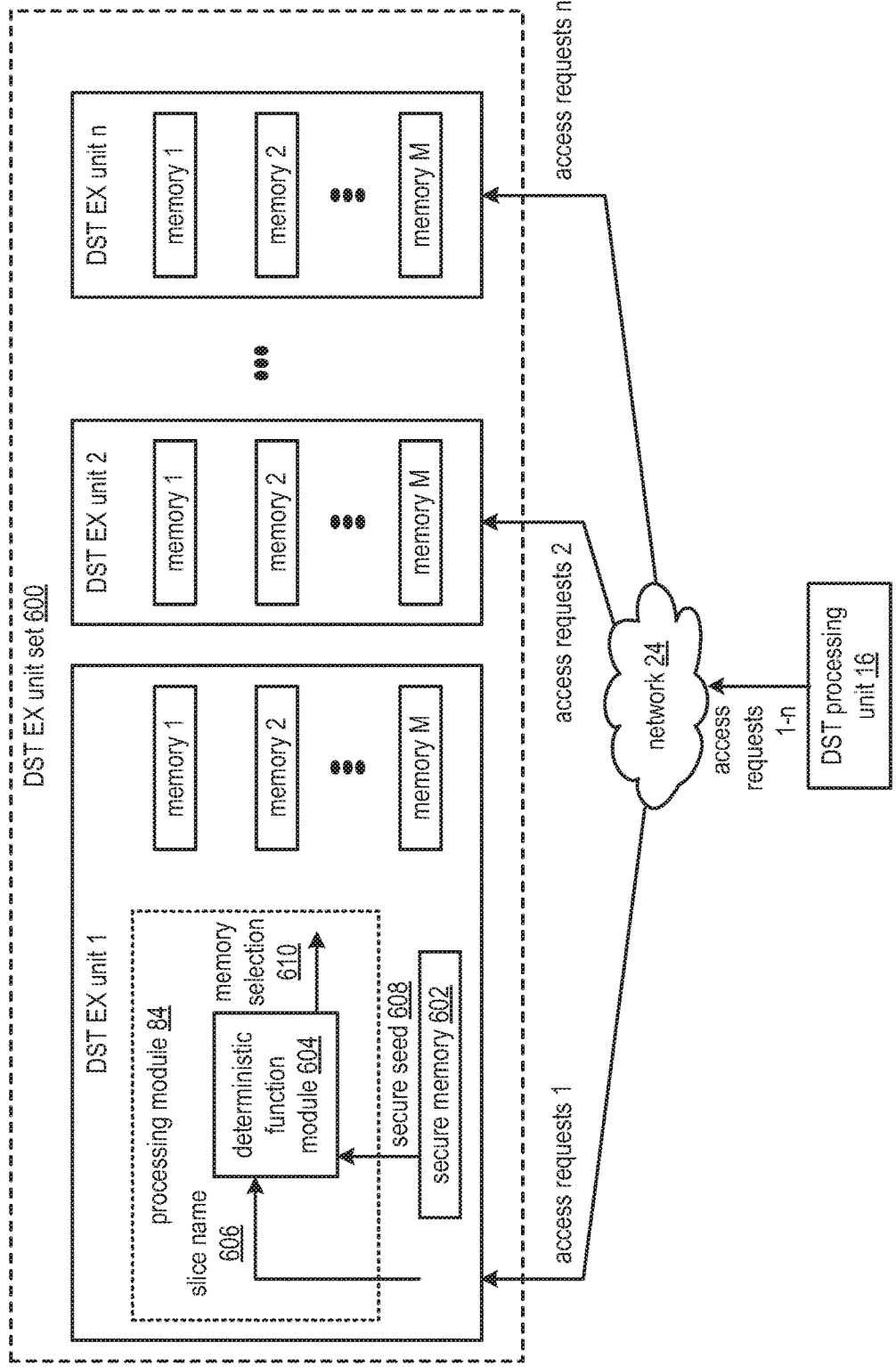
Figure 46B:
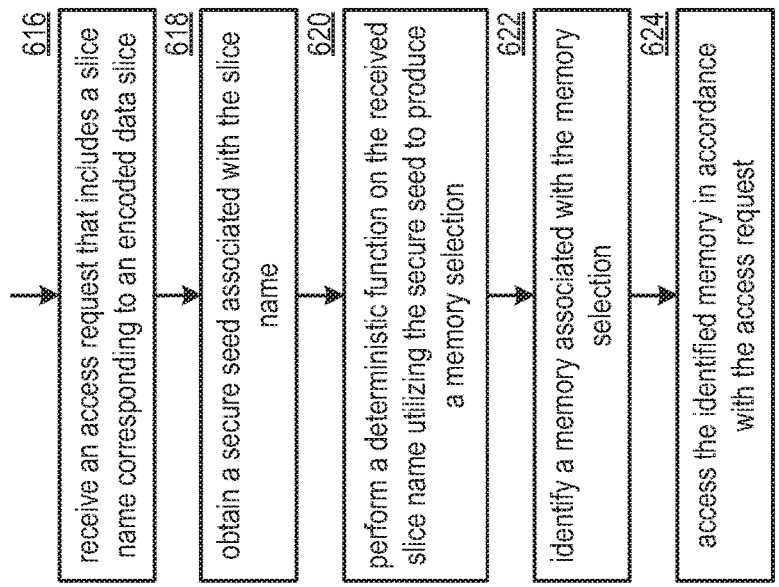
Figure 47B:
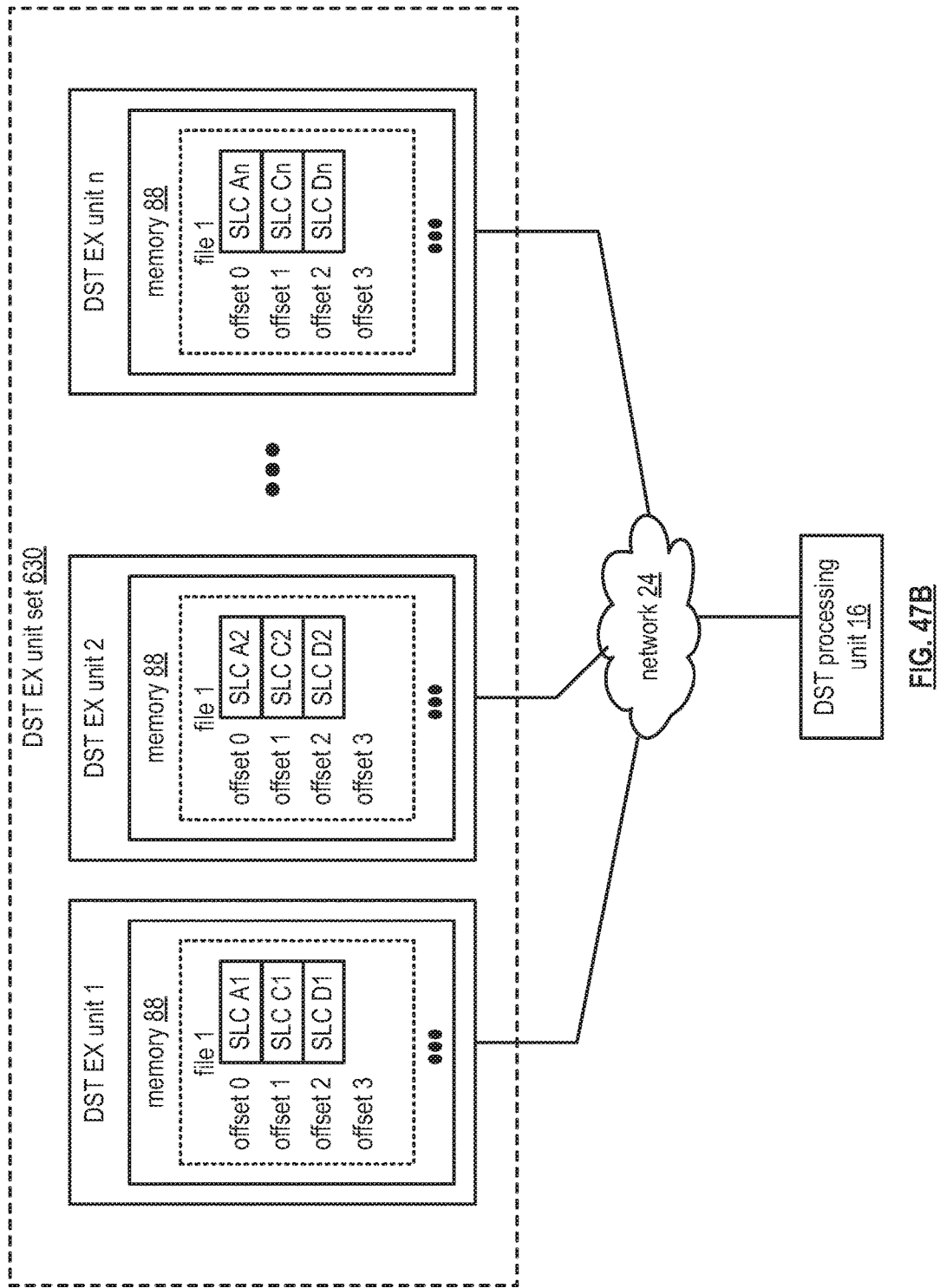
Figure 47C:
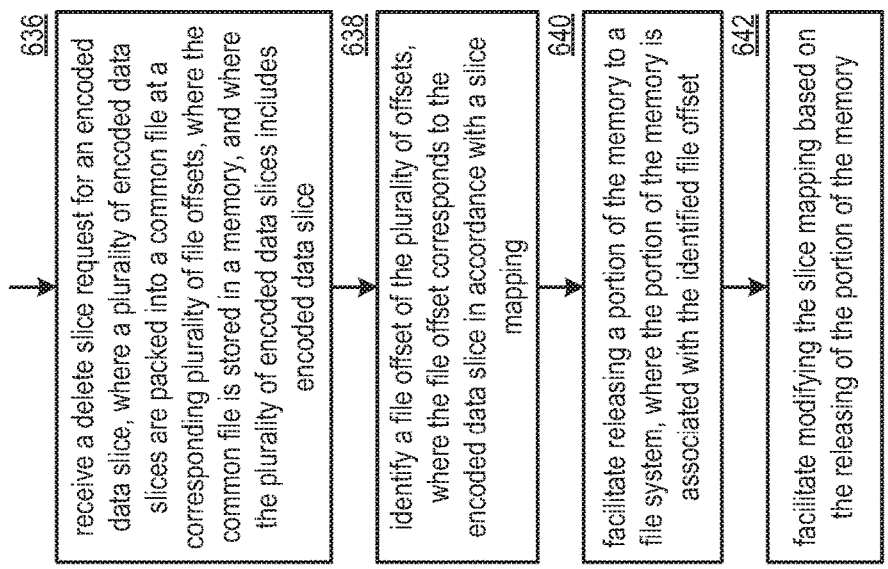
Figure 48A:
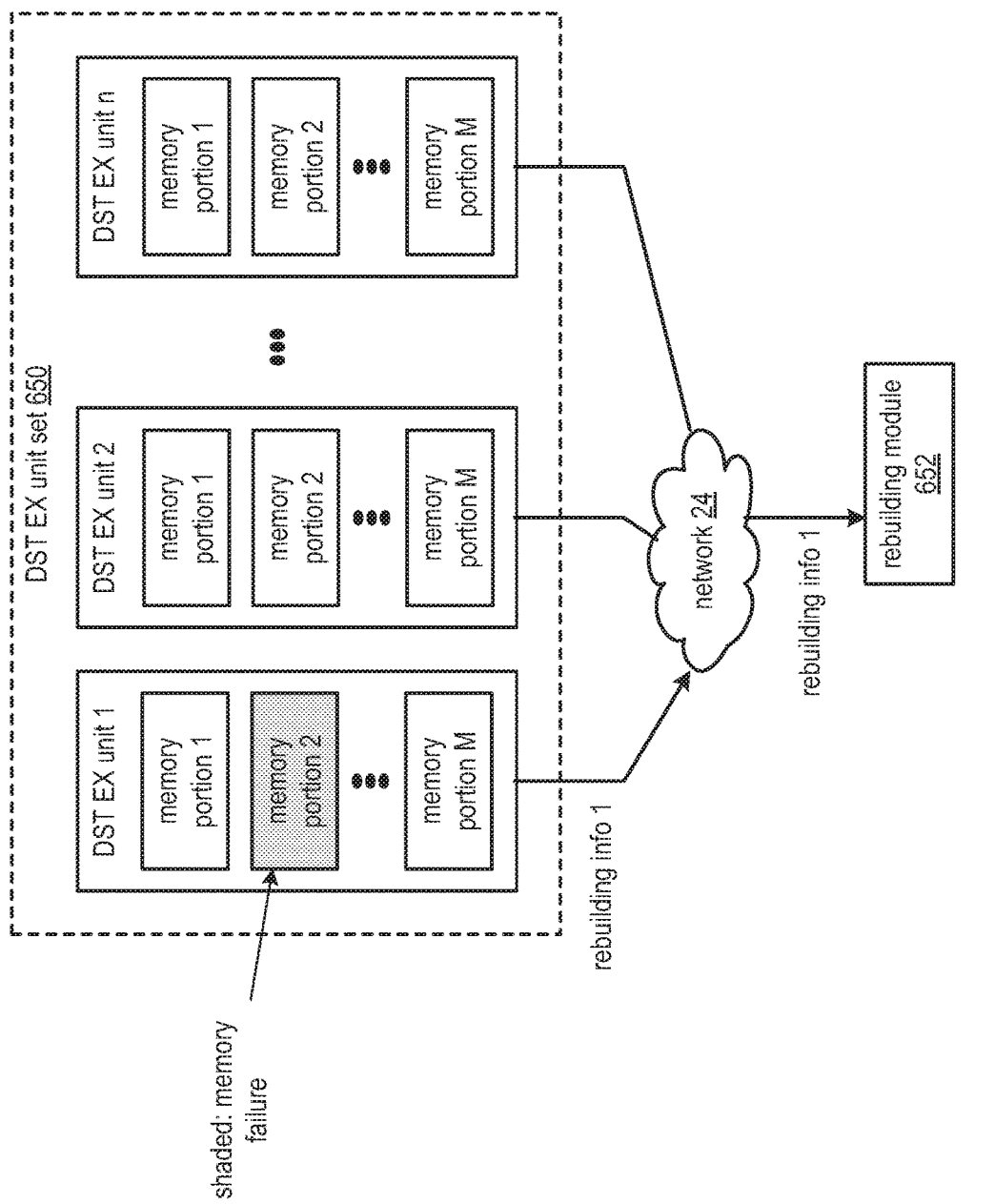
Figure 48B:
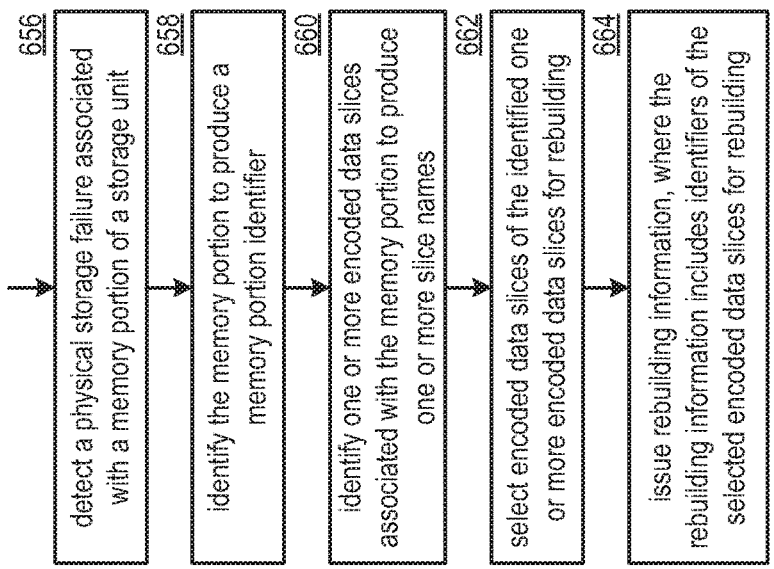
Figure 49A:
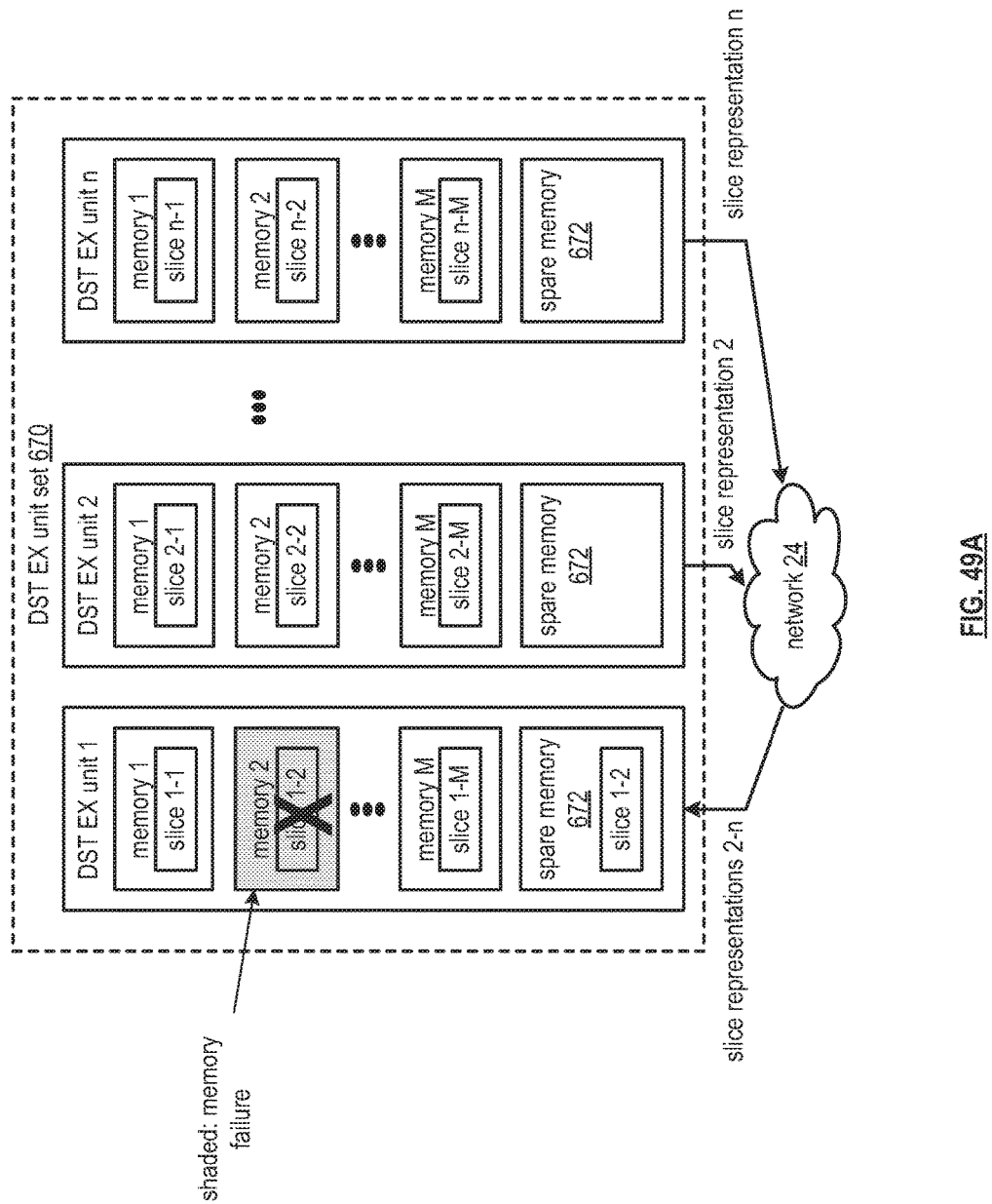
Figure 49B:
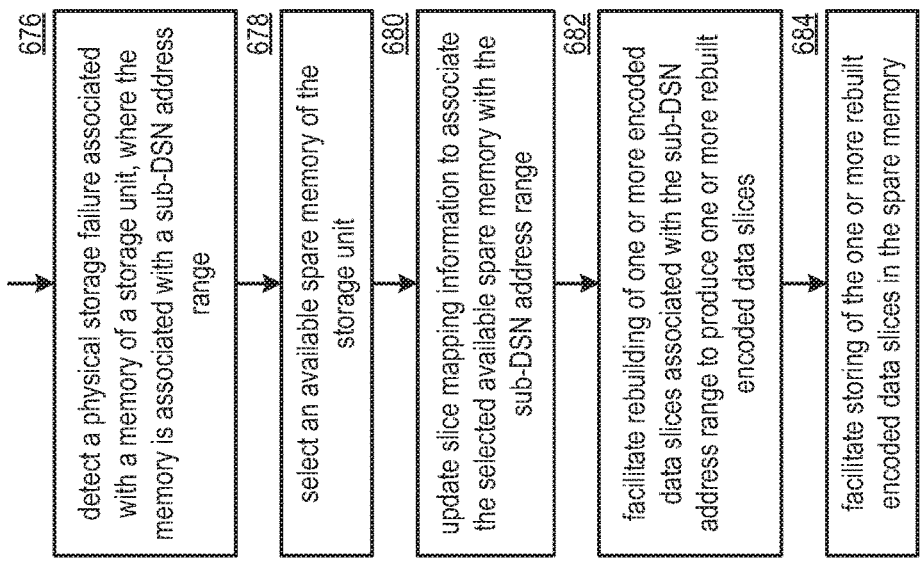

FIGS. 40A-B are schematic block diagrams of an embodiment of a dispersed storage network (DSN) in accordance with the present invention;

FIG. 40C is a flowchart illustrating an example of selecting a data storage resource in accordance with the present invention;

FIGS. 41A-B are schematic block diagrams of another embodiment of a dispersed storage network (DSN) in accordance with the present invention;

FIG. 41C is a flowchart illustrating an example of recovering stored data in accordance with the present invention;

FIG. 42A is a schematic block diagram of another embodiment of a dispersed storage network (DSN) in accordance with the present invention;

FIG. 42B is a flowchart illustrating an example of cooperatively detecting a storage error in accordance with the present invention;

FIG. 43A is a schematic block diagram of another embodiment of a dispersed storage network (DSN) in accordance with the present invention;

FIG. 43B is a flowchart illustrating an example of producing a rebuilt encoded data slice in accordance with the present invention;

FIG. 44A is a schematic block diagram of an embodiment of a decentralized agreement module in accordance with the present invention;

FIG. 44B is a flowchart illustrating an example of selecting the resource in accordance with the present invention;

FIG. 44C is a schematic block diagram of an embodiment of a dispersed storage network (DSN) in accordance with the present invention;

FIG. 44D is a flowchart illustrating an example of accessing a dispersed storage network (DSN) memory in accordance with the present invention;

FIG. 45A is a schematic block diagram of another embodiment of a dispersed storage network (DSN) in accordance with the present invention;

FIG. 45B is a flowchart illustrating an example of autonomous allocation of rebuilding resources in accordance with the present invention;

FIG. 46A is a schematic block diagram of another embodiment of a dispersed storage network (DSN) in accordance with the present invention;

FIG. 46B is a flowchart illustrating an example of selecting a memory for accessing encoded data slices in accordance with the present invention;

FIGS. 47A-B are schematic block diagrams of another embodiment of a dispersed storage network (DSN) in accordance with the present invention;

FIG. 47C is a flowchart illustrating an example of efficiently storing encoded data slices in accordance with the present invention;

FIG. 48A is a schematic block diagram of another embodiment of a dispersed storage network (DSN) in accordance with the present invention;

FIG. 48B is a flowchart illustrating an example of identifying an encoded data slice for rebuilding for accessing encoded data slices accordance with the present invention;

FIG. 49A is a schematic block diagram of another embodiment of a dispersed storage network (DSN) in accordance with the present invention; and FIG. 49B is a flowchart illustrating an example of storing rebuilt encoded data slices in accordance with the present invention.

DETAILED DESCRIPTION OF THE INVENTION

Figure 1:
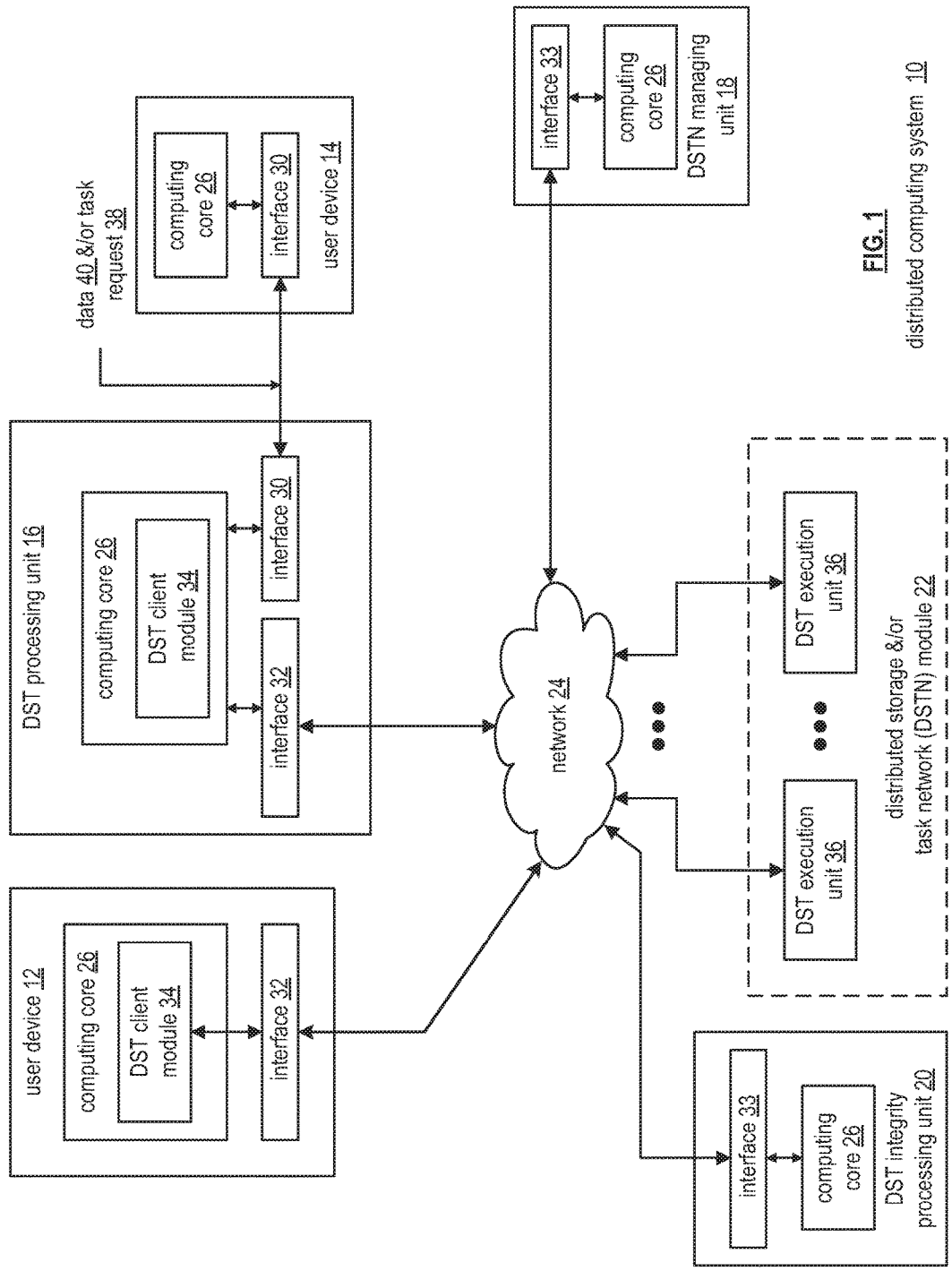
FIG. 1 is a schematic block diagram of an embodiment of a distributed computing system in accordance with the present invention.

FIG. 1 is a schematic block diagram of an embodiment of a distributed computing system 10 that includes a user device 12 and/or a user device 14, a distributed storage and/or task (DST) processing unit 16, a distributed storage and/or task network (DSTN) managing unit 18, a DST integrity processing unit 20, and a distributed storage and/or task network (DSTN) module 22. The components of the distributed computing system 10 are coupled via a network 24, which may include one or more wireless and/or wire lined communication systems; one or more private intranet systems and/or public internet systems; and/or one or more local area networks (LAN) and/or wide area networks (WAN).

The DSTN module 22 includes a plurality of distributed storage and/or task (DST) execution units 36 that may be located at geographically different sites (e.g., one in Chicago, one in Milwaukee, etc.). Each of the DST execution units is operable to store dispersed error encoded data and/or to execute, in a distributed manner, one or more tasks on data. The tasks may be a simple function (e.g., a mathematical function, a logic function, an identify function, a find function, a search engine function, a replace function, etc.), a complex function (e.g., compression, human and/or computer language translation, text-to-voice conversion, voice-to-text conversion, etc.), multiple simple and/or complex functions, one or more algorithms, one or more applications, etc.

Each of the user devices 12-14, the DST processing unit 16, the DSTN managing unit 18, and the DST integrity processing unit 20 include a computing core 26 and may be a portable computing device and/or a fixed computing device. A portable computing device may be a social networking device, a gaming device, a cell phone, a smart phone, a personal digital assistant, a digital music player, a digital video player, a laptop computer, a handheld computer, a tablet, a video game controller, and/or any other portable device that includes a computing core. A fixed computing device may be a personal computer (PC), a computer server, a cable set-top box, a satellite receiver, a television set, a printer, a fax machine, home entertainment equipment, a video game console, and/or any type of home or office computing equipment. User device 12 and DST processing unit 16 are configured to include a DST client module 34.

With respect to interfaces, each interface 30, 32, and 33 includes software and/or hardware to support one or more communication links via the network 24 indirectly and/or directly. For example, interface 30 supports a communication link (e.g., wired, wireless, direct, via a LAN, via the network 24, etc.) between user device 14 and the DST processing unit 16. As another example, interface 32 supports communication links (e.g., a wired connection, a wireless connection, a LAN connection, and/or any other type of connection to/from the network 24) between user device 12 and the DSTN module 22 and between the DST processing unit 16 and the DSTN module 22. As yet another example, interface 33 supports a communication link for each of the DSTN managing unit 18 and DST integrity processing unit 20 to the network 24.

The distributed computing system 10 is operable to support dispersed storage (DS) error encoded data storage and retrieval, to support distributed task processing on received data, and/or to support distributed task processing on stored data. In general, and with respect to DS error encoded data storage and retrieval, the distributed computing system 10 supports three primary operations: storage management, data storage and retrieval (an example of which will be discussed with reference to FIGS. 20-26), and data storage integrity verification. In accordance with these three primary functions, data can be encoded, distributedly stored in physically different locations, and subsequently retrieved in a reliable and secure manner. Such a system is tolerant of a significant number of failures (e.g., up to a failure level, which may be greater than or equal to a pillar width minus a decode threshold minus one) that may result from individual storage device failures and/or network equipment failures without loss of data and without the need for a redundant or backup copy. Further, the system allows the data to be stored for an indefinite period of time without data loss and does so in a secure manner (e.g., the system is very resistant to attempts at hacking the data).

The second primary function (i.e., distributed data storage and retrieval) begins and ends with a user device 12-14. For instance, if a second type of user device 14 has data 40 to store in the DSTN module 22, it sends the data 40 to the DST processing unit 16 via its interface 30. The interface 30 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). In addition, the interface 30 may attach a user identification code (ID) to the data 40.

To support storage management, the DSTN managing unit 18 performs DS management services. One such DS management service includes the DSTN managing unit 18 establishing distributed data storage parameters (e.g., vault creation, distributed storage parameters, security parameters, billing information, user profile information, etc.) for a user device 12-14 individually or as part of a group of user devices. For example, the DSTN managing unit 18 coordinates creation of a vault (e.g., a virtual memory block) within memory of the DSTN module 22 for a user device, a group of devices, or for public access and establishes per vault dispersed storage (DS) error encoding parameters for a vault. The DSTN managing unit 18 may facilitate storage of DS error encoding parameters for each vault of a plurality of vaults by updating registry information for the distributed computing system 10. The facilitating includes storing updated registry information in one or more of the DSTN module 22, the user device 12, the DST processing unit 16, and the DST integrity processing unit 20.

The DS error encoding parameters (e.g., or dispersed storage error coding parameters) include data segmenting information (e.g., how many segments data (e.g., a file, a group of files, a data block, etc.) is divided into), segment security information (e.g., per segment encryption, compression, integrity checksum, etc.), error coding information (e.g., pillar width, decode threshold, read threshold, write threshold, etc.), slicing information (e.g., the number of encoded data slices that will be created for each data segment); and slice security information (e.g., per encoded data slice encryption, compression, integrity checksum, etc.).

The DSTN managing unit 18 creates and stores user profile information (e.g., an access control list (ACL)) in local memory and/or within memory of the DSTN module 22. The user profile information includes authentication information, permissions, and/or the security parameters. The security parameters may include encryption/decryption scheme, one or more encryption keys, key generation scheme, and/or data encoding/decoding scheme.

The DSTN managing unit 18 creates billing information for a particular user, a user group, a vault access, public vault access, etc. For instance, the DSTN managing unit 18 tracks the number of times a user accesses a private vault and/or public vaults, which can be used to generate a per-access billing information. In another instance, the DSTN managing unit 18 tracks the amount of data stored and/or retrieved by a user device and/or a user group, which can be used to generate a per-data-amount billing information.

Another DS management service includes the DSTN managing unit 18 performing network operations, network administration, and/or network maintenance. Network operations includes authenticating user data allocation requests (e.g., read and/or write requests), managing creation of vaults, establishing authentication credentials for user devices, adding/deleting components (e.g., user devices, DST execution units, and/or DST processing units) from the distributed computing system 10, and/or establishing authentication credentials for DST execution units 36.

Network administration includes monitoring devices and/or units for failures, maintaining vault information, determining device and/or unit activation status, determining device and/or unit loading, and/or determining any other system level operation that affects the performance level of the system 10. Network maintenance includes facilitating replacing, upgrading, repairing, and/or expanding a device and/or unit of the system 10.

To support data storage integrity verification within the distributed computing system 10, the DST integrity processing unit 20 performs rebuilding of 'bad' or missing encoded data slices. At a high level, the DST integrity processing unit 20 performs rebuilding by periodically attempting to retrieve/list encoded data slices, and/or slice names of the encoded data slices, from the DSTN module 22. For retrieved encoded slices, they are checked for errors due to data corruption, outdated version, etc. If a slice includes an error, it is flagged as a 'bad' slice. For encoded data slices that were not received and/or not listed, they are flagged as missing slices. Bad and/or missing slices are subsequently rebuilt using other retrieved encoded data slices that are deemed to be good slices to produce rebuilt slices. The rebuilt slices are stored in memory of the DSTN module 22. Note that the DST integrity processing unit 20 may be a separate unit as shown, it may be included in the DSTN module 22, it may be included in the DST processing unit 16, and/or distributed among the DST execution units 36.

To support distributed task processing on received data, the distributed computing system 10 has two primary operations: DST (distributed storage and/or task processing) management and DST execution on received data (an example of which will be discussed with reference to FIGS. 3-19). With respect to the storage portion of the DST management, the DSTN managing unit 18 functions as previously described. With respect to the tasking processing of the DST management, the DSTN managing unit 18 performs distributed task processing (DTP) management services. One such DTP management service includes the DSTN managing unit 18 establishing DTP parameters (e.g., user-vault affiliation information, billing information, user-task information, etc.) for a user device 12-14 individually or as part of a group of user devices.

Another DTP management service includes the DSTN managing unit 18 performing DTP network operations, network administration (which is essentially the same as described above), and/or network maintenance (which is essentially the same as described above). Network operations include, but are not limited to, authenticating user task processing requests (e.g., valid request, valid user, etc.), authenticating results and/or partial results, establishing DTP authentication credentials for user devices, adding/deleting components (e.g., user devices, DST execution units, and/or DST processing units) from the distributed computing system, and/or establishing DTP authentication credentials for DST execution units.

To support distributed task processing on stored data, the distributed computing system 10 has two primary operations: DST (distributed storage and/or task) management and DST execution on stored data. With respect to the DST execution on stored data, if the second type of user device 14 has a task request 38 for execution by the DSTN module 22, it sends the task request 38 to the DST processing unit 16 via its interface 30. An example of DST execution on stored data will be discussed in greater detail with reference to FIGS. 27-39. With respect to the DST management, it is substantially similar to the DST management to support distributed task processing on received data.

Figure 2:
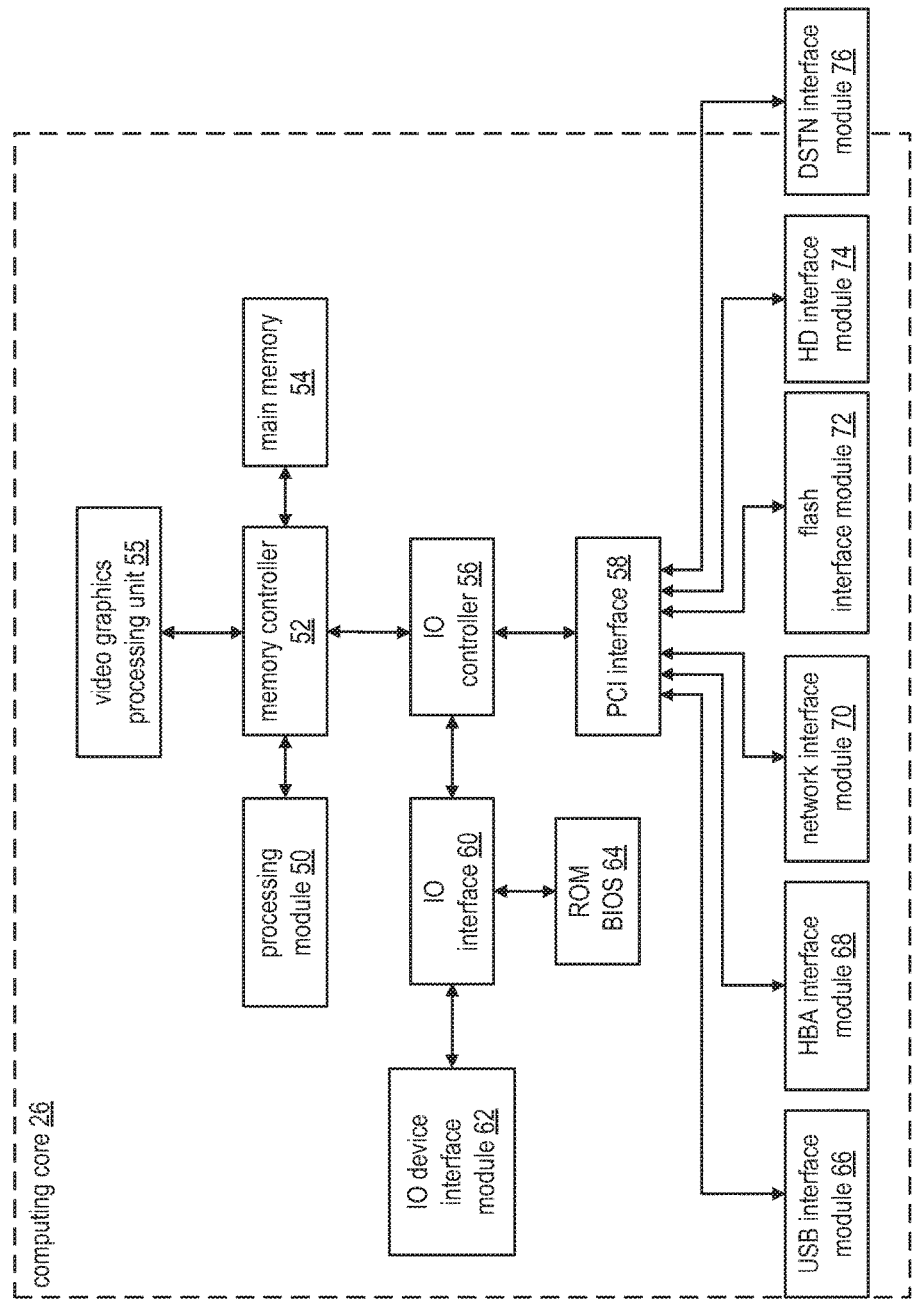
FIG. 2 is a schematic block diagram of an embodiment of a computing core in accordance with the present invention.

FIG. 2 is a schematic block diagram of an embodiment of a computing core 26 that includes a processing module 50, a memory controller 52, main memory 54, a video graphics processing unit 55, an input/output (IO) controller 56, a peripheral component interconnect (PCI) interface 58, an IO interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSTN interface module 76.

The DSTN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSTN interface module 76 and/or the network interface module 70 may function as the interface 30 of the user device 14 of FIG. 1. Further note that the IO device interface module 62 and/or the memory interface modules may be collectively or individually referred to as IO ports.

Figure 3:
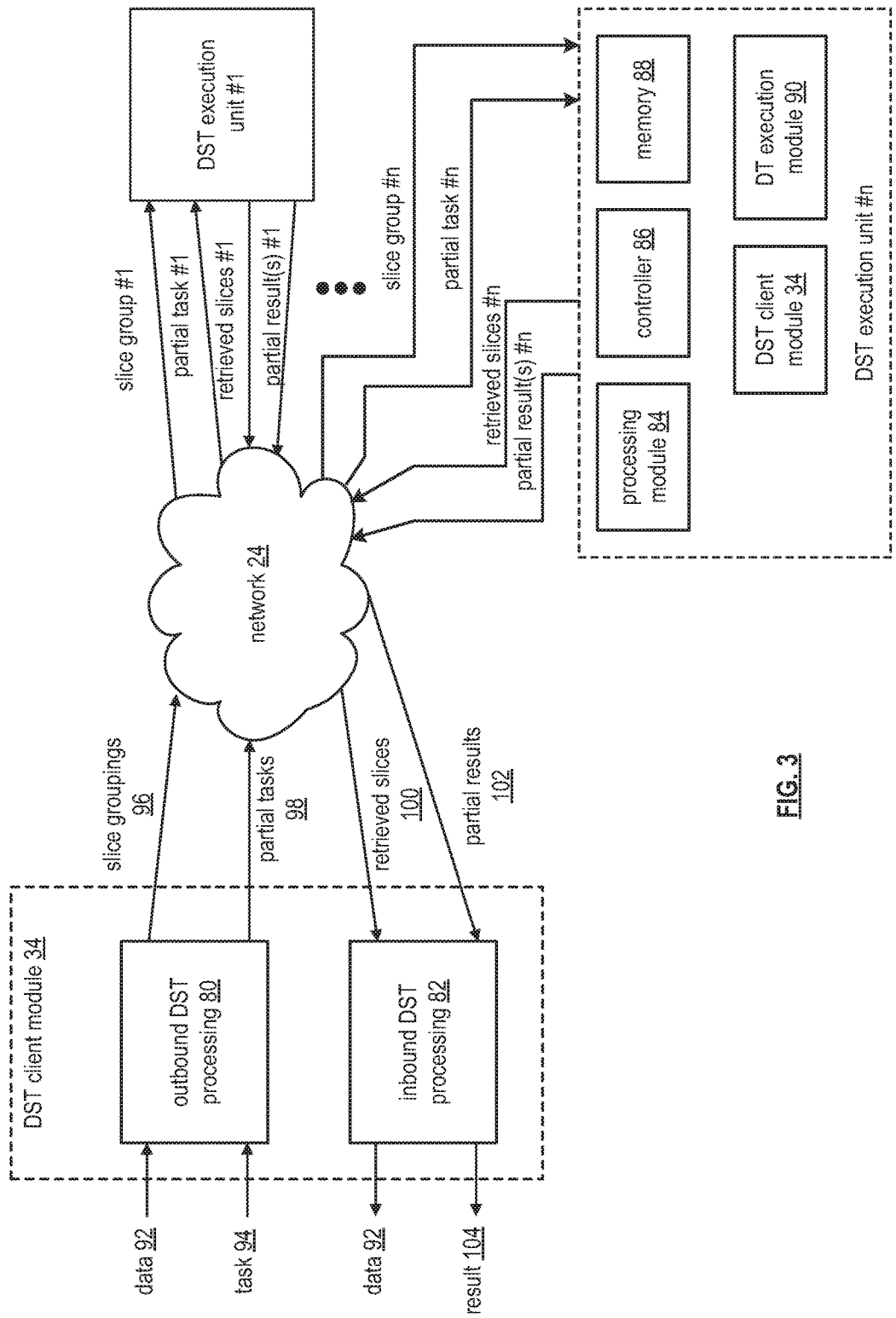
FIG. 3 is a diagram of an example of a distributed storage and task processing in accordance with the present invention.

FIG. 3 is a diagram of an example of the distributed computing system performing a distributed storage and task processing operation. The distributed computing system includes a DST (distributed storage and/or task) client module 34 (which may be in user device 14 and/or in DST processing unit 16 of FIG. 1), a network 24, a plurality of DST execution units 1-n that includes two or more DST execution units 36 of FIG. 1 (which form at least a portion of DSTN module 22 of FIG. 1), a DST managing module (not shown), and a DST integrity verification module (not shown). The DST client module 34 includes an outbound DST processing section 80 and an inbound DST processing section 82. Each of the DST execution units 1-n includes a controller 86, a processing module 84, memory 88, a DT (distributed task) execution module 90, and a DST client module 34.

In an example of operation, the DST client module 34 receives data 92 and one or more tasks 94 to be performed upon the data 92. The data 92 may be of any size and of any content, where, due to the size (e.g., greater than a few Terabytes), the content (e.g., secure data, etc.), and/or task(s) (e.g., MIPS intensive), distributed processing of the task(s) on the data is desired. For example, the data 92 may be one or more digital books, a copy of a company's emails, a large-scale Internet search, a video security file, one or more entertainment video files (e.g., television programs, movies, etc.), data files, and/or any other large amount of data (e.g., greater than a few Terabytes).

Within the DST client module 34, the outbound DST processing section 80 receives the data 92 and the task(s) 94. The outbound DST processing section 80 processes the data 92 to produce slice groupings 96. As an example of such processing, the outbound DST processing section 80 partitions the data 92 into a plurality of data partitions. For each data partition, the outbound DST processing section 80 dispersed storage (DS) error encodes the data partition to produce encoded data slices and groups the encoded data slices into a slice grouping 96. In addition, the outbound DST processing section 80 partitions the task 94 into partial tasks 98, where the number of partial tasks 98 may correspond to the number of slice groupings 96.

The outbound DST processing section 80 then sends, via the network 24, the slice groupings 96 and the partial tasks 98 to the DST execution units 1-n of the DSTN module 22 of FIG. 1. For example, the outbound DST processing section 80 sends slice group 1 and partial task 1 to DST execution unit 1. As another example, the outbound DST processing section 80 sends slice group #n and partial task #n to DST execution unit #n.

Each DST execution unit performs its partial task 98 upon its slice group 96 to produce partial results 102. For example, DST execution unit #1 performs partial task #1 on slice group #1 to produce a partial result #1, for results. As a more specific example, slice group #1 corresponds to a data partition of a series of digital books and the partial task #1 corresponds to searching for specific phrases, recording where the phrase is found, and establishing a phrase count. In this more specific example, the partial result #1 includes information as to where the phrase was found and includes the phrase count.

Upon completion of generating their respective partial results 102, the DST execution units send, via the network 24, their partial results 102 to the inbound DST processing section 82 of the DST client module 34. The inbound DST processing section 82 processes the received partial results 102 to produce a result 104. Continuing with the specific example of the preceding paragraph, the inbound DST processing section 82 combines the phrase count from each of the DST execution units 36 to produce a total phrase count. In addition, the inbound DST processing section 82 combines the 'where the phrase was found' information from each of the DST execution units 36 within their respective data partitions to produce 'where the phrase was found' information for the series of digital books.

In another example of operation, the DST client module 34 requests retrieval of stored data within the memory of the DST execution units 36 (e.g., memory of the DSTN module). In this example, the task 94 is retrieve data stored in the memory of the DSTN module. Accordingly, the outbound DST processing section 80 converts the task 94 into a plurality of partial tasks 98 and sends the partial tasks 98 to the respective DST execution units 1-n.

In response to the partial task 98 of retrieving stored data, a DST execution unit 36 identifies the corresponding encoded data slices 100 and retrieves them. For example, DST execution unit #1 receives partial task #1 and retrieves, in response thereto, retrieved slices #1. The DST execution units 36 send their respective retrieved slices 100 to the inbound DST processing section 82 via the network 24.

The inbound DST processing section 82 converts the retrieved slices 100 into data 92. For example, the inbound DST processing section 82 de-groups the retrieved slices 100 to produce encoded slices per data partition. The inbound DST processing section 82 then DS error decodes the encoded slices per data partition to produce data partitions. The inbound DST processing section 82 de-partitions the data partitions to recapture the data 92.

Figure 4:
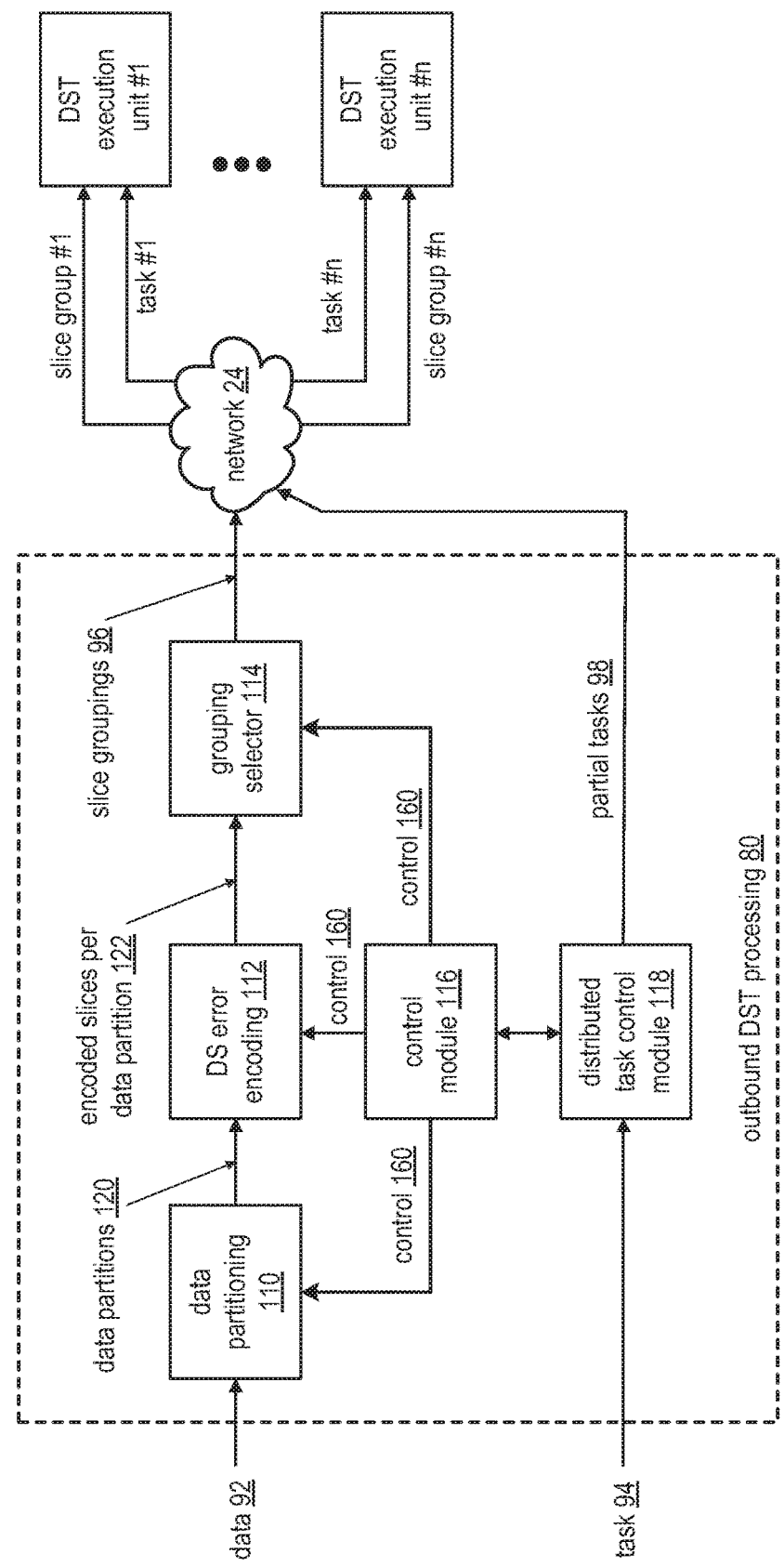
FIG. 4 is a schematic block diagram of an embodiment of an outbound distributed storage and/or task (DST) processing in accordance with the present invention.

FIG. 4 is a schematic block diagram of an embodiment of an outbound distributed storage and/or task (DST) processing section 80 of a DST client module 34 FIG. 1 coupled to a DSTN module 22 of a FIG. 1 (e.g., a plurality of n DST execution units 36) via a network 24. The outbound DST processing section 80 includes a data partitioning module 110, a dispersed storage (DS) error encoding module 112, a grouping selector module 114, a control module 116, and a distributed task control module 118.

In an example of operation, the data partitioning module 110 partitions data 92 into a plurality of data partitions 120. The number of partitions and the size of the partitions may be selected by the control module 116 via control 160 based on the data 92 (e.g., its size, its content, etc.), a corresponding task 94 to be performed (e.g., simple, complex, single step, multiple steps, etc.), DS encoding parameters (e.g., pillar width, decode threshold, write threshold, segment security parameters, slice security parameters, etc.), capabilities of the DST execution units 36 (e.g., processing resources, availability of processing recourses, etc.), and/or as may be inputted by a user, system administrator, or other operator (human or automated). For example, the data partitioning module 110 partitions the data 92 (e.g., 100 Terabytes) into 100,000 data segments, each being 1 Gigabyte in size. Alternatively, the data partitioning module 110 partitions the data 92 into a plurality of data segments, where some of data segments are of a different size, are of the same size, or a combination thereof.

The DS error encoding module 112 receives the data partitions 120 in a serial manner, a parallel manner, and/or a combination thereof. For each data partition 120, the DS error encoding module 112 DS error encodes the data partition 120 in accordance with control information 160 from the control module 116 to produce encoded data slices 122. The DS error encoding includes segmenting the data partition into data segments, segment security processing (e.g., encryption, compression, watermarking, integrity check (e.g., CRC), etc.), error encoding, slicing, and/or per slice security processing (e.g., encryption, compression, watermarking, integrity check (e.g., CRC), etc.). The control information 160 indicates which steps of the DS error encoding are active for a given data partition and, for active steps, indicates the parameters for the step. For example, the control information 160 indicates that the error encoding is active and includes error encoding parameters (e.g., pillar width, decode threshold, write threshold, read threshold, type of error encoding, etc.).

The grouping selector module 114 groups the encoded slices 122 of a data partition into a set of slice groupings 96. The number of slice groupings corresponds to the number of DST execution units 36 identified for a particular task 94. For example, if five DST execution units 36 are identified for the particular task 94, the grouping selector module groups the encoded slices 122 of a data partition into five slice groupings 96. The grouping selector module 114 outputs the slice groupings 96 to the corresponding DST execution units 36 via the network 24.

The distributed task control module 118 receives the task 94 and converts the task 94 into a set of partial tasks 98. For example, the distributed task control module 118 receives a task to find where in the data (e.g., a series of books) a phrase occurs and a total count of the phrase usage in the data. In this example, the distributed task control module 118 replicates the task 94 for each DST execution unit 36 to produce the partial tasks 98. In another example, the distributed task control module 118 receives a task to find where in the data a first phrase occurs, where in the data a second phrase occurs, and a total count for each phrase usage in the data. In this example, the distributed task control module 118 generates a first set of partial tasks 98 for finding and counting the first phrase and a second set of partial tasks for finding and counting the second phrase. The distributed task control module 118 sends respective first and/or second partial tasks 98 to each DST execution unit 36.

Figure 5:
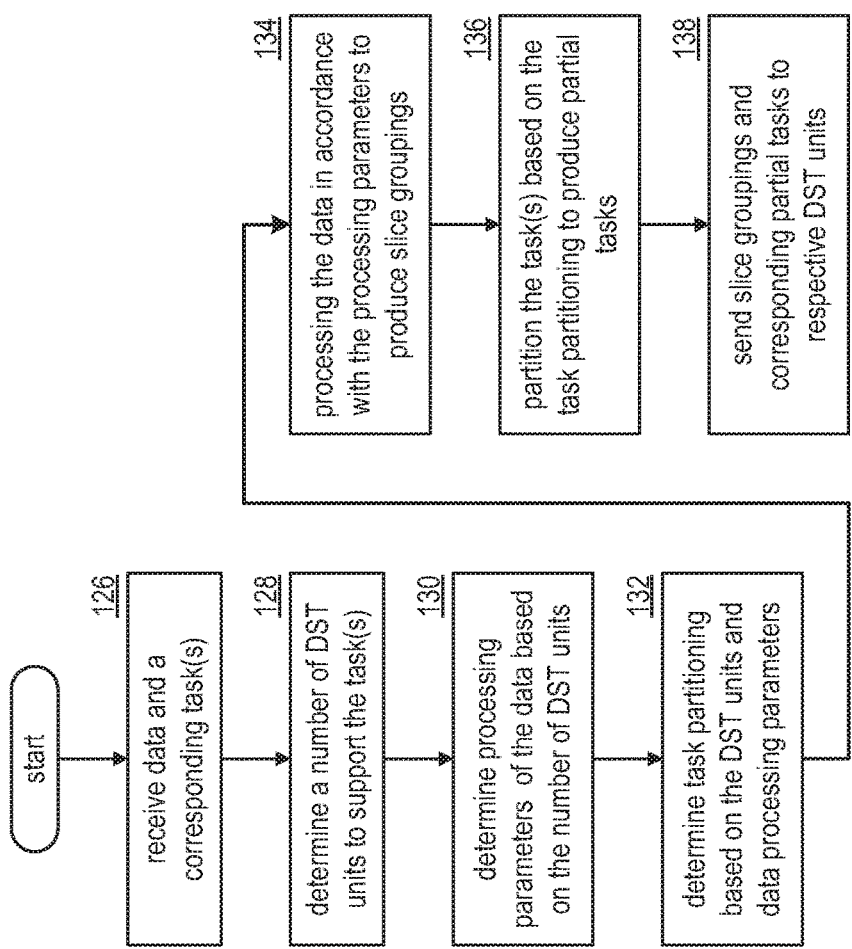
FIG. 5 is a logic diagram of an example of a method for outbound DST processing in accordance with the present invention.

FIG. 5 is a logic diagram of an example of a method for outbound distributed storage and task (DST) processing that begins at step 126 where a DST client module receives data and one or more corresponding tasks. The method continues at step 128 where the DST client module determines a number of DST units to support the task for one or more data partitions. For example, the DST client module may determine the number of DST units to support the task based on the size of the data, the requested task, the content of the data, a predetermined number (e.g., user indicated, system administrator determined, etc.), available DST units, capability of the DST units, and/or any other factor regarding distributed task processing of the data. The DST client module may select the same DST units for each data partition, may select different DST units for the data partitions, or a combination thereof.

The method continues at step 130 where the DST client module determines processing parameters of the data based on the number of DST units selected for distributed task processing. The processing parameters include data partitioning information, DS encoding parameters, and/or slice grouping information. The data partitioning information includes a number of data partitions, size of each data partition, and/or organization of the data partitions (e.g., number of data blocks in a partition, the size of the data blocks, and arrangement of the data blocks). The DS encoding parameters include segmenting information, segment security information, error encoding information (e.g., dispersed storage error encoding function parameters including one or more of pillar width, decode threshold, write threshold, read threshold, generator matrix), slicing information, and/or per slice security information. The slice grouping information includes information regarding how to arrange the encoded data slices into groups for the selected DST units. As a specific example, if the DST client module determines that five DST units are needed to support the task, then it determines that the error encoding parameters include a pillar width of five and a decode threshold of three.

The method continues at step 132 where the DST client module determines task partitioning information (e.g., how to partition the tasks) based on the selected DST units and data processing parameters. The data processing parameters include the processing parameters and DST unit capability information. The DST unit capability information includes the number of DT (distributed task) execution units, execution capabilities of each DT execution unit (e.g., MIPS capabilities, processing resources (e.g., quantity and capability of microprocessors, CPUs, digital signal processors, co-processor, microcontrollers, arithmetic logic circuitry, and/or any other analog and/or digital processing circuitry), availability of the processing resources, memory information (e.g., type, size, availability, etc.)), and/or any information germane to executing one or more tasks.

The method continues at step 134 where the DST client module processes the data in accordance with the processing parameters to produce slice groupings. The method continues at step 136 where the DST client module partitions the task based on the task partitioning information to produce a set of partial tasks. The method continues at step 138 where the DST client module sends the slice groupings and the corresponding partial tasks to respective DST units.

Figure 6:
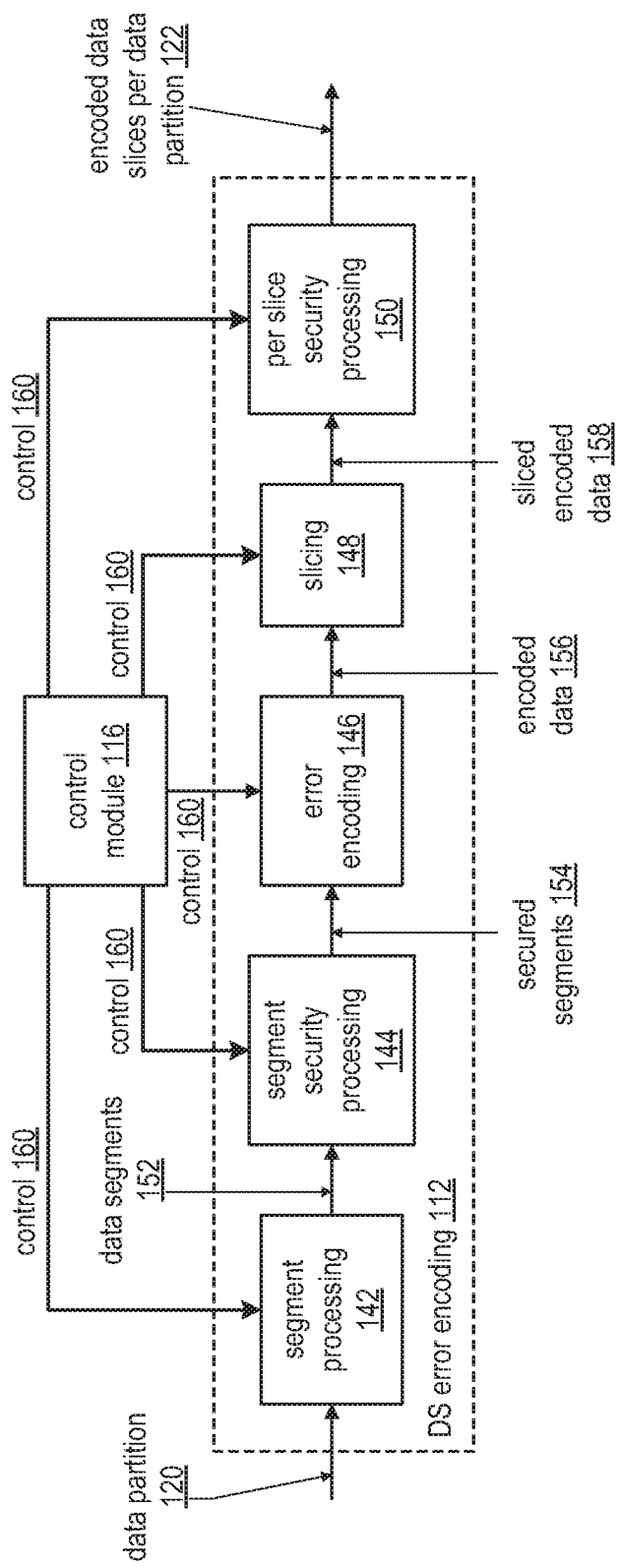
FIG. 6 is a schematic block diagram of an embodiment of a dispersed error encoding in accordance with the present invention.

FIG. 6 is a schematic block diagram of an embodiment of the dispersed storage (DS) error encoding module 112 of an outbound distributed storage and task (DST) processing section. The DS error encoding module 112 includes a segment processing module 142, a segment security processing module 144, an error encoding module 146, a slicing module 148, and a per slice security processing module 150. Each of these modules is coupled to a control module 116 to receive control information 160 therefrom.

In an example of operation, the segment processing module 142 receives a data partition 120 from a data partitioning module and receives segmenting information as the control information 160 from the control module 116. The segmenting information indicates how the segment processing module 142 is to segment the data partition 120. For example, the segmenting information indicates how many rows to segment the data based on a decode threshold of an error encoding scheme, indicates how many columns to segment the data into based on a number and size of data blocks within the data partition 120, and indicates how many columns to include in a data segment 152. The segment processing module 142 segments the data 120 into data segments 152 in accordance with the segmenting information.

The segment security processing module 144, when enabled by the control module 116, secures the data segments 152 based on segment security information received as control information 160 from the control module 116. The segment security information includes data compression, encryption, watermarking, integrity check (e.g., cyclic redundancy check (CRC), etc.), and/or any other type of digital security. For example, when the segment security processing module 144 is enabled, it may compress a data segment 152, encrypt the compressed data segment, and generate a CRC value for the encrypted data segment to produce a secure data segment 154. When the segment security processing module 144 is not enabled, it passes the data segments 152 to the error encoding module 146 or is bypassed such that the data segments 152 are provided to the error encoding module 146.

The error encoding module 146 encodes the secure data segments 154 in accordance with error correction encoding parameters received as control information 160 from the control module 116. The error correction encoding parameters (e.g., also referred to as dispersed storage error coding parameters) include identifying an error correction encoding scheme (e.g., forward error correction algorithm, a Reed-Solomon based algorithm, an online coding algorithm, an information dispersal algorithm, etc.), a pillar width, a decode threshold, a read threshold, a write threshold, etc. For example, the error correction encoding parameters identify a specific error correction encoding scheme, specifies a pillar width of five, and specifies a decode threshold of three. From these parameters, the error encoding module 146 encodes a data segment 154 to produce an encoded data segment 156.

The slicing module 148 slices the encoded data segment 156 in accordance with the pillar width of the error correction encoding parameters received as control information 160. For example, if the pillar width is five, the slicing module 148 slices an encoded data segment 156 into a set of five encoded data slices. As such, for a plurality of encoded data segments 156 for a given data partition, the slicing module outputs a plurality of sets of encoded data slices 158.

The per slice security processing module 150, when enabled by the control module 116, secures each encoded data slice 158 based on slice security information received as control information 160 from the control module 116. The slice security information includes data compression, encryption, watermarking, integrity check (e.g., CRC, etc.), and/or any other type of digital security. For example, when the per slice security processing module 150 is enabled, it compresses an encoded data slice 158, encrypts the compressed encoded data slice, and generates a CRC value for the encrypted encoded data slice to produce a secure encoded data slice 122. When the per slice security processing module 150 is not enabled, it passes the encoded data slices 158 or is bypassed such that the encoded data slices 158 are the output of the DS error encoding module 112. Note that the control module 116 may be omitted and each module stores its own parameters.

Figure 7:
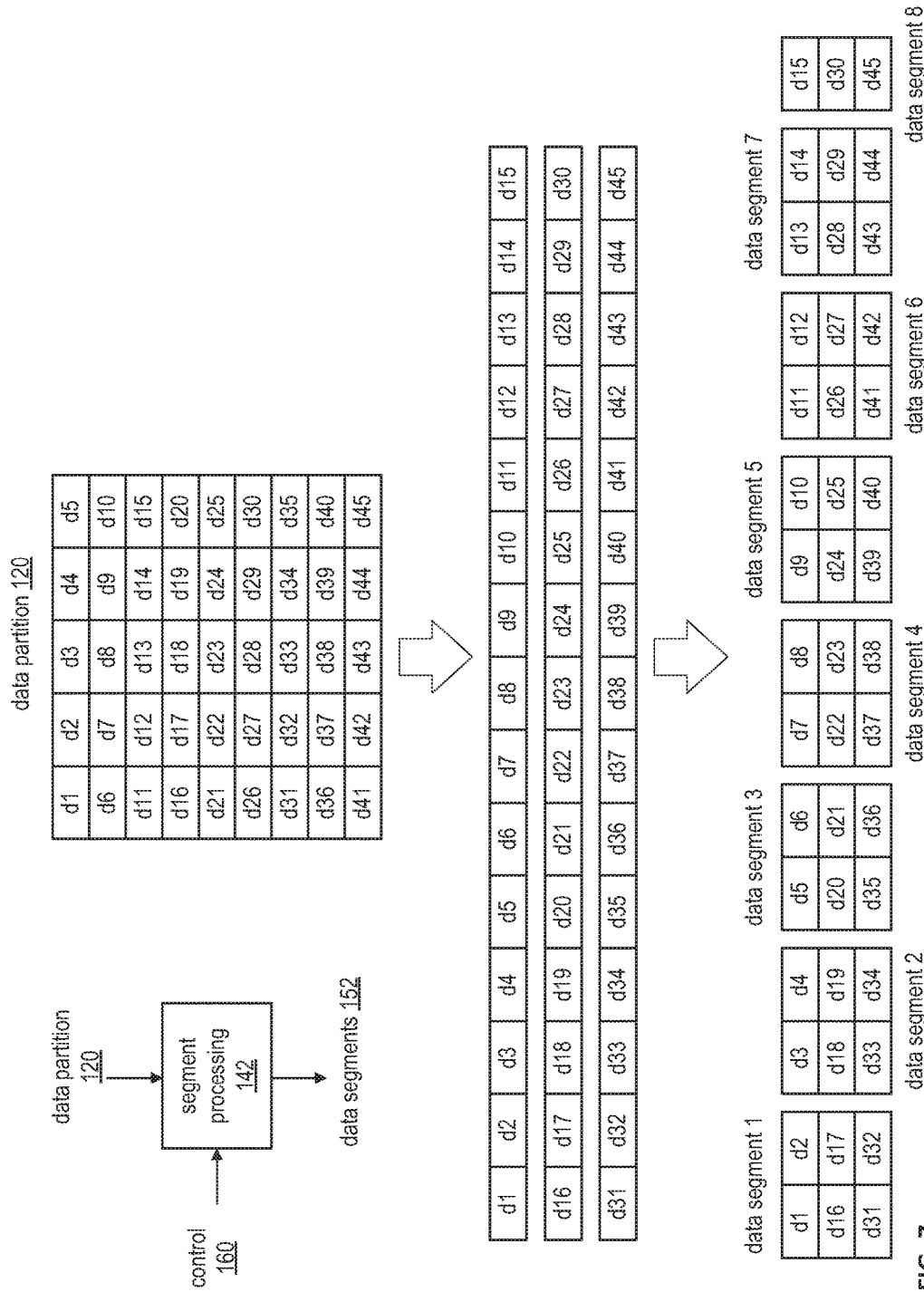
FIG. 7 is a diagram of an example of a segment processing of the dispersed error encoding in accordance with the present invention.

FIG. 7 is a diagram of an example of a segment processing of a dispersed storage (DS) error encoding module. In this example, a segment processing module 142 receives a data partition 120 that includes 45 data blocks (e.g., d1-d45), receives segmenting information (i.e., control information 160) from a control module, and segments the data partition 120 in accordance with the control information 160 to produce data segments 152. Each data block may be of the same size as other data blocks or of a different size. In addition, the size of each data block may be a few bytes to megabytes of data. As previously mentioned, the segmenting information indicates how many rows to segment the data partition into, indicates how many columns to segment the data partition into, and indicates how many columns to include in a data segment.

In this example, the decode threshold of the error encoding scheme is three; as such the number of rows to divide the data partition into is three. The number of columns for each row is set to 15, which is based on the number and size of data blocks. The data blocks of the data partition are arranged in rows and columns in a sequential order (i.e., the first row includes the first 15 data blocks; the second row includes the second 15 data blocks; and the third row includes the last 15 data blocks).

With the data blocks arranged into the desired sequential order, they are divided into data segments based on the segmenting information. In this example, the data partition is divided into 8 data segments; the first 7 include 2 columns of three rows and the last includes 1 column of three rows. Note that the first row of the 8 data segments is in sequential order of the first 15 data blocks; the second row of the 8 data segments in sequential order of the second 15 data blocks; and the third row of the 8 data segments in sequential order of the last 15 data blocks. Note that the number of data blocks, the grouping of the data blocks into segments, and size of the data blocks may vary to accommodate the desired distributed task processing function.

Figure 8:
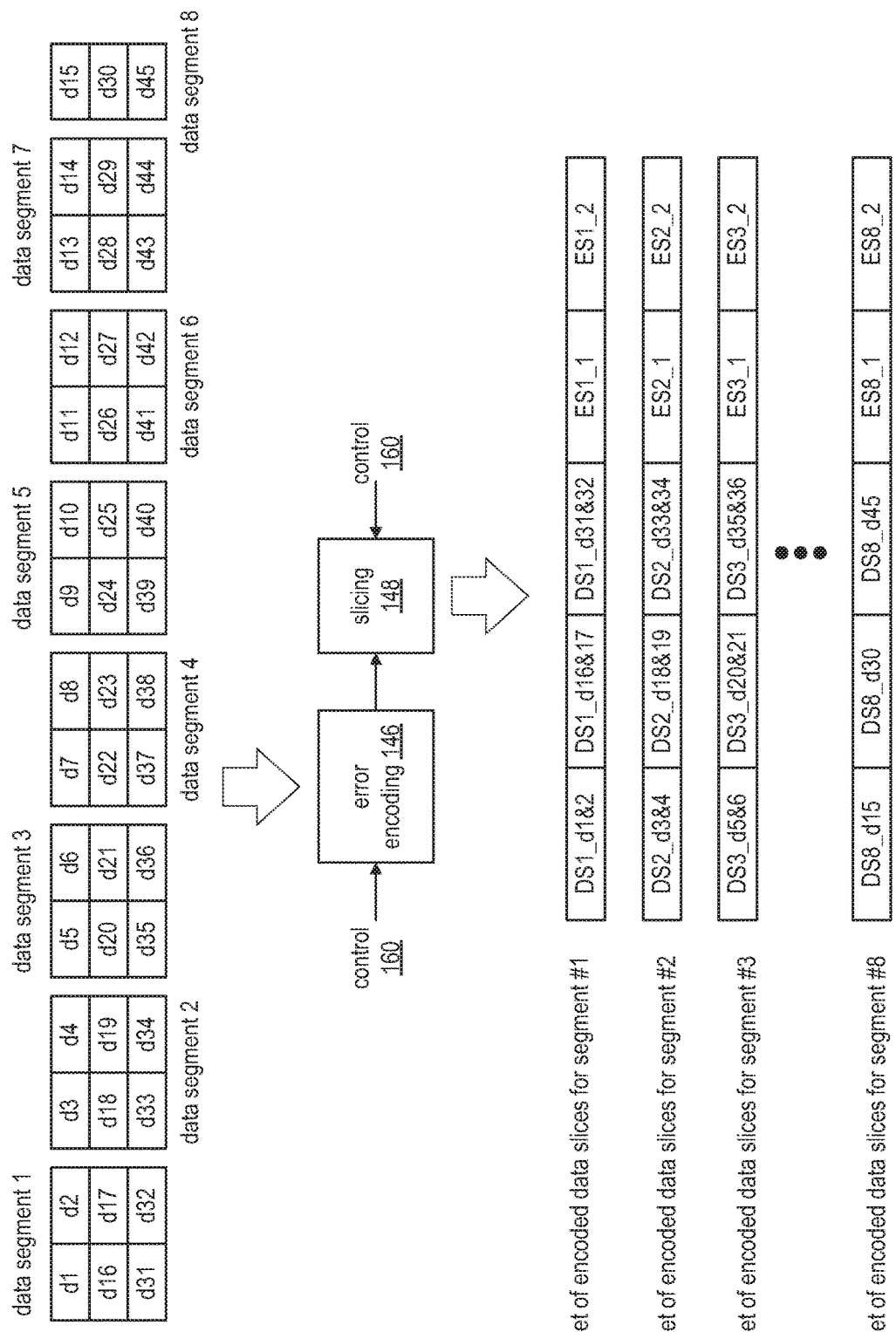
FIG. 8 is a diagram of an example of error encoding and slicing processing of the dispersed error encoding in accordance with the present invention.

FIG. 8 is a diagram of an example of error encoding and slicing processing of the dispersed error encoding processing the data segments of FIG. 7. In this example, data segment 1 includes 3 rows with each row being treated as one word for encoding. As such, data segment 1 includes three words for encoding: word 1 including data blocks d1 and d2, word 2 including data blocks d16 and d17, and word 3 including data blocks d31 and d32. Each of data segments 2-7 includes three words where each word includes two data blocks. Data segment 8 includes three words where each word includes a single data block (e.g., d15, d30, and d45).

In operation, an error encoding module 146 and a slicing module 148 convert each data segment into a set of encoded data slices in accordance with error correction encoding parameters as control information 160. More specifically, when the error correction encoding parameters indicate a unity matrix Reed-Solomon based encoding algorithm, 5 pillars, and decode threshold of 3, the first three encoded data slices of the set of encoded data slices for a data segment are substantially similar to the corresponding word of the data segment. For instance, when the unity matrix Reed-Solomon based encoding algorithm is applied to data segment 1, the content of the first encoded data slice (DS1_d1&2) of the first set of encoded data slices (e.g., corresponding to data segment 1) is substantially similar to content of the first word (e.g., d1 & d2); the content of the second encoded data slice (DS1_d16&17) of the first set of encoded data slices is substantially similar to content of the second word (e.g., d16 & d17); and the content of the third encoded data slice (DS1_d31&32) of the first set of encoded data slices is substantially similar to content of the third word (e.g., d31 & d32).

The content of the fourth and fifth encoded data slices (e.g., ES1_1 and ES1_2) of the first set of encoded data slices include error correction data based on the first-third words of the first data segment. With such an encoding and slicing scheme, retrieving any three of the five encoded data slices allows the data segment to be accurately reconstructed.

The encoding and slicing of data segments 2-7 yield sets of encoded data slices similar to the set of encoded data slices of data segment 1. For instance, the content of the first encoded data slice (DS2_d3&4) of the second set of encoded data slices (e.g., corresponding to data segment 2) is substantially similar to content of the first word (e.g., d3 & d4); the content of the second encoded data slice (DS2_d18&19) of the second set of encoded data slices is substantially similar to content of the second word (e.g., d18 & d19); and the content of the third encoded data slice (DS2_d33&34) of the second set of encoded data slices is substantially similar to content of the third word (e.g., d33 & d34). The content of the fourth and fifth encoded data slices (e.g., ES1_1 and ES1_2) of the second set of encoded data slices includes error correction data based on the first-third words of the second data segment.

Figure 9:
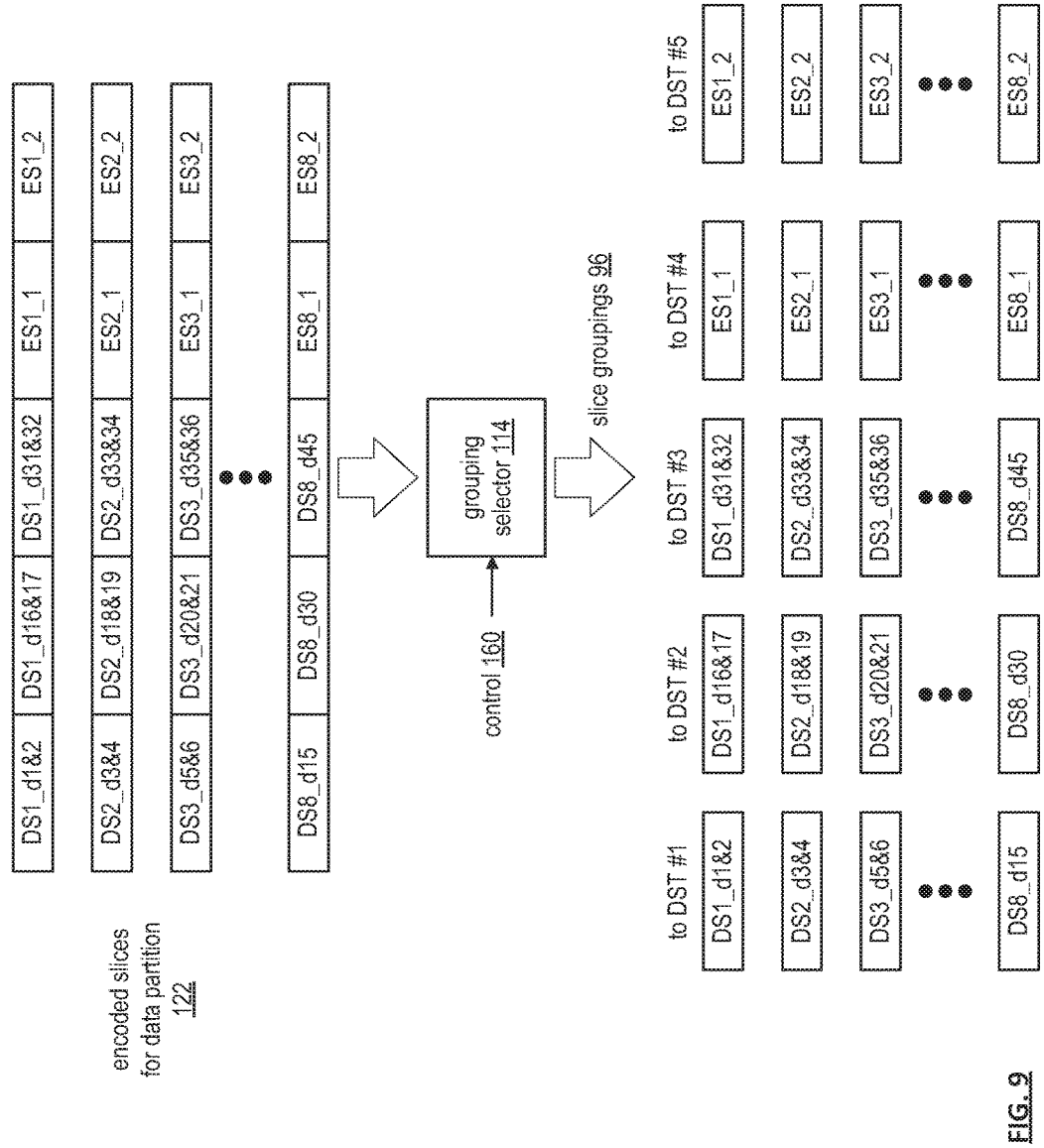
FIG. 9 is a diagram of an example of grouping selection processing of the outbound DST processing in accordance with the present invention.

FIG. 9 is a diagram of an example of grouping selection processing of an outbound distributed storage and task (DST) processing in accordance with group selection information as control information 160 from a control module. Encoded slices for data partition 122 are grouped in accordance with the control information 160 to produce slice groupings 96. In this example, a grouping selector module 114 organizes the encoded data slices into five slice groupings (e.g., one for each DST execution unit of a distributed storage and task network (DSTN) module). As a specific example, the grouping selector module 114 creates a first slice grouping for a DST execution unit #1, which includes first encoded slices of each of the sets of encoded slices. As such, the first DST execution unit receives encoded data slices corresponding to data blocks 1-15 (e.g., encoded data slices of contiguous data).

The grouping selector module 114 also creates a second slice grouping for a DST execution unit #2, which includes second encoded slices of each of the sets of encoded slices. As such, the second DST execution unit receives encoded data slices corresponding to data blocks 16-30. The grouping selector module 114 further creates a third slice grouping for DST execution unit #3, which includes third encoded slices of each of the sets of encoded slices. As such, the third DST execution unit receives encoded data slices corresponding to data blocks 31-45.

The grouping selector module 114 creates a fourth slice grouping for DST execution unit #4, which includes fourth encoded slices of each of the sets of encoded slices. As such, the fourth DST execution unit receives encoded data slices corresponding to first error encoding information (e.g., encoded data slices of error coding (EC) data). The grouping selector module 114 further creates a fifth slice grouping for DST execution unit #5, which includes fifth encoded slices of each of the sets of encoded slices. As such, the fifth DST execution unit receives encoded data slices corresponding to second error encoding information.

Figure 10:
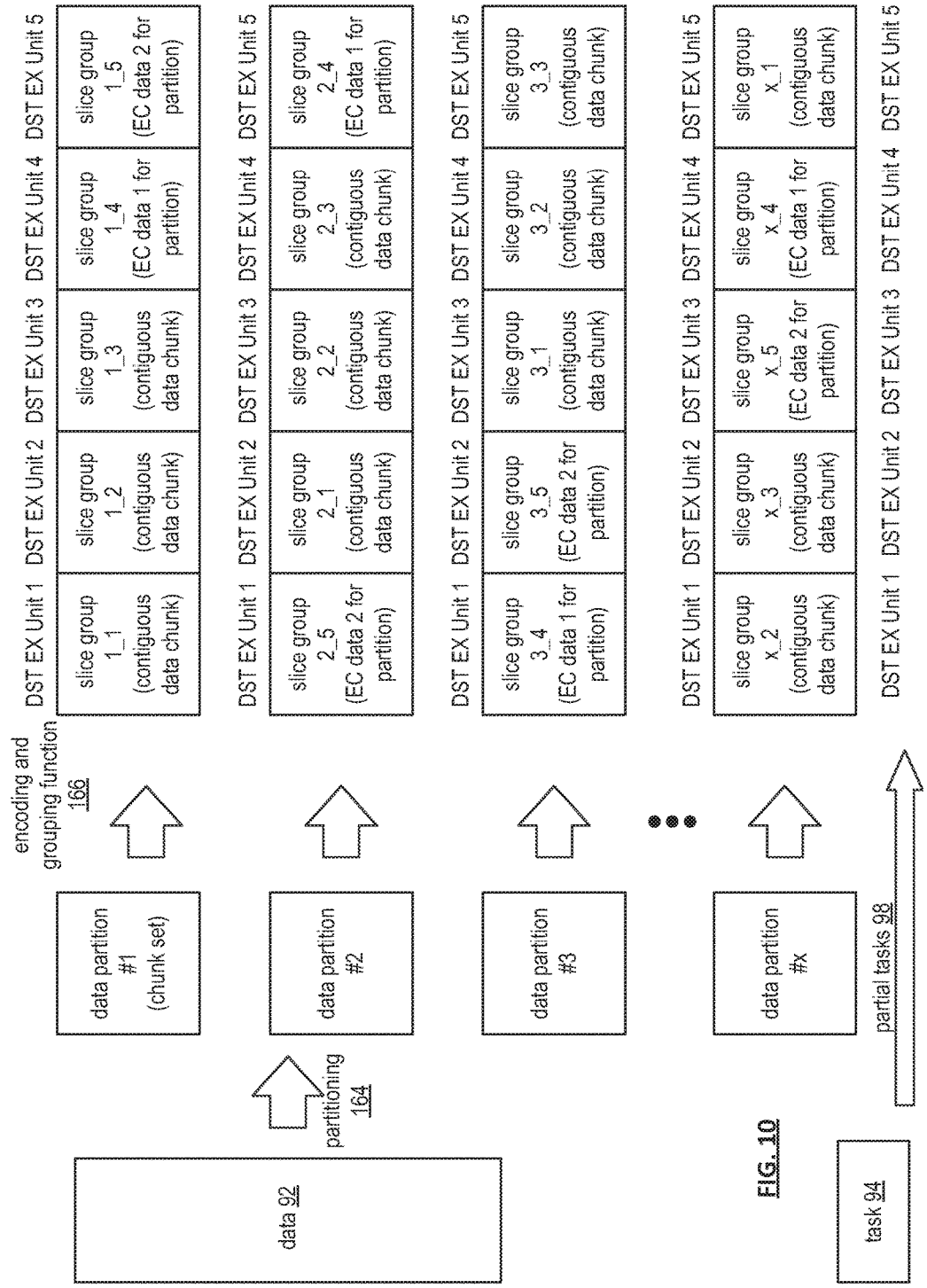
FIG. 10 is a diagram of an example of converting data into slice groups in accordance with the present invention.

FIG. 10 is a diagram of an example of converting data 92 into slice groups that expands on the preceding figures. As shown, the data 92 is partitioned in accordance with a partitioning function 164 into a plurality of data partitions (1-x, where x is an integer greater than 4). Each data partition (or chunkset of data) is encoded and grouped into slice groupings as previously discussed by an encoding and grouping function 166. For a given data partition, the slice groupings are sent to distributed storage and task (DST) execution units. From data partition to data partition, the ordering of the slice groupings to the DST execution units may vary.

For example, the slice groupings of data partition #1 is sent to the DST execution units such that the first DST execution receives first encoded data slices of each of the sets of encoded data slices, which corresponds to a first continuous data chunk of the first data partition (e.g., refer to FIG. 9), a second DST execution receives second encoded data slices of each of the sets of encoded data slices, which corresponds to a second continuous data chunk of the first data partition, etc.

For the second data partition, the slice groupings may be sent to the DST execution units in a different order than it was done for the first data partition. For instance, the first slice grouping of the second data partition (e.g., slice group 2_1) is sent to the second DST execution unit; the second slice grouping of the second data partition (e.g., slice group 2_2) is sent to the third DST execution unit; the third slice grouping of the second data partition (e.g., slice group 2_3) is sent to the fourth DST execution unit; the fourth slice grouping of the second data partition (e.g., slice group 2_4, which includes first error coding information) is sent to the fifth DST execution unit; and the fifth slice grouping of the second data partition (e.g., slice group 2_5, which includes second error coding information) is sent to the first DST execution unit.

The pattern of sending the slice groupings to the set of DST execution units may vary in a predicted pattern, a random pattern, and/or a combination thereof from data partition to data partition. In addition, from data partition to data partition, the set of DST execution units may change. For example, for the first data partition, DST execution units 1-5 may be used; for the second data partition, DST execution units 6-10 may be used; for the third data partition, DST execution units 3-7 may be used; etc. As is also shown, the task is divided into partial tasks that are sent to the DST execution units in conjunction with the slice groupings of the data partitions.

Figure 11:
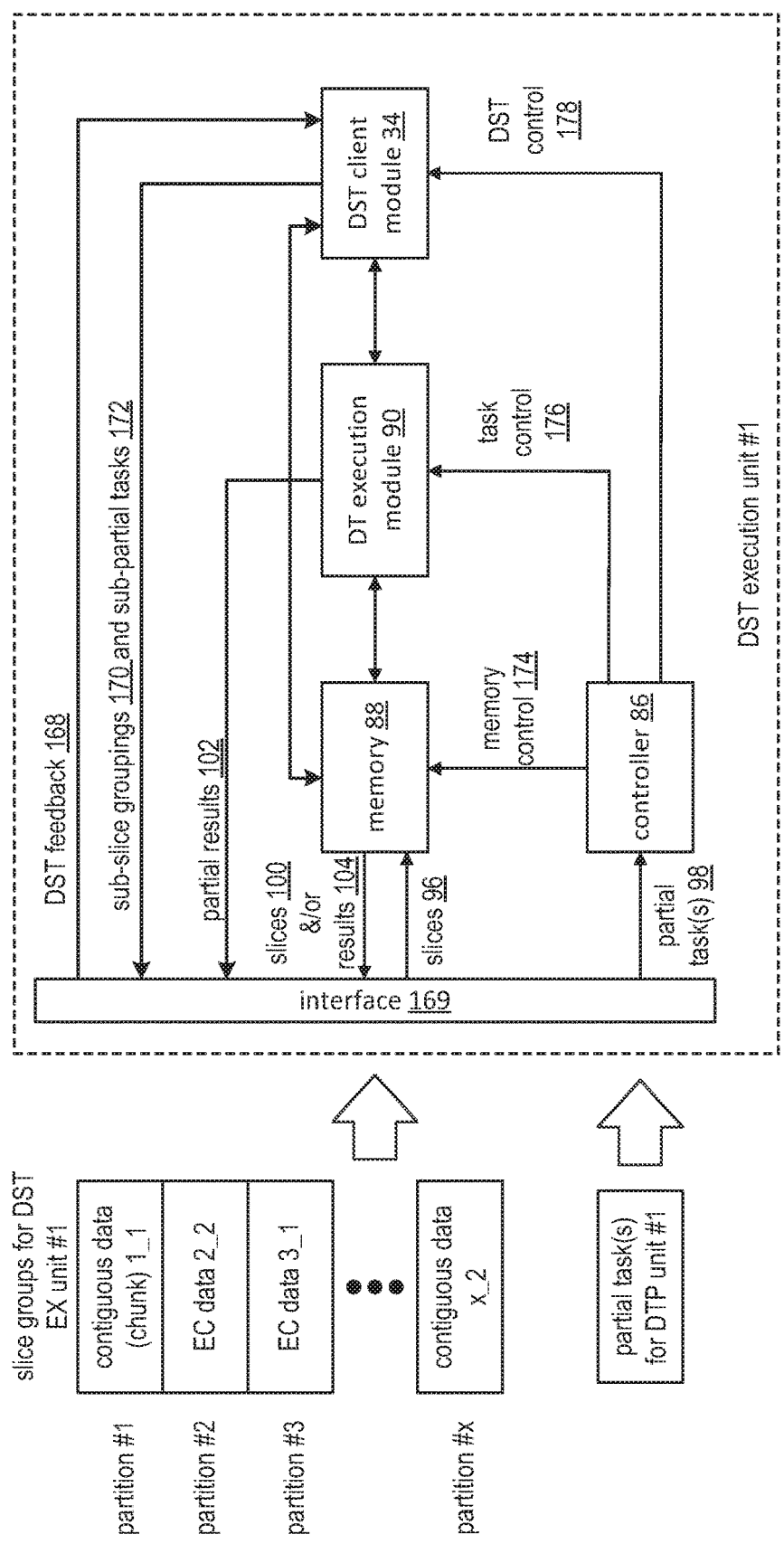
FIG. 11 is a schematic block diagram of an embodiment of a DST execution unit in accordance with the present invention.

FIG. 11 is a schematic block diagram of an embodiment of a DST (distributed storage and/or task) execution unit that includes an interface 169, a controller 86, memory 88, one or more DT (distributed task) execution modules 90, and a DST client module 34. The memory 88 is of sufficient size to store a significant number of encoded data slices (e.g., thousands of slices to hundreds-of-millions of slices) and may include one or more hard drives and/or one or more solid-state memory devices (e.g., flash memory, DRAM, etc.).

In an example of storing a slice group, the DST execution module receives a slice grouping 96 (e.g., slice group #1) via interface 169. The slice grouping 96 includes, per partition, encoded data slices of contiguous data or encoded data slices of error coding (EC) data. For slice group #1, the DST execution module receives encoded data slices of contiguous data for partitions #1 and #x (and potentially others between 3 and x) and receives encoded data slices of EC data for partitions #2 and #3 (and potentially others between 3 and x). Examples of encoded data slices of contiguous data and encoded data slices of error coding (EC) data are discussed with reference to FIG. 9. The memory 88 stores the encoded data slices of slice groupings 96 in accordance with memory control information 174 it receives from the controller 86.

The controller 86 (e.g., a processing module, a CPU, etc.) generates the memory control information 174 based on a partial task(s) 98 and distributed computing information (e.g., user information (e.g., user ID, distributed computing permissions, data access permission, etc.), vault information (e.g., virtual memory assigned to user, user group, temporary storage for task processing, etc.), task validation information, etc.). For example, the controller 86 interprets the partial task(s) 98 in light of the distributed computing information to determine whether a requestor is authorized to perform the task 98, is authorized to access the data, and/or is authorized to perform the task on this particular data. When the requestor is authorized, the controller 86 determines, based on the task 98 and/or another input, whether the encoded data slices of the slice grouping 96 are to be temporarily stored or permanently stored. Based on the foregoing, the controller 86 generates the memory control information 174 to write the encoded data slices of the slice grouping 96 into the memory 88 and to indicate whether the slice grouping 96 is permanently stored or temporarily stored.

With the slice grouping 96 stored in the memory 88, the controller 86 facilitates execution of the partial task(s) 98. In an example, the controller 86 interprets the partial task 98 in light of the capabilities of the DT execution module(s) 90. The capabilities include one or more of MIPS capabilities, processing resources (e.g., quantity and capability of microprocessors, CPUs, digital signal processors, co-processor, microcontrollers, arithmetic logic circuitry, and/or any other analog and/or digital processing circuitry), availability of the processing resources, etc. If the controller 86 determines that the DT execution module(s) 90 have sufficient capabilities, it generates task control information 176.

The task control information 176 may be a generic instruction (e.g., perform the task on the stored slice grouping) or a series of operational codes. In the former instance, the DT execution module 90 includes a co-processor function specifically configured (fixed or programmed) to perform the desired task 98. In the latter instance, the DT execution module 90 includes a general processor topology where the controller stores an algorithm corresponding to the particular task 98. In this instance, the controller 86 provides the operational codes (e.g., assembly language, source code of a programming language, object code, etc.) of the algorithm to the DT execution module 90 for execution.

Depending on the nature of the task 98, the DT execution module 90 may generate intermediate partial results 102 that are stored in the memory 88 or in a cache memory (not shown) within the DT execution module 90. In either case, when the DT execution module 90 completes execution of the partial task 98, it outputs one or more partial results 102. The partial results 102 may also be stored in memory 88.

If, when the controller 86 is interpreting whether capabilities of the DT execution module(s) 90 can support the partial task 98, the controller 86 determines that the DT execution module(s) 90 cannot adequately support the task 98 (e.g., does not have the right resources, does not have sufficient available resources, available resources would be too slow, etc.), it then determines whether the partial task 98 should be fully offloaded or partially offloaded.

If the controller 86 determines that the partial task 98 should be fully offloaded, it generates DST control information 178 and provides it to the DST client module 34. The DST control information 178 includes the partial task 98, memory storage information regarding the slice grouping 96, and distribution instructions. The distribution instructions instruct the DST client module 34 to divide the partial task 98 into sub-partial tasks 172, to divide the slice grouping 96 into sub-slice groupings 170, and identify other DST execution units. The DST client module 34 functions in a similar manner as the DST client module 34 of FIGS. 3-10 to produce the sub-partial tasks 172 and the sub-slice groupings 170 in accordance with the distribution instructions.

The DST client module 34 receives DST feedback 168 (e.g., sub-partial results), via the interface 169, from the DST execution units to which the task was offloaded. The DST client module 34 provides the sub-partial results to the DST execution unit, which processes the sub-partial results to produce the partial result(s) 102.

If the controller 86 determines that the partial task 98 should be partially offloaded, it determines what portion of the task 98 and/or slice grouping 96 should be processed locally and what should be offloaded. For the portion that is being locally processed, the controller 86 generates task control information 176 as previously discussed. For the portion that is being offloaded, the controller 86 generates DST control information 178 as previously discussed.

When the DST client module 34 receives DST feedback 168 (e.g., sub-partial results) from the DST executions units to which a portion of the task was offloaded, it provides the sub-partial results to the DT execution module 90. The DT execution module 90 processes the sub-partial results with the sub-partial results it created to produce the partial result(s) 102.

The memory 88 may be further utilized to retrieve one or more of stored slices 100, stored results 104, partial results 102 when the DT execution module 90 stores partial results 102 and/or results 104 in the memory 88. For example, when the partial task 98 includes a retrieval request, the controller 86 outputs the memory control 174 to the memory 88 to facilitate retrieval of slices 100 and/or results 104.

Figure 12:
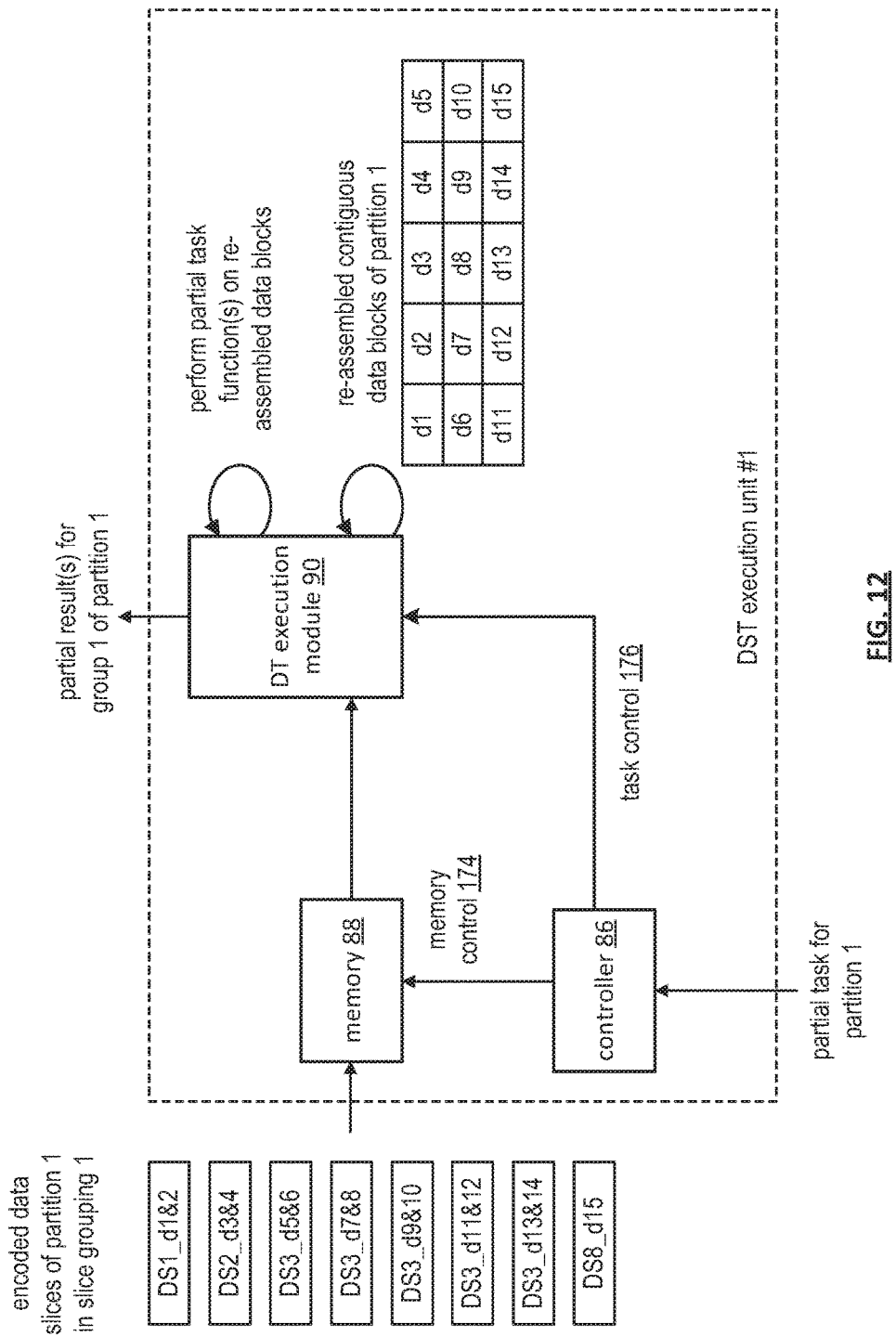
FIG. 12 is a schematic block diagram of an example of operation of a DST execution unit in accordance with the present invention.

FIG. 12 is a schematic block diagram of an example of operation of a distributed storage and task (DST) execution unit storing encoded data slices and executing a task thereon. To store the encoded data slices of a partition 1 of slice grouping 1, a controller 86 generates write commands as memory control information 174 such that the encoded slices are stored in desired locations (e.g., permanent or temporary) within memory 88.

Once the encoded slices are stored, the controller 86 provides task control information 176 to a distributed task (DT) execution module 90. As a first step of executing the task in accordance with the task control information 176, the DT execution module 90 retrieves the encoded slices from memory 88. The DT execution module 90 then reconstructs contiguous data blocks of a data partition. As shown for this example, reconstructed contiguous data blocks of data partition 1 include data blocks 1-15 (e.g., d1-d15).

With the contiguous data blocks reconstructed, the DT execution module 90 performs the task on the reconstructed contiguous data blocks. For example, the task may be to search the reconstructed contiguous data blocks for a particular word or phrase, identify where in the reconstructed contiguous data blocks the particular word or phrase occurred, and/or count the occurrences of the particular word or phrase on the reconstructed contiguous data blocks.

The DST execution unit continues in a similar manner for the encoded data slices of other partitions in slice grouping 1. Note that with using the unity matrix error encoding scheme previously discussed, if the encoded data slices of contiguous data are uncorrupted, the decoding of them is a relatively straightforward process of extracting the data.

If, however, an encoded data slice of contiguous data is corrupted (or missing), it can be rebuilt by accessing other DST execution units that are storing the other encoded data slices of the set of encoded data slices of the corrupted encoded data slice. In this instance, the DST execution unit having the corrupted encoded data slices retrieves at least three encoded data slices (of contiguous data and of error coding data) in the set from the other DST execution units (recall for this example, the pillar width is 5 and the decode threshold is 3). The DST execution unit decodes the retrieved data slices using the DS error encoding parameters to recapture the corresponding data segment. The DST execution unit then re-encodes the data segment using the DS error encoding parameters to rebuild the corrupted encoded data slice. Once the encoded data slice is rebuilt, the DST execution unit functions as previously described.

Figure 13:
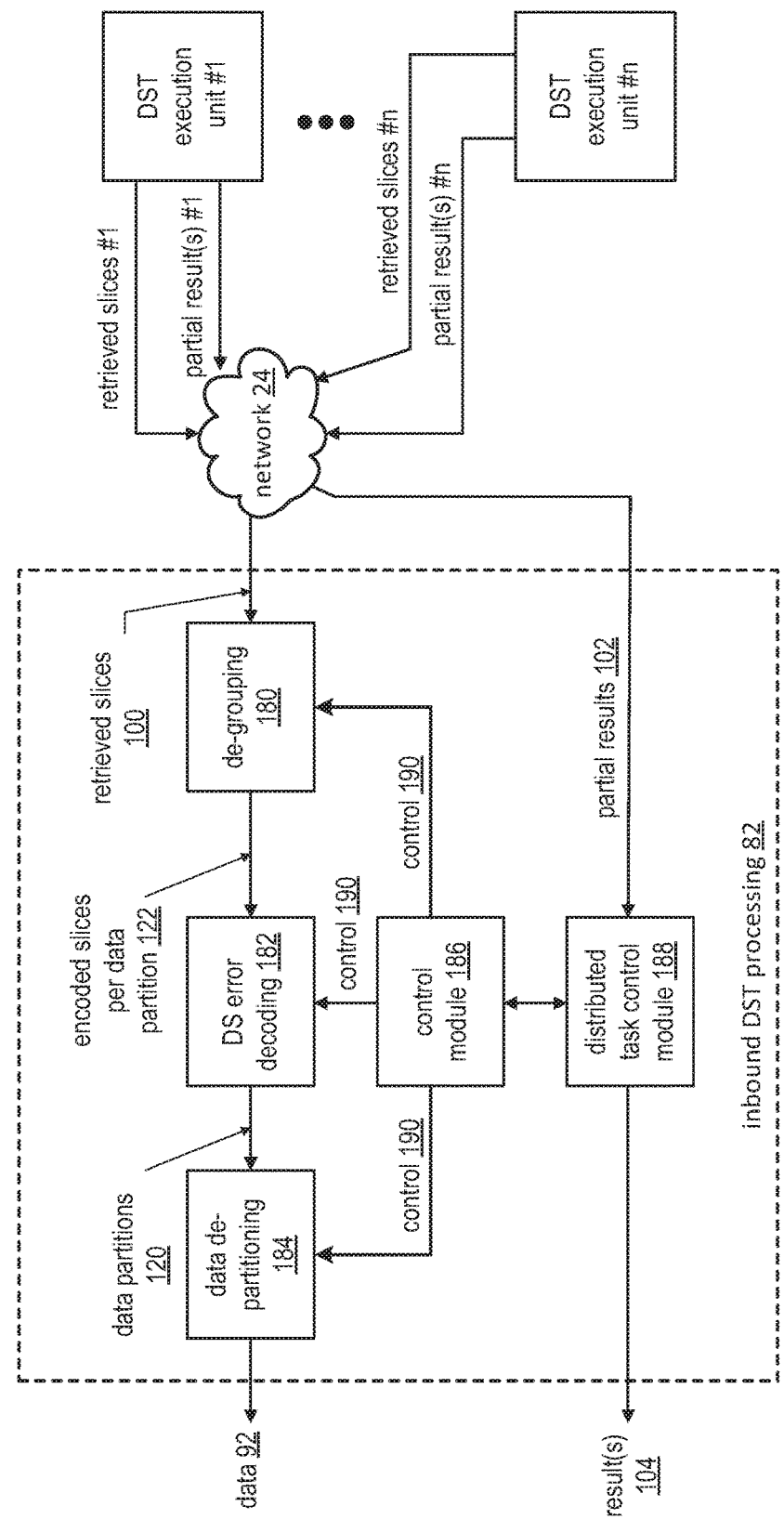
FIG. 13 is a schematic block diagram of an embodiment of an inbound distributed storage and/or task (DST) processing in accordance with the present invention.

FIG. 13 is a schematic block diagram of an embodiment of an inbound distributed storage and/or task (DST) processing section 82 of a DST client module coupled to DST execution units of a distributed storage and task network (DSTN) module via a network 24. The inbound DST processing section 82 includes a de-grouping module 180, a DS (dispersed storage) error decoding module 182, a data de-partitioning module 184, a control module 186, and a distributed task control module 188. Note that the control module 186 and/or the distributed task control module 188 may be separate modules from corresponding ones of outbound DST processing section or may be the same modules.

In an example of operation, the DST execution units have completed execution of corresponding partial tasks on the corresponding slice groupings to produce partial results 102. The inbound DST processing section 82 receives the partial results 102 via the distributed task control module 188. The inbound DST processing section 82 then processes the partial results 102 to produce a final result, or results 104. For example, if the task was to find a specific word or phrase within data, the partial results 102 indicate where in each of the prescribed portions of the data the corresponding DST execution units found the specific word or phrase. The distributed task control module 188 combines the individual partial results 102 for the corresponding portions of the data into a final result 104 for the data as a whole.

In another example of operation, the inbound DST processing section 82 is retrieving stored data from the DST execution units (i.e., the DSTN module). In this example, the DST execution units output encoded data slices 100 corresponding to the data retrieval requests. The de-grouping module 180 receives retrieved slices 100 and de-groups them to produce encoded data slices per data partition 122. The DS error decoding module 182 decodes, in accordance with DS error encoding parameters, the encoded data slices per data partition 122 to produce data partitions 120.

The data de-partitioning module 184 combines the data partitions 120 into the data 92. The control module 186 controls the conversion of retrieved slices 100 into the data 92 using control signals 190 to each of the modules. For instance, the control module 186 provides de-grouping information to the de-grouping module 180, provides the DS error encoding parameters to the DS error decoding module 182, and provides de-partitioning information to the data de-partitioning module 184.

Figure 14:
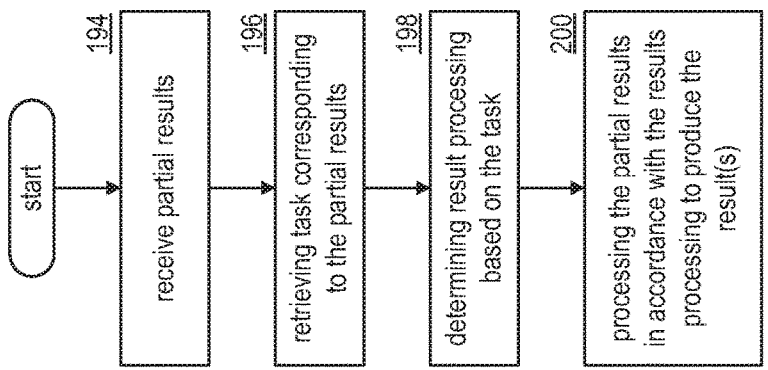
FIG. 14 is a logic diagram of an example of a method for inbound DST processing in accordance with the present invention.

FIG. 14 is a logic diagram of an example of a method that is executable by distributed storage and task (DST) client module regarding inbound DST processing. The method begins at step 194 where the DST client module receives partial results. The method continues at step 196 where the DST client module retrieves the task corresponding to the partial results. For example, the partial results include header information that identifies the requesting entity, which correlates to the requested task.

The method continues at step 198 where the DST client module determines result processing information based on the task. For example, if the task were to identify a particular word or phrase within the data, the result processing information would indicate to aggregate the partial results for the corresponding portions of the data to produce the final result. As another example, if the task were to count the occurrences of a particular word or phrase within the data, results of processing the information would indicate to add the partial results to produce the final results. The method continues at step 200 where the DST client module processes the partial results in accordance with the result processing information to produce the final result or results.

Figure 15:
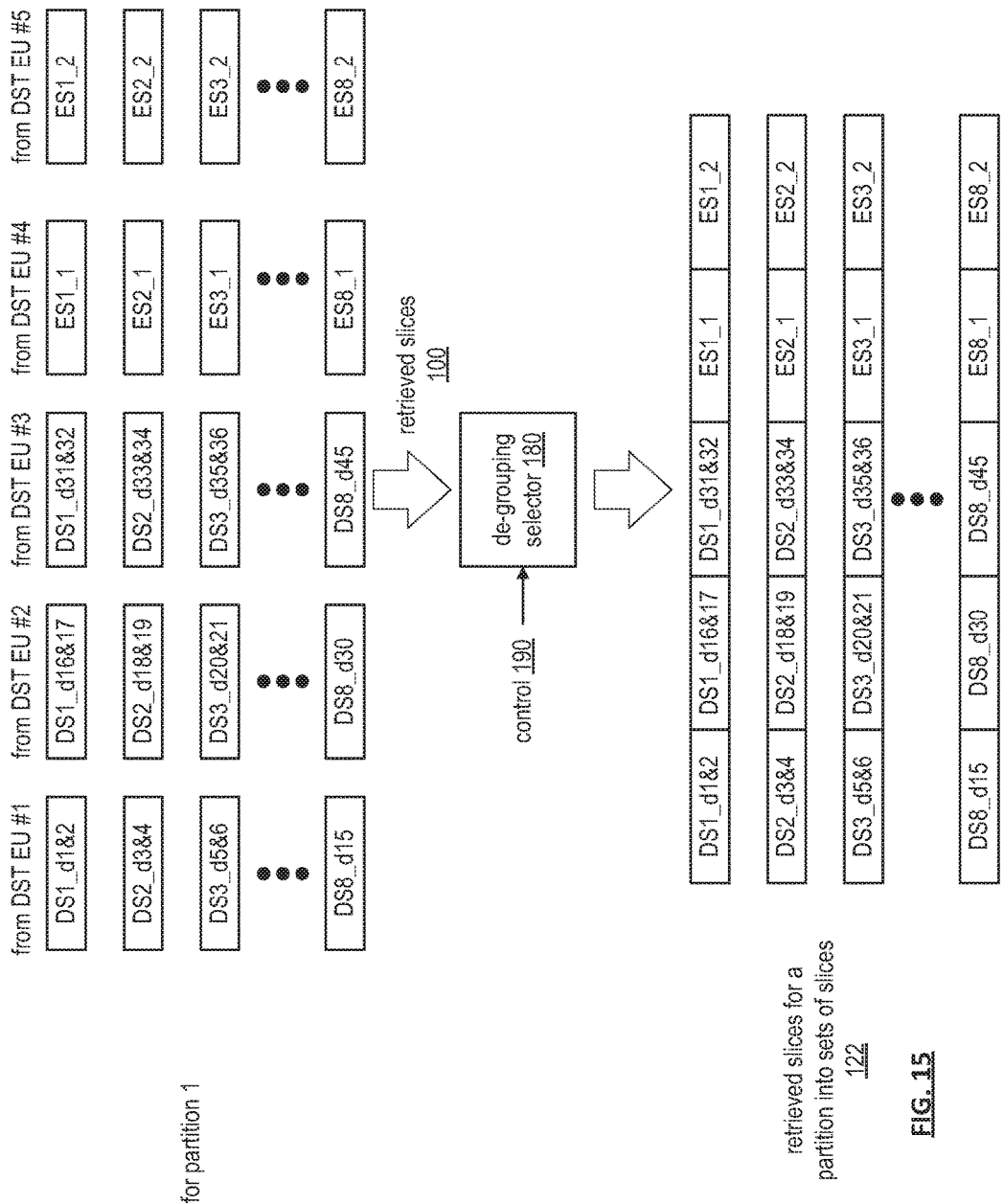
FIG. 15 is a diagram of an example of de-grouping selection processing of the inbound DST processing in accordance with the present invention.

FIG. 15 is a diagram of an example of de-grouping selection processing of an inbound distributed storage and task (DST) processing section of a DST client module. In general, this is an inverse process of the grouping module of the outbound DST processing section of FIG. 9. Accordingly, for each data partition (e.g., partition #1), the de-grouping module retrieves the corresponding slice grouping from the DST execution units (EU) (e.g., DST 1-5).

As shown, DST execution unit #1 provides a first slice grouping, which includes the first encoded slices of each of the sets of encoded slices (e.g., encoded data slices of contiguous data of data blocks 1-15); DST execution unit #2 provides a second slice grouping, which includes the second encoded slices of each of the sets of encoded slices (e.g., encoded data slices of contiguous data of data blocks 16-30); DST execution unit #3 provides a third slice grouping, which includes the third encoded slices of each of the sets of encoded slices (e.g., encoded data slices of contiguous data of data blocks 31-45); DST execution unit #4 provides a fourth slice grouping, which includes the fourth encoded slices of each of the sets of encoded slices (e.g., first encoded data slices of error coding (EC) data); and DST execution unit #5 provides a fifth slice grouping, which includes the fifth encoded slices of each of the sets of encoded slices (e.g., first encoded data slices of error coding (EC) data).

The de-grouping module de-groups the slice groupings (e.g., received slices 100) using a de-grouping selector 180 controlled by a control signal 190 as shown in the example to produce a plurality of sets of encoded data slices (e.g., retrieved slices for a partition into sets of slices 122). Each set corresponding to a data segment of the data partition.

Figure 16:
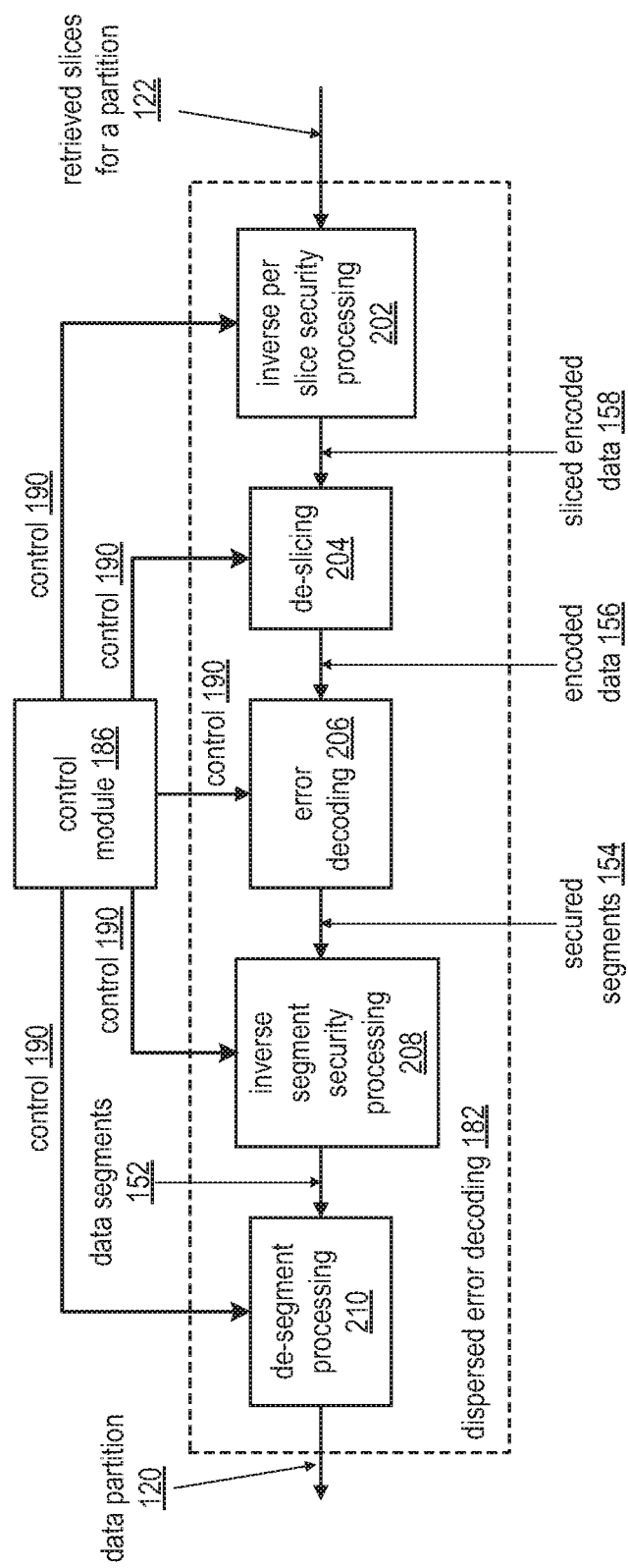
FIG. 16 is a schematic block diagram of an embodiment of a dispersed error decoding in accordance with the present invention.

FIG. 16 is a schematic block diagram of an embodiment of a dispersed storage (DS) error decoding module 182 of an inbound distributed storage and task (DST) processing section. The DS error decoding module 182 includes an inverse per slice security processing module 202, a de-slicing module 204, an error decoding module 206, an inverse segment security module 208, a de-segmenting processing module 210, and a control module 186.

In an example of operation, the inverse per slice security processing module 202, when enabled by the control module 186, unsecures each encoded data slice 122 based on slice de-security information received as control information 190 (e.g., the compliment of the slice security information discussed with reference to FIG. 6) received from the control module 186. The slice security information includes data decompression, decryption, de-watermarking, integrity check (e.g., CRC verification, etc.), and/or any other type of digital security. For example, when the inverse per slice security processing module 202 is enabled, it verifies integrity information (e.g., a CRC value) of each encoded data slice 122, it decrypts each verified encoded data slice, and decompresses each decrypted encoded data slice to produce slice encoded data 158. When the inverse per slice security processing module 202 is not enabled, it passes the encoded data slices 122 as the sliced encoded data 158 or is bypassed such that the retrieved encoded data slices 122 are provided as the sliced encoded data 158.

The de-slicing module 204 de-slices the sliced encoded data 158 into encoded data segments 156 in accordance with a pillar width of the error correction encoding parameters received as control information 190 from the control module 186. For example, if the pillar width is five, the de-slicing module 204 de-slices a set of five encoded data slices into an encoded data segment 156. The error decoding module 206 decodes the encoded data segments 156 in accordance with error correction decoding parameters received as control information 190 from the control module 186 to produce secure data segments 154. The error correction decoding parameters include identifying an error correction encoding scheme (e.g., forward error correction algorithm, a Reed-Solomon based algorithm, an information dispersal algorithm, etc.), a pillar width, a decode threshold, a read threshold, a write threshold, etc. For example, the error correction decoding parameters identify a specific error correction encoding scheme, specify a pillar width of five, and specify a decode threshold of three.

The inverse segment security processing module 208, when enabled by the control module 186, unsecures the secured data segments 154 based on segment security information received as control information 190 from the control module 186. The segment security information includes data decompression, decryption, de-watermarking, integrity check (e.g., CRC, etc.) verification, and/or any other type of digital security. For example, when the inverse segment security processing module 208 is enabled, it verifies integrity information (e.g., a CRC value) of each secure data segment 154, it decrypts each verified secured data segment, and decompresses each decrypted secure data segment to produce a data segment 152. When the inverse segment security processing module 208 is not enabled, it passes the decoded data segment 154 as the data segment 152 or is bypassed.

The de-segment processing module 210 receives the data segments 152 and receives de-segmenting information as control information 190 from the control module 186. The de-segmenting information indicates how the de-segment processing module 210 is to de-segment the data segments 152 into a data partition 120. For example, the de-segmenting information indicates how the rows and columns of data segments are to be rearranged to yield the data partition 120.

Figure 17:
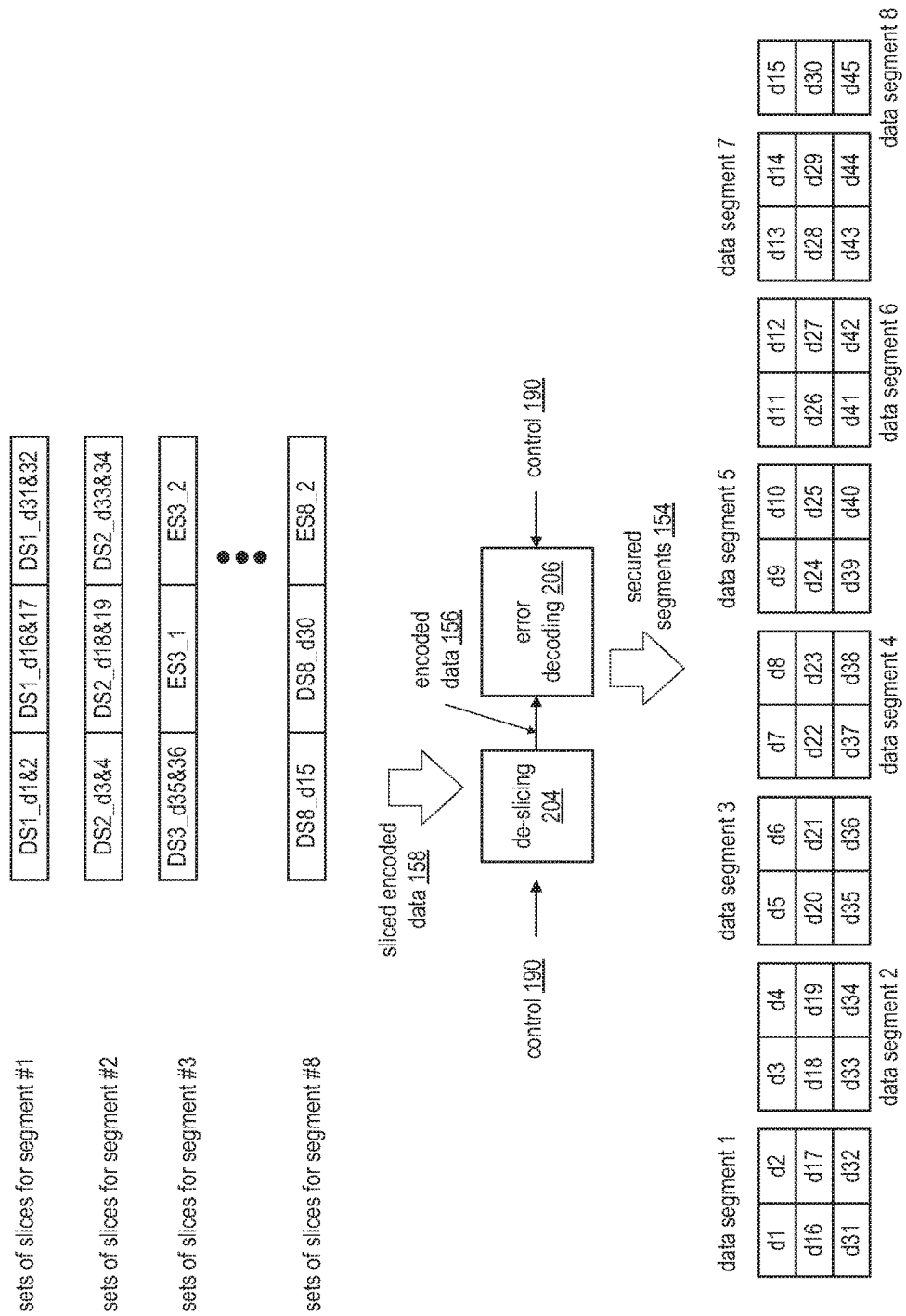
FIG. 17 is a diagram of an example of de-slicing and error decoding processing of the dispersed error decoding in accordance with the present invention.

FIG. 17 is a diagram of an example of de-slicing and error decoding processing of a dispersed error decoding module. A de-slicing module 204 receives at least a decode threshold number of encoded data slices 158 for each data segment in accordance with control information 190 and provides encoded data 156. In this example, a decode threshold is three. As such, each set of encoded data slices 158 is shown to have three encoded data slices per data segment. The de-slicing module 204 may receive three encoded data slices per data segment because an associated distributed storage and task (DST) client module requested retrieving only three encoded data slices per segment or selected three of the retrieved encoded data slices per data segment. As shown, which is based on the unity matrix encoding previously discussed with reference to FIG. 8, an encoded data slice may be a data-based encoded data slice (e.g., DS1_d1&d2) or an error code based encoded data slice (e.g., ES3_1).

An error decoding module 206 decodes the encoded data 156 of each data segment in accordance with the error correction decoding parameters of control information 190 to produce secured segments 154. In this example, data segment 1 includes 3 rows with each row being treated as one word for encoding. As such, data segment 1 includes three words: word 1 including data blocks d1 and d2, word 2 including data blocks d16 and d17, and word 3 including data blocks d31 and d32. Each of data segments 2-7 includes three words where each word includes two data blocks. Data segment 8 includes three words where each word includes a single data block (e.g., d15, d30, and d45).

Figure 18:
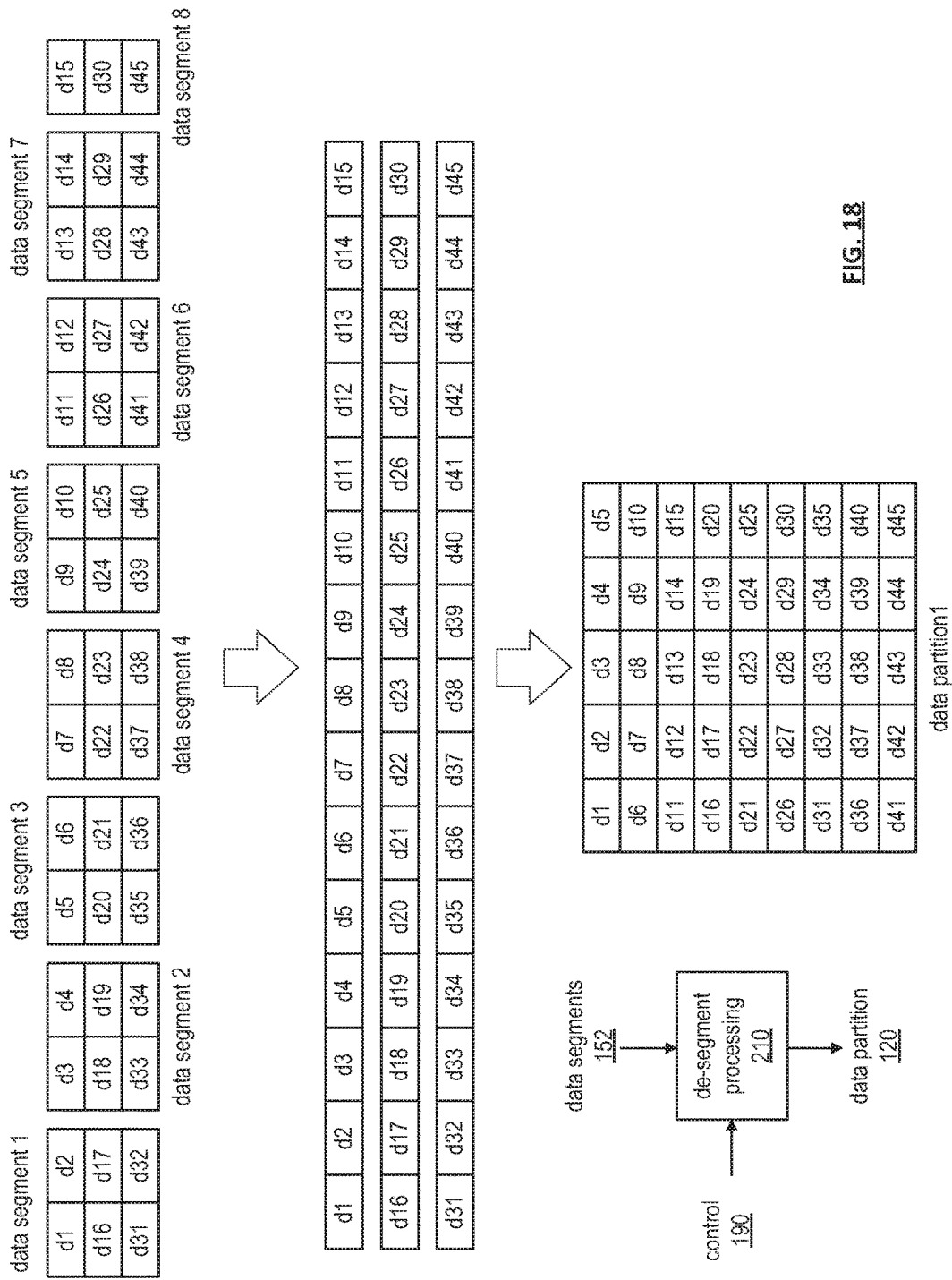
FIG. 18 is a diagram of an example of a de-segment processing of the dispersed error decoding in accordance with the present invention.

FIG. 18 is a diagram of an example of de-segment processing of an inbound distributed storage and task (DST) processing. In this example, a de-segment processing module 210 receives data segments 152 (e.g., 1-8) and rearranges the data blocks of the data segments into rows and columns in accordance with de-segmenting information of control information 190 to produce a data partition 120. Note that the number of rows is based on the decode threshold (e.g., 3 in this specific example) and the number of columns is based on the number and size of the data blocks.

The de-segmenting module 210 converts the rows and columns of data blocks into the data partition 120. Note that each data block may be of the same size as other data blocks or of a different size. In addition, the size of each data block may be a few bytes to megabytes of data.

Figure 19:
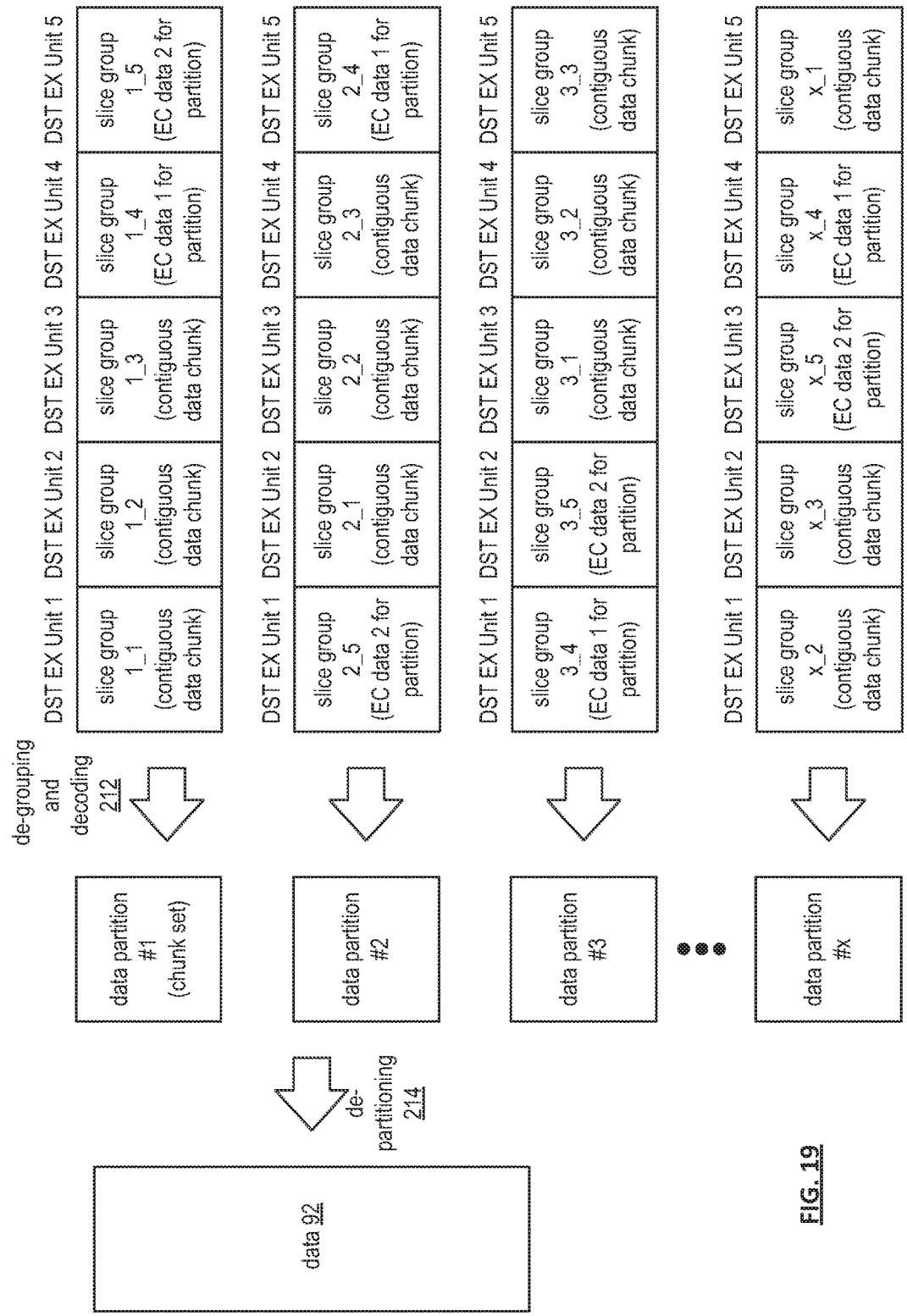
FIG. 19 is a diagram of an example of converting slice groups into data in accordance with the present invention.

FIG. 19 is a diagram of an example of converting slice groups into data 92 within an inbound distributed storage and task (DST) processing section. As shown, the data 92 is reconstructed from a plurality of data partitions (1-x, where x is an integer greater than 4). Each data partition (or chunk set of data) is decoded and re-grouped using a de-grouping and decoding function 212 and a de-partition function 214 from slice groupings as previously discussed. For a given data partition, the slice groupings (e.g., at least a decode threshold per data segment of encoded data slices) are received from DST execution units. From data partition to data partition, the ordering of the slice groupings received from the DST execution units may vary as discussed with reference to FIG. 10.

Figure 20:
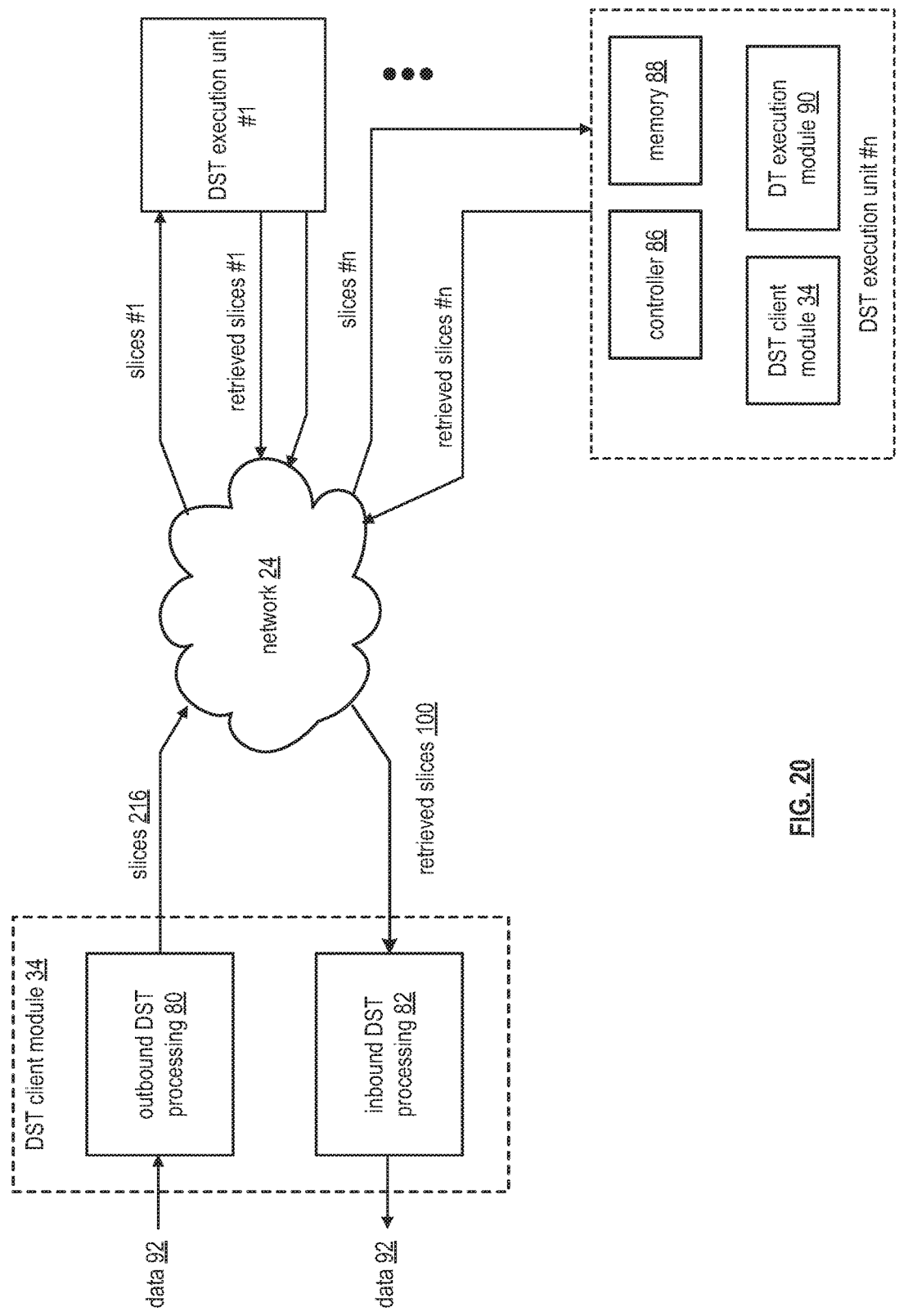
FIG. 20 is a diagram of an example of a distributed storage within the distributed computing system in accordance with the present invention.

FIG. 20 is a diagram of an example of a distributed storage and/or retrieval within the distributed computing system. The distributed computing system includes a plurality of distributed storage and/or task (DST) processing client modules 34 (one shown) coupled to a distributed storage and/or task processing network (DSTN) module, or multiple DSTN modules, via a network 24. The DST client module 34 includes an outbound DST processing section 80 and an inbound DST processing section 82. The DSTN module includes a plurality of DST execution units. Each DST execution unit includes a controller 86, memory 88, one or more distributed task (DT) execution modules 90, and a DST client module 34.

In an example of data storage, the DST client module 34 has data 92 that it desires to store in the DSTN module. The data 92 may be a file (e.g., video, audio, text, graphics, etc.), a data object, a data block, an update to a file, an update to a data block, etc. In this instance, the outbound DST processing module 80 converts the data 92 into encoded data slices 216 as will be further described with reference to FIGS. 21-23. The outbound DST processing module 80 sends, via the network 24, to the DST execution units for storage as further described with reference to FIG. 24.

In an example of data retrieval, the DST client module 34 issues a retrieve request to the DST execution units for the desired data 92. The retrieve request may address each DST executions units storing encoded data slices of the desired data, address a decode threshold number of DST execution units, address a read threshold number of DST execution units, or address some other number of DST execution units. In response to the request, each addressed DST execution unit retrieves its encoded data slices 100 of the desired data and sends them to the inbound DST processing section 82, via the network 24.

When, for each data segment, the inbound DST processing section 82 receives at least a decode threshold number of encoded data slices 100, it converts the encoded data slices 100 into a data segment. The inbound DST processing section 82 aggregates the data segments to produce the retrieved data 92.

Figure 21:
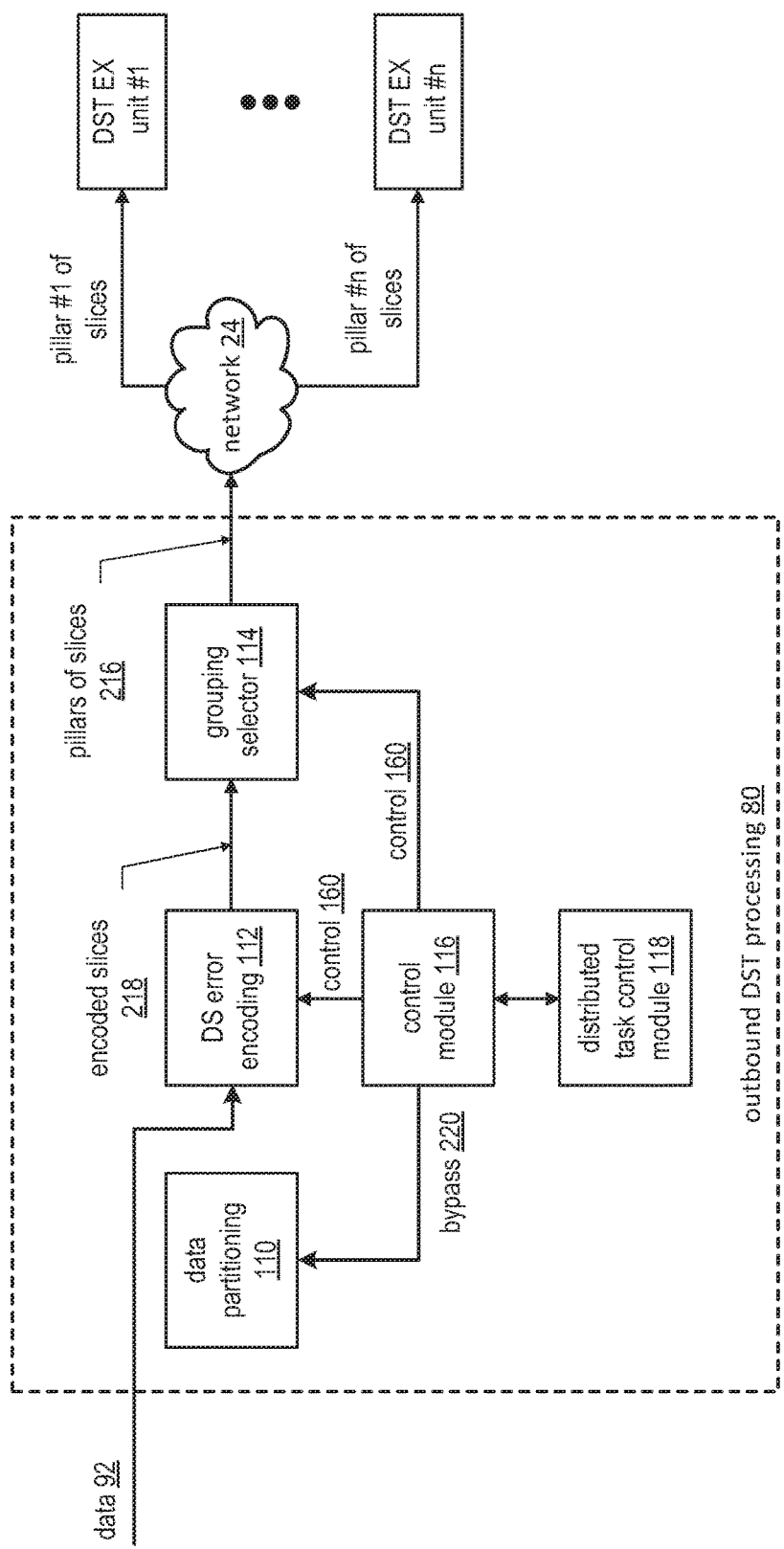
FIG. 21 is a schematic block diagram of an example of operation of outbound distributed storage and/or task (DST) processing for storing data in accordance with the present invention.

FIG. 21 is a schematic block diagram of an embodiment of an outbound distributed storage and/or task (DST) processing section 80 of a DST client module coupled to a distributed storage and task network (DSTN) module (e.g., a plurality of DST execution units) via a network 24. The outbound DST processing section 80 includes a data partitioning module 110, a dispersed storage (DS) error encoding module 112, a grouping selector module 114, a control module 116, and a distributed task control module 118.

In an example of operation, the data partitioning module 110 is by-passed such that data 92 is provided directly to the DS error encoding module 112. The control module 116 coordinates the by-passing of the data partitioning module 110 by outputting a bypass 220 message to the data partitioning module 110.

The DS error encoding module 112 receives the data 92 in a serial manner, a parallel manner, and/or a combination thereof. The DS error encoding module 112 DS error encodes the data in accordance with control information 160 from the control module 116 to produce encoded data slices 218. The DS error encoding includes segmenting the data 92 into data segments, segment security processing (e.g., encryption, compression, watermarking, integrity check (e.g., CRC, etc.)), error encoding, slicing, and/or per slice security processing (e.g., encryption, compression, watermarking, integrity check (e.g., CRC, etc.)). The control information 160 indicates which steps of the DS error encoding are active for the data 92 and, for active steps, indicates the parameters for the step. For example, the control information 160 indicates that the error encoding is active and includes error encoding parameters (e.g., pillar width, decode threshold, write threshold, read threshold, type of error encoding, etc.).

The grouping selector module 114 groups the encoded slices 218 of the data segments into pillars of slices 216. The number of pillars corresponds to the pillar width of the DS error encoding parameters. In this example, the distributed task control module 118 facilitates the storage request.

Figure 22:
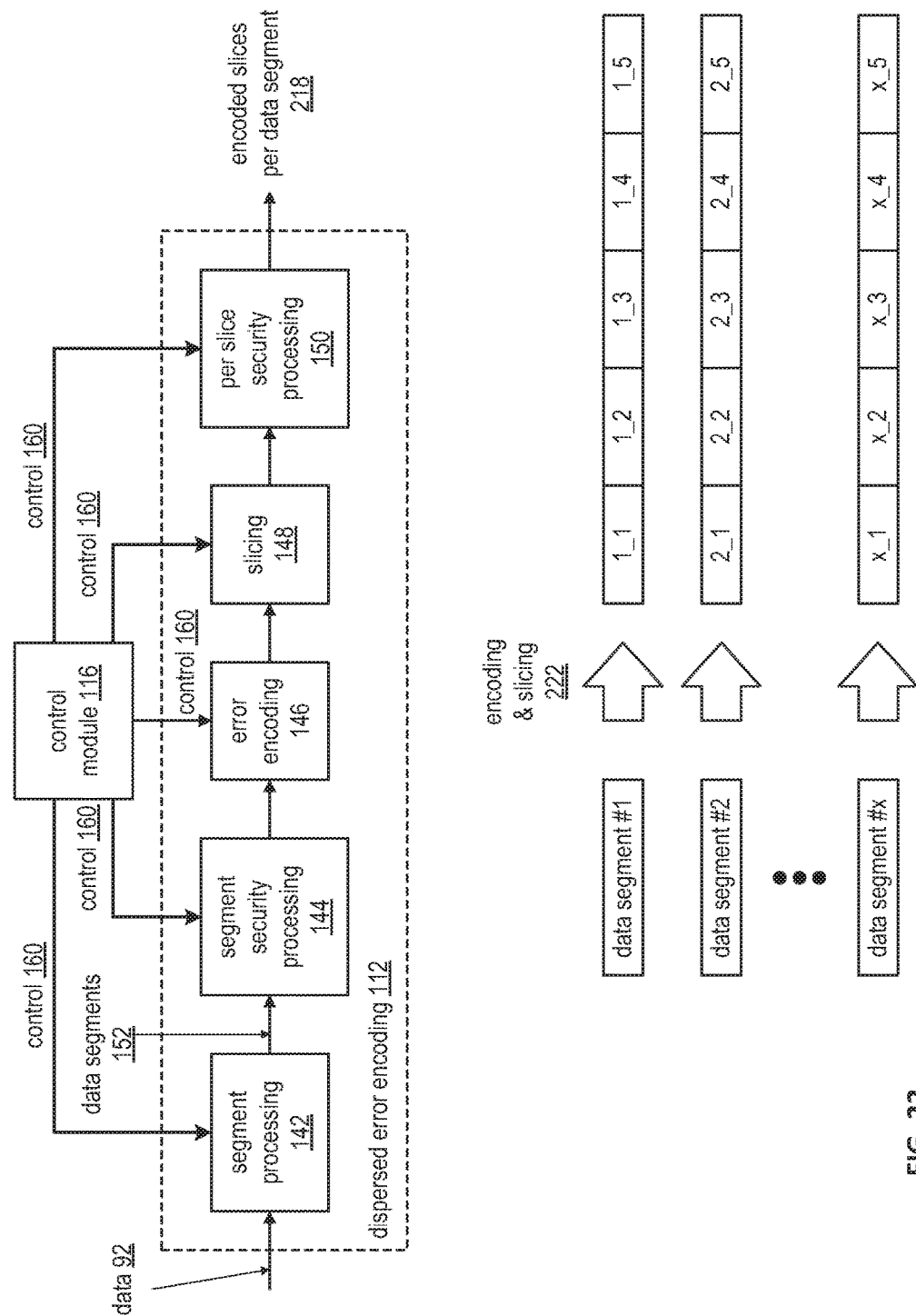
FIG. 22 is a schematic block diagram of an example of a dispersed error encoding for the example of FIG. 21 in accordance with the present invention.

FIG. 22 is a schematic block diagram of an example of a dispersed storage (DS) error encoding module 112 for the example of FIG. 21. The DS error encoding module 112 includes a segment processing module 142, a segment security processing module 144, an error encoding module 146, a slicing module 148, and a per slice security processing module 150. Each of these modules is coupled to a control module 116 to receive control information 160 therefrom.

In an example of operation, the segment processing module 142 receives data 92 and receives segmenting information as control information 160 from the control module 116. The segmenting information indicates how the segment processing module is to segment the data. For example, the segmenting information indicates the size of each data segment. The segment processing module 142 segments the data 92 into data segments 152 in accordance with the segmenting information.

The segment security processing module 144, when enabled by the control module 116, secures the data segments 152 based on segment security information received as control information 160 from the control module 116. The segment security information includes data compression, encryption, watermarking, integrity check (e.g., CRC, etc.), and/or any other type of digital security. For example, when the segment security processing module 144 is enabled, it compresses a data segment 152, encrypts the compressed data segment, and generates a CRC value for the encrypted data segment to produce a secure data segment. When the segment security processing module 144 is not enabled, it passes the data segments 152 to the error encoding module 146 or is bypassed such that the data segments 152 are provided to the error encoding module 146.

The error encoding module 146 encodes the secure data segments in accordance with error correction encoding parameters received as control information 160 from the control module 116. The error correction encoding parameters include identifying an error correction encoding scheme (e.g., forward error correction algorithm, a Reed-Solomon based algorithm, an information dispersal algorithm, etc.), a pillar width, a decode threshold, a read threshold, a write threshold, etc. For example, the error correction encoding parameters identify a specific error correction encoding scheme, specifies a pillar width of five, and specifies a decode threshold of three. From these parameters, the error encoding module 146 encodes a data segment to produce an encoded data segment.

The slicing module 148 slices the encoded data segment in accordance with a pillar width of the error correction encoding parameters. For example, if the pillar width is five, the slicing module slices an encoded data segment into a set of five encoded data slices. As such, for a plurality of data segments, the slicing module 148 outputs a plurality of sets of encoded data slices as shown within encoding and slicing function 222 as described.

The per slice security processing module 150, when enabled by the control module 116, secures each encoded data slice based on slice security information received as control information 160 from the control module 116. The slice security information includes data compression, encryption, watermarking, integrity check (e.g., CRC, etc.), and/or any other type of digital security. For example, when the per slice security processing module 150 is enabled, it may compress an encoded data slice, encrypt the compressed encoded data slice, and generate a CRC value for the encrypted encoded data slice to produce a secure encoded data slice tweaking. When the per slice security processing module 150 is not enabled, it passes the encoded data slices or is bypassed such that the encoded data slices 218 are the output of the DS error encoding module 112.

Figure 23:
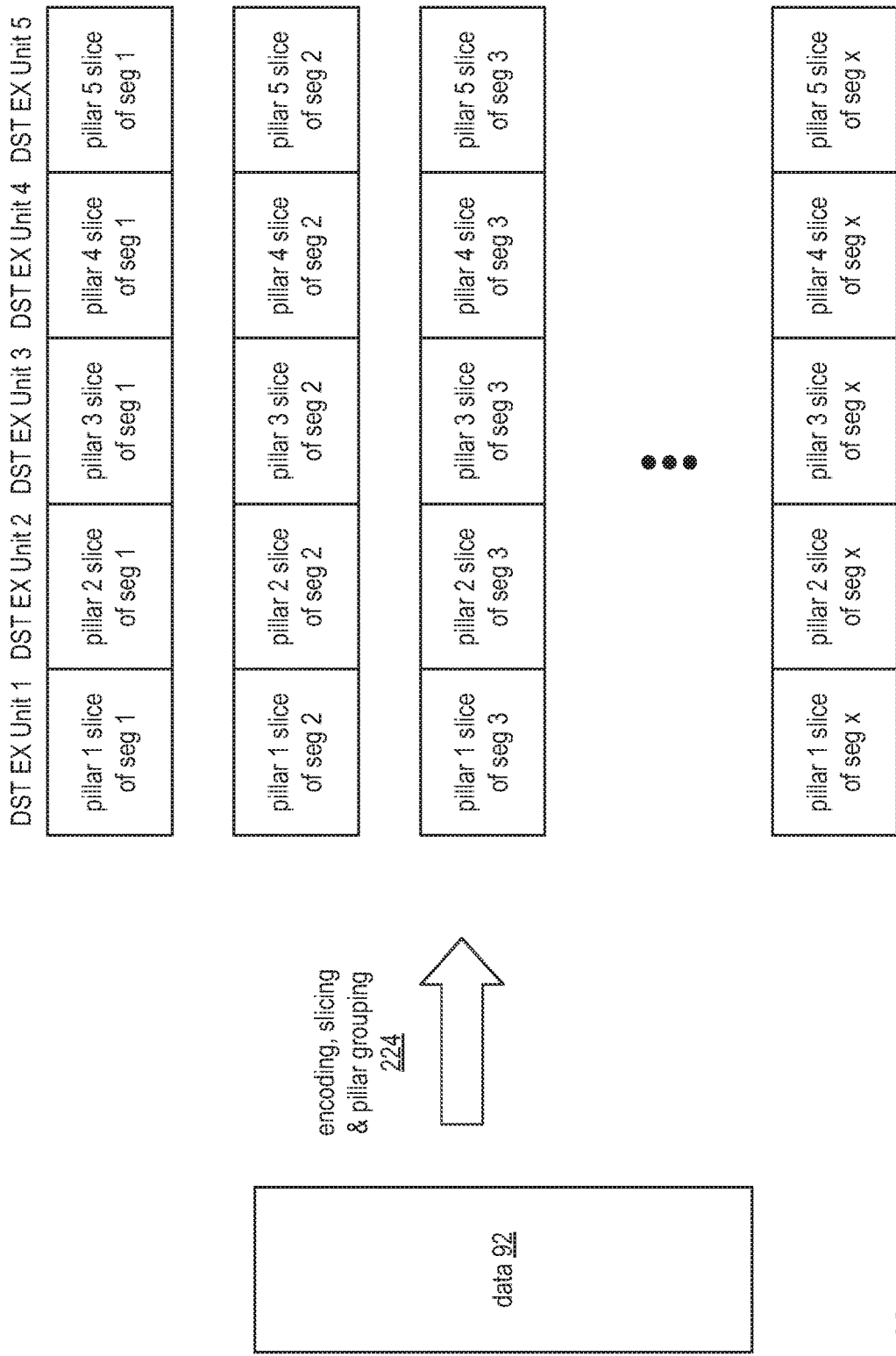
FIG. 23 is a diagram of an example of converting data into pillar slice groups for storage in accordance with the present invention.

FIG. 23 is a diagram of an example of converting data 92 into pillar slice groups utilizing encoding, slicing and pillar grouping function 224 for storage in memory of a distributed storage and task network (DSTN) module. As previously discussed the data 92 is encoded and sliced into a plurality of sets of encoded data slices; one set per data segment. The grouping selector module organizes the sets of encoded data slices into pillars of data slices. In this example, the DS error encoding parameters include a pillar width of 5 and a decode threshold of 3. As such, for each data segment, 5 encoded data slices are created.

The grouping selector module takes the first encoded data slice of each of the sets and forms a first pillar, which may be sent to the first DST execution unit. Similarly, the grouping selector module creates the second pillar from the second slices of the sets; the third pillar from the third slices of the sets; the fourth pillar from the fourth slices of the sets; and the fifth pillar from the fifth slices of the set.

Figure 24:
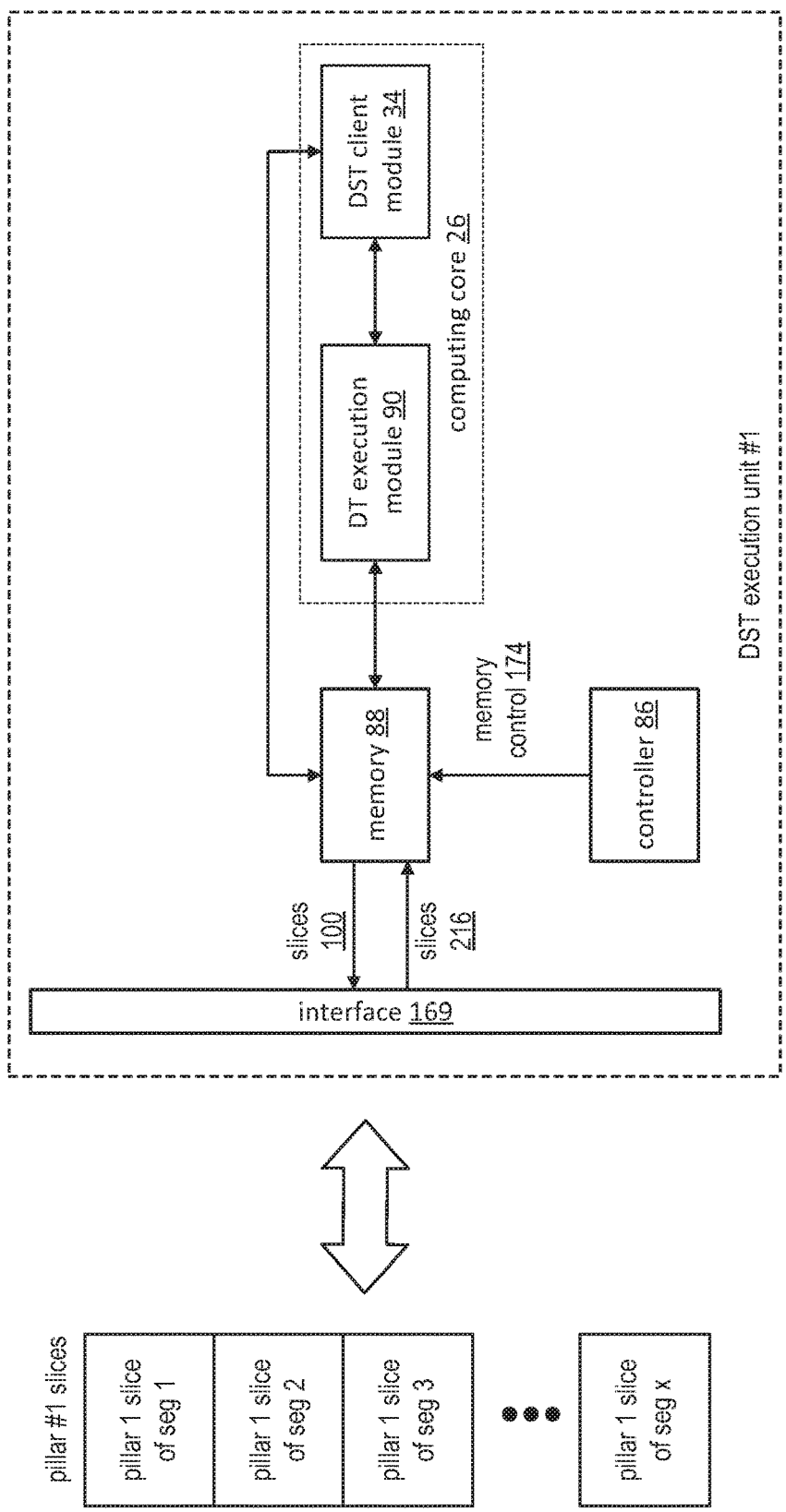
FIG. 24 is a schematic block diagram of an example of a storage operation of a DST execution unit in accordance with the present invention.

FIG. 24 is a schematic block diagram of an embodiment of a distributed storage and/or task (DST) execution unit that includes an interface 169, a controller 86, memory 88, one or more distributed task (DT) execution modules 90, and a DST client module 34. A computing core 26 may be utilized to implement the one or more DT execution modules 90 and the DST client module 34. The memory 88 is of sufficient size to store a significant number of encoded data slices (e.g., thousands of slices to hundreds-of-millions of slices) and may include one or more hard drives and/or one or more solid-state memory devices (e.g., flash memory, DRAM, etc.).

In an example of storing a pillar of slices 216, the DST execution unit receives, via interface 169, a pillar of slices 216 (e.g., pillar #1 slices). The memory 88 stores the encoded data slices 216 of the pillar of slices in accordance with memory control information 174 it receives from the controller 86. The controller 86 (e.g., a processing module, a CPU, etc.) generates the memory control information 174 based on distributed storage information (e.g., user information (e.g., user ID, distributed storage permissions, data access permission, etc.), vault information (e.g., virtual memory assigned to user, user group, etc.), etc.). Similarly, when retrieving slices, the DST execution unit receives, via interface 169, a slice retrieval request. The memory 88 retrieves the slice in accordance with memory control information 174 it receives from the controller 86. The memory 88 outputs the slice 100, via the interface 169, to a requesting entity.

Figure 25:
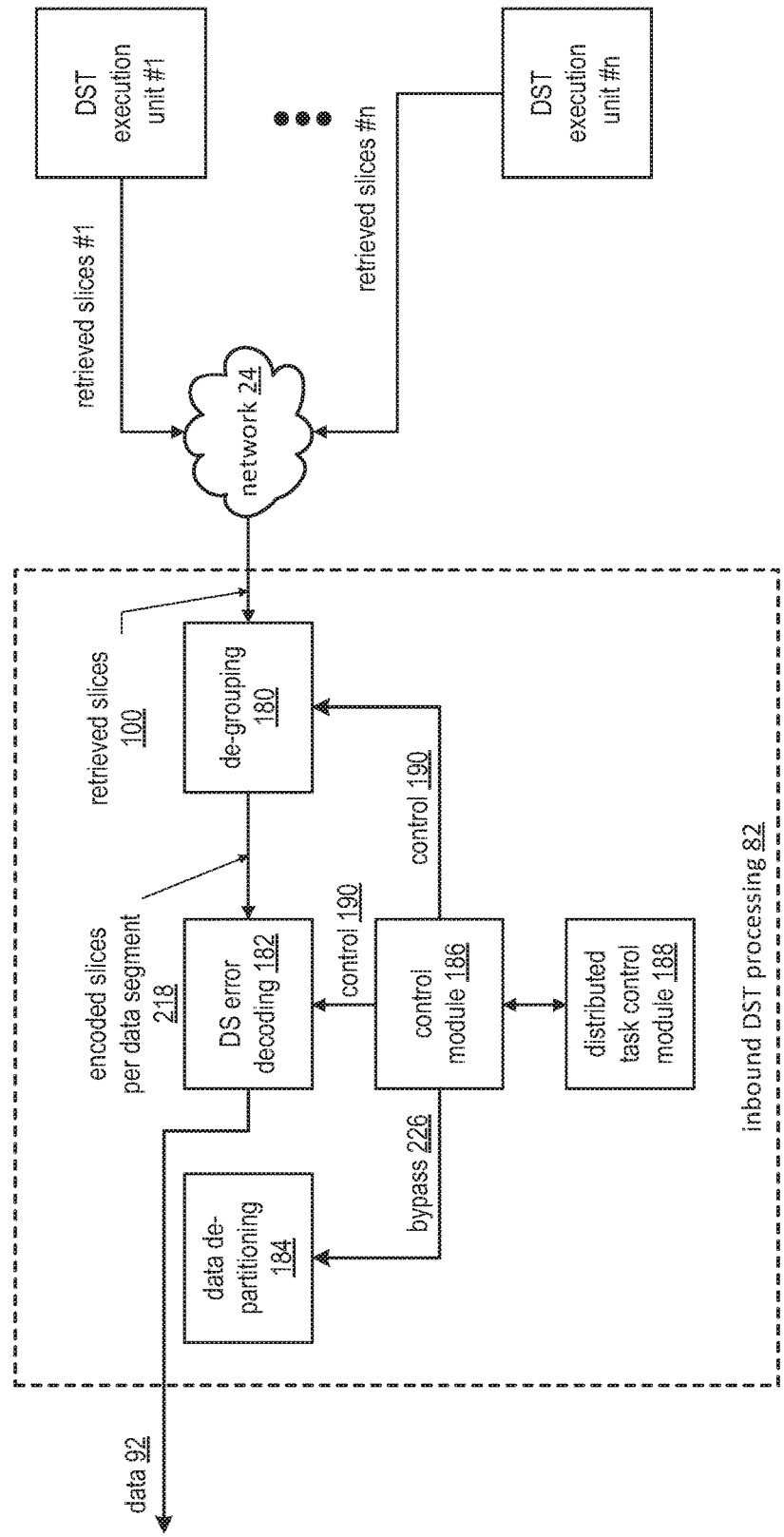
FIG. 25 is a schematic block diagram of an example of operation of inbound distributed storage and/or task (DST) processing for retrieving dispersed error encoded data in accordance with the present invention.

FIG. 25 is a schematic block diagram of an example of operation of an inbound distributed storage and/or task (DST) processing section 82 for retrieving dispersed error encoded data 92. The inbound DST processing section 82 includes a de-grouping module 180, a dispersed storage (DS) error decoding module 182, a data de-partitioning module 184, a control module 186, and a distributed task control module 188. Note that the control module 186 and/or the distributed task control module 188 may be separate modules from corresponding ones of an outbound DST processing section or may be the same modules.

In an example of operation, the inbound DST processing section 82 is retrieving stored data 92 from the DST execution units (i.e., the DSTN module). In this example, the DST execution units output encoded data slices corresponding to data retrieval requests from the distributed task control module 188. The de-grouping module 180 receives pillars of slices 100 and de-groups them in accordance with control information 190 from the control module 186 to produce sets of encoded data slices 218. The DS error decoding module 182 decodes, in accordance with the DS error encoding parameters received as control information 190 from the control module 186, each set of encoded data slices 218 to produce data segments, which are aggregated into retrieved data 92. The data de-partitioning module 184 is by-passed in this operational mode via a bypass signal 226 of control information 190 from the control module 186.

Figure 26:
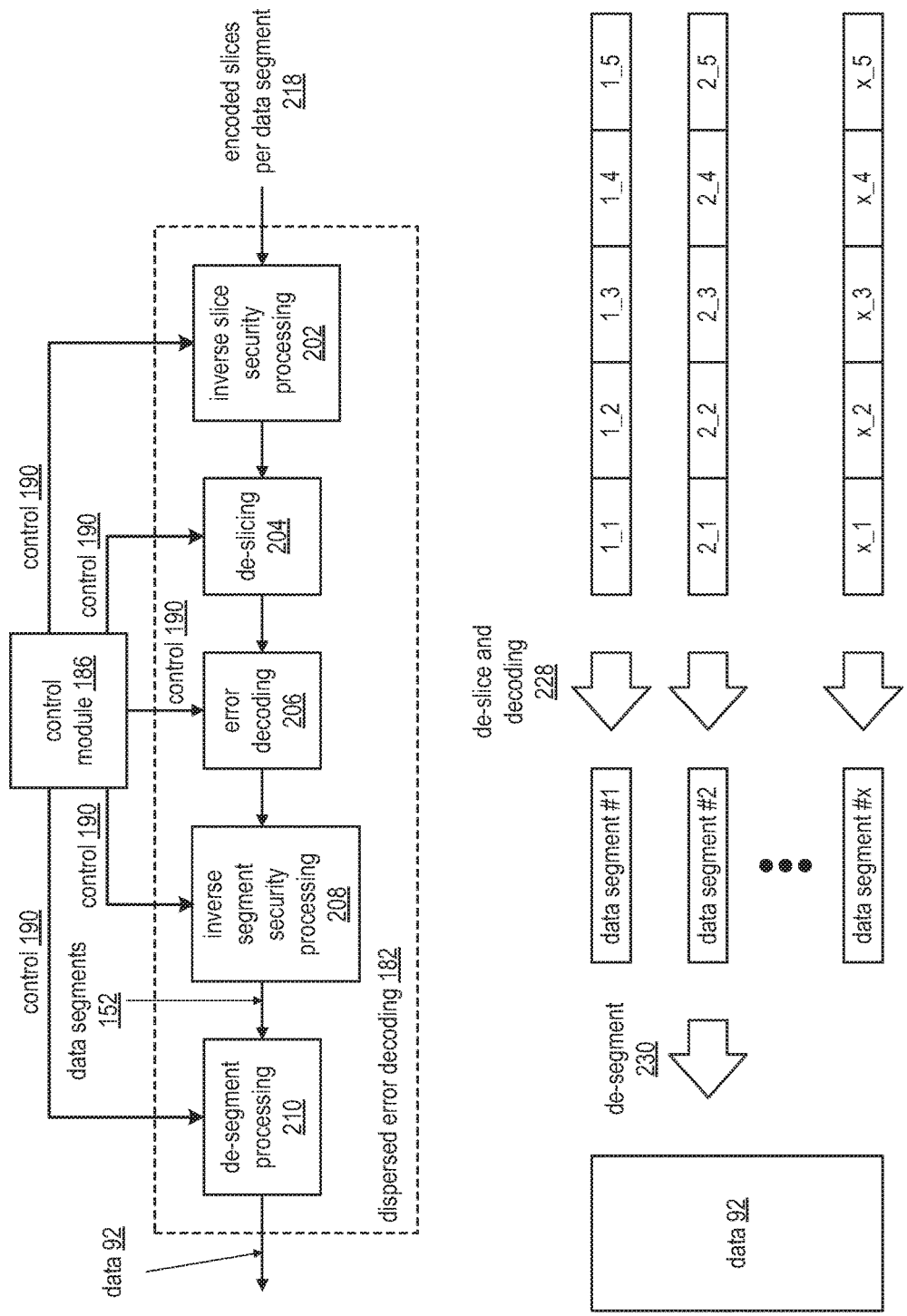
FIG. 26 is a schematic block diagram of an example of a dispersed error decoding for the example of FIG. 25 in accordance with the present invention.

FIG. 26 is a schematic block diagram of an embodiment of a dispersed storage (DS) error decoding module 182 of an inbound distributed storage and task (DST) processing section. The DS error decoding module 182 includes an inverse per slice security processing module 202, a de-slicing module 204, an error decoding module 206, an inverse segment security module 208, and a de-segmenting processing module 210. The dispersed error decoding module 182 is operable to de-slice and decode encoded slices per data segment 218 utilizing a de-slicing and decoding function 228 to produce a plurality of data segments that are de-segmented utilizing a de-segment function 230 to recover data 92.

In an example of operation, the inverse per slice security processing module 202, when enabled by the control module 186 via control information 190, unsecures each encoded data slice 218 based on slice de-security information (e.g., the compliment of the slice security information discussed with reference to FIG. 6) received as control information 190 from the control module 186. The slice de-security information includes data decompression, decryption, de-watermarking, integrity check (e.g., CRC verification, etc.), and/or any other type of digital security. For example, when the inverse per slice security processing module 202 is enabled, it verifies integrity information (e.g., a CRC value) of each encoded data slice 218, it decrypts each verified encoded data slice, and decompresses each decrypted encoded data slice to produce slice encoded data. When the inverse per slice security processing module 202 is not enabled, it passes the encoded data slices 218 as the sliced encoded data or is bypassed such that the retrieved encoded data slices 218 are provided as the sliced encoded data.

The de-slicing module 204 de-slices the sliced encoded data into encoded data segments in accordance with a pillar width of the error correction encoding parameters received as control information 190 from a control module 186. For example, if the pillar width is five, the de-slicing module de-slices a set of five encoded data slices into an encoded data segment. Alternatively, the encoded data segment may include just three encoded data slices (e.g., when the decode threshold is 3).

The error decoding module 206 decodes the encoded data segments in accordance with error correction decoding parameters received as control information 190 from the control module 186 to produce secure data segments. The error correction decoding parameters include identifying an error correction encoding scheme (e.g., forward error correction algorithm, a Reed-Solomon based algorithm, an information dispersal algorithm, etc.), a pillar width, a decode threshold, a read threshold, a write threshold, etc. For example, the error correction decoding parameters identify a specific error correction encoding scheme, specify a pillar width of five, and specify a decode threshold of three.

The inverse segment security processing module 208, when enabled by the control module 186, unsecures the secured data segments based on segment security information received as control information 190 from the control module 186. The segment security information includes data decompression, decryption, de-watermarking, integrity check (e.g., CRC, etc.) verification, and/or any other type of digital security. For example, when the inverse segment security processing module is enabled, it verifies integrity information (e.g., a CRC value) of each secure data segment, it decrypts each verified secured data segment, and decompresses each decrypted secure data segment to produce a data segment 152. When the inverse segment security processing module 208 is not enabled, it passes the decoded data segment 152 as the data segment or is bypassed. The de-segmenting processing module 210 aggregates the data segments 152 into the data 92 in accordance with control information 190 from the control module 186.

Figure 27:
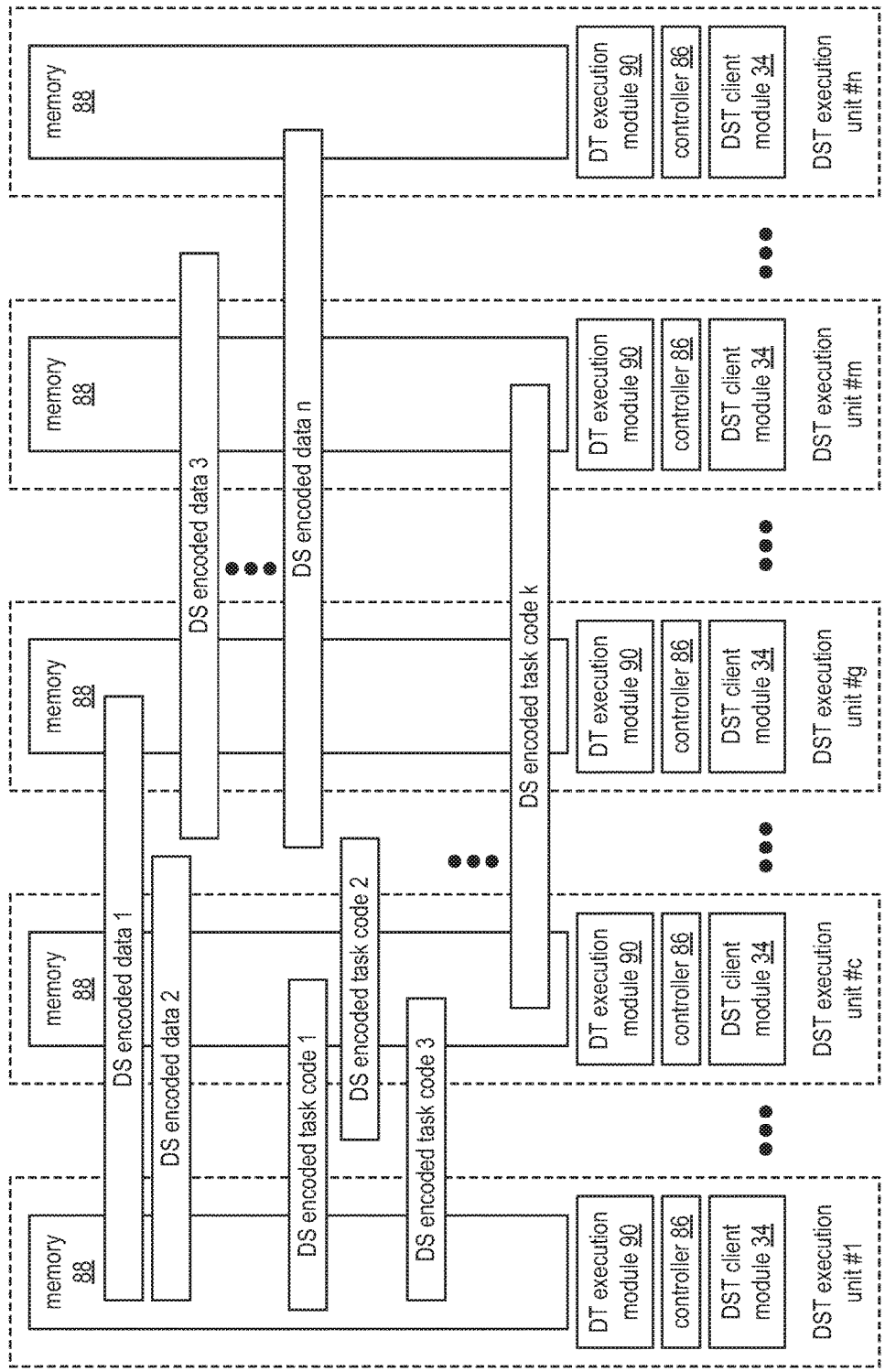
FIG. 27 is a schematic block diagram of an example of a distributed storage and task processing network (DSTN) module storing a plurality of data and a plurality of task codes in accordance with the present invention.

FIG. 27 is a schematic block diagram of an example of a distributed storage and task processing network (DSTN) module that includes a plurality of distributed storage and task (DST) execution units (#1 through #n, where, for example, n is an integer greater than or equal to three). Each of the DST execution units includes a DST client module 34, a controller 86, one or more DT (distributed task) execution modules 90, and memory 88.

In this example, the DSTN module stores, in the memory of the DST execution units, a plurality of DS (dispersed storage) encoded data (e.g., 1 through n, where n is an integer greater than or equal to two) and stores a plurality of DS encoded task codes (e.g., 1 through k, where k is an integer greater than or equal to two). The DS encoded data may be encoded in accordance with one or more examples described with reference to FIGS. 3-19 (e.g., organized in slice groupings) or encoded in accordance with one or more examples described with reference to FIGS. 20-26 (e.g., organized in pillar groups). The data that is encoded into the DS encoded data may be of any size and/or of any content. For example, the data may be one or more digital books, a copy of a company's emails, a large-scale Internet search, a video security file, one or more entertainment video files (e.g., television programs, movies, etc.), data files, and/or any other large amount of data (e.g., greater than a few Terabytes).

The tasks that are encoded into the DS encoded task code may be a simple function (e.g., a mathematical function, a logic function, an identify function, a find function, a search engine function, a replace function, etc.), a complex function (e.g., compression, human and/or computer language translation, text-to-voice conversion, voice-to-text conversion, etc.), multiple simple and/or complex functions, one or more algorithms, one or more applications, etc. The tasks may be encoded into the DS encoded task code in accordance with one or more examples described with reference to FIGS. 3-19 (e.g., organized in slice groupings) or encoded in accordance with one or more examples described with reference to FIGS. 20-26 (e.g., organized in pillar groups).

In an example of operation, a DST client module of a user device or of a DST processing unit issues a DST request to the DSTN module. The DST request may include a request to retrieve stored data, or a portion thereof, may include a request to store data that is included with the DST request, may include a request to perform one or more tasks on stored data, may include a request to perform one or more tasks on data included with the DST request, etc. In the cases where the DST request includes a request to store data or to retrieve data, the client module and/or the DSTN module processes the request as previously discussed with reference to one or more of FIGS. 3-19 (e.g., slice groupings) and/or 20-26 (e.g., pillar groupings). In the case where the DST request includes a request to perform one or more tasks on data included with the DST request, the DST client module and/or the DSTN module process the DST request as previously discussed with reference to one or more of FIGS. 3-19.

In the case where the DST request includes a request to perform one or more tasks on stored data, the DST client module and/or the DSTN module processes the DST request as will be described with reference to one or more of FIGS. 28-39. In general, the DST client module identifies data and one or more tasks for the DSTN module to execute upon the identified data. The DST request may be for a one-time execution of the task or for an on-going execution of the task. As an example of the latter, as a company generates daily emails, the DST request may be to daily search new emails for inappropriate content and, if found, record the content, the email sender(s), the email recipient(s), email routing information, notify human resources of the identified email, etc.

Figure 28:
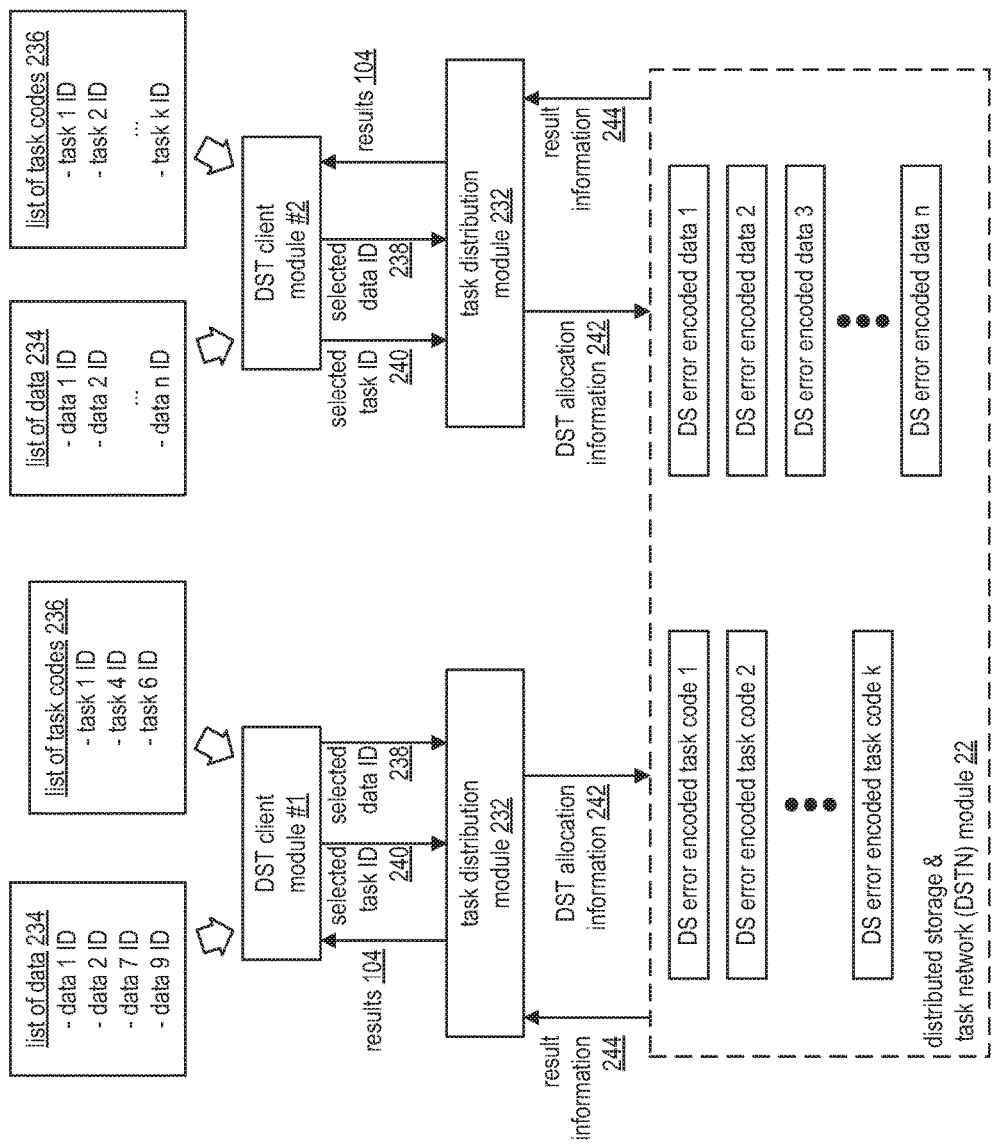
FIG. 28 is a schematic block diagram of an example of the distributed computing system performing tasks on stored data in accordance with the present invention.

FIG. 28 is a schematic block diagram of an example of a distributed computing system performing tasks on stored data. In this example, two distributed storage and task (DST) client modules 1-2 are shown: the first may be associated with a user device and the second may be associated with a DST processing unit or a high priority user device (e.g., high priority clearance user, system administrator, etc.). Each DST client module includes a list of stored data 234 and a list of tasks codes 236. The list of stored data 234 includes one or more entries of data identifying information, where each entry identifies data stored in the DSTN module 22. The data identifying information (e.g., data ID) includes one or more of a data file name, a data file directory listing, DSTN addressing information of the data, a data object identifier, etc. The list of tasks 236 includes one or more entries of task code identifying information, when each entry identifies task codes stored in the DSTN module 22. The task code identifying information (e.g., task ID) includes one or more of a task file name, a task file directory listing, DSTN addressing information of the task, another type of identifier to identify the task, etc.

As shown, the list of data 234 and the list of tasks 236 are each smaller in number of entries for the first DST client module than the corresponding lists of the second DST client module. This may occur because the user device associated with the first DST client module has fewer privileges in the distributed computing system than the device associated with the second DST client module. Alternatively, this may occur because the user device associated with the first DST client module serves fewer users than the device associated with the second DST client module and is restricted by the distributed computing system accordingly. As yet another alternative, this may occur through no restraints by the distributed computing system, it just occurred because the operator of the user device associated with the first DST client module has selected fewer data and/or fewer tasks than the operator of the device associated with the second DST client module.

In an example of operation, the first DST client module selects one or more data entries 238 and one or more tasks 240 from its respective lists (e.g., selected data ID and selected task ID). The first DST client module sends its selections to a task distribution module 232. The task distribution module 232 may be within a stand-alone device of the distributed computing system, may be within the user device that contains the first DST client module, or may be within the DSTN module 22.

Regardless of the task distribution module's location, it generates DST allocation information 242 from the selected task ID 240 and the selected data ID 238. The DST allocation information 242 includes data partitioning information, task execution information, and/or intermediate result information. The task distribution module 232 sends the DST allocation information 242 to the DSTN module 22. Note that one or more examples of the DST allocation information will be discussed with reference to one or more of FIGS. 29-39.

The DSTN module 22 interprets the DST allocation information 242 to identify the stored DS encoded data (e.g., DS error encoded data 2) and to identify the stored DS error encoded task code (e.g., DS error encoded task code 1). In addition, the DSTN module 22 interprets the DST allocation information 242 to determine how the data is to be partitioned and how the task is to be partitioned. The DSTN module 22 also determines whether the selected DS error encoded data 238 needs to be converted from pillar grouping to slice grouping. If so, the DSTN module 22 converts the selected DS error encoded data into slice groupings and stores the slice grouping DS error encoded data by overwriting the pillar grouping DS error encoded data or by storing it in a different location in the memory of the DSTN module 22 (i.e., does not overwrite the pillar grouping DS encoded data).

The DSTN module 22 partitions the data and the task as indicated in the DST allocation information 242 and sends the portions to selected DST execution units of the DSTN module 22. Each of the selected DST execution units performs its partial task(s) on its slice groupings to produce partial results. The DSTN module 22 collects the partial results from the selected DST execution units and provides them, as result information 244, to the task distribution module. The result information 244 may be the collected partial results, one or more final results as produced by the DSTN module 22 from processing the partial results in accordance with the DST allocation information 242, or one or more intermediate results as produced by the DSTN module 22 from processing the partial results in accordance with the DST allocation information 242.

The task distribution module 232 receives the result information 244 and provides one or more final results 104 therefrom to the first DST client module. The final result(s) 104 may be result information 244 or a result(s) of the task distribution module's processing of the result information 244.

In concurrence with processing the selected task of the first DST client module, the distributed computing system may process the selected task(s) of the second DST client module on the selected data(s) of the second DST client module. Alternatively, the distributed computing system may process the second DST client module's request subsequent to, or preceding, that of the first DST client module. Regardless of the ordering and/or parallel processing of the DST client module requests, the second DST client module provides its selected data 238 and selected task 240 to a task distribution module 232. If the task distribution module 232 is a separate device of the distributed computing system or within the DSTN module, the task distribution modules 232 coupled to the first and second DST client modules may be the same module. The task distribution module 232 processes the request of the second DST client module in a similar manner as it processed the request of the first DST client module.

Figure 29:
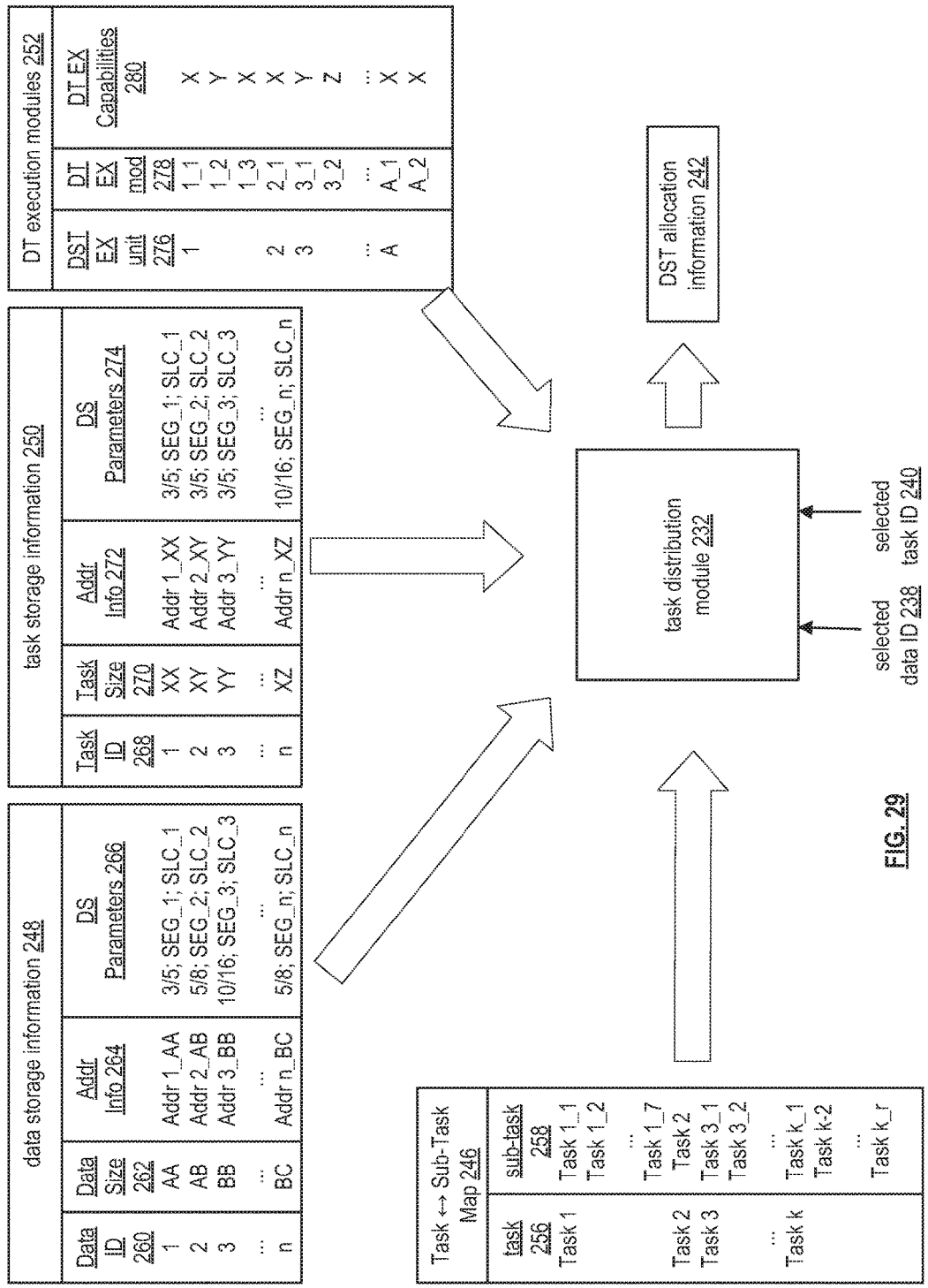
FIG. 29 is a schematic block diagram of an embodiment of a task distribution module facilitating the example of FIG. 28 in accordance with the present invention.

FIG. 29 is a schematic block diagram of an embodiment of a task distribution module 232 facilitating the example of FIG. 28. The task distribution module 232 includes a plurality of tables it uses to generate distributed storage and task (DST) allocation information 242 for selected data and selected tasks received from a DST client module. The tables include data storage information 248, task storage information 250, distributed task (DT) execution module information 252, and task ⇔ sub-task mapping information 246.

The data storage information table 248 includes a data identification (ID) field 260, a data size field 262, an addressing information field 264, distributed storage (DS)

information 266, and may further include other information regarding the data, how it is stored, and/or how it can be processed. For example, DS encoded data #1 has a data ID of 1, a data size of AA (e.g., a byte size of a few Terabytes or more), addressing information of Addr_1_AA, and DS parameters of 3/5; SEG_1; and SLC_1. In this example, the addressing information may be a virtual address corresponding to the virtual address of the first storage word (e.g., one or more bytes) of the data and information on how to calculate the other addresses, may be a range of virtual addresses for the storage words of the data, physical addresses of the first storage word or the storage words of the data, may be a list of slice names of the encoded data slices of the data, etc. The DS parameters may include identity of an error encoding scheme, decode threshold/pillar width (e.g., 3/5 for the first data entry), segment security information (e.g., SEG_1), per slice security information (e.g., SLC_1), and/or any other information regarding how the data was encoded into data slices.

The task storage information table 250 includes a task identification (ID) field 268, a task size field 270, an addressing information field 272, distributed storage (DS) information 274, and may further include other information regarding the task, how it is stored, and/or how it can be used to process data. For example, DS encoded task #2 has a task ID of 2, a task size of XY, addressing information of Addr_2_XY, and DS parameters of 3/5; SEG_2; and SLC_2. In this example, the addressing information may be a virtual address corresponding to the virtual address of the first storage word (e.g., one or more bytes) of the task and information on how to calculate the other addresses, may be a range of virtual addresses for the storage words of the task, physical addresses of the first storage word or the storage words of the task, may be a list of slices names of the encoded slices of the task code, etc. The DS parameters may include identity of an error encoding scheme, decode threshold/pillar width (e.g., 3/5 for the first data entry), segment security information (e.g., SEG_2), per slice security information (e.g., SLC_2), and/or any other information regarding how the task was encoded into encoded task slices. Note that the segment and/or the per-slice security information include a type of encryption (if enabled), a type of compression (if enabled), watermarking information (if enabled), and/or an integrity check scheme (if enabled).

The task ⇔ sub-task mapping information table 246 includes a task field 256 and a sub-task field 258. The task field 256 identifies a task stored in the memory of a distributed storage and task network (DSTN) module and the corresponding sub-task fields 258 indicates whether the task includes sub-tasks and, if so, how many and if any of the sub-tasks are ordered. In this example, the task ⇔ sub-task mapping information table 246 includes an entry for each task stored in memory of the DSTN module (e.g., task 1 through task k). In particular, this example indicates that task 1 includes 7 sub-tasks; task 2 does not include sub-tasks, and task k includes r number of sub-tasks (where r is an integer greater than or equal to two).

The DT execution module table 252 includes a DST execution unit ID field 276, a DT execution module ID field 278, and a DT execution module capabilities field 280. The DST execution unit ID field 276 includes the identity of DST units in the DSTN module. The DT execution module ID field 278 includes the identity of each DT execution unit in each DST unit. For example, DST unit 1 includes three DT executions modules (e.g., 1_1, 1_2, and 1_3). The DT execution capabilities field 280 includes identity of the capabilities of the corresponding DT execution unit. For example, DT execution module 1_1 includes capabilities X, where X includes one or more of MIPS capabilities, processing resources (e.g., quantity and capability of microprocessors, CPUs, digital signal processors, co-processor, microcontrollers, arithmetic logic circuitry, and/or any other analog and/or digital processing circuitry), availability of the processing resources, memory information (e.g., type, size, availability, etc.), and/or any information germane to executing one or more tasks.

From these tables, the task distribution module 232 generates the DST allocation information 242 to indicate where the data is stored, how to partition the data, where the task is stored, how to partition the task, which DT execution units should perform which partial task on which data partitions, where and how intermediate results are to be stored, etc. If multiple tasks are being performed on the same data or different data, the task distribution module factors such information into its generation of the DST allocation information.

Figure 30:
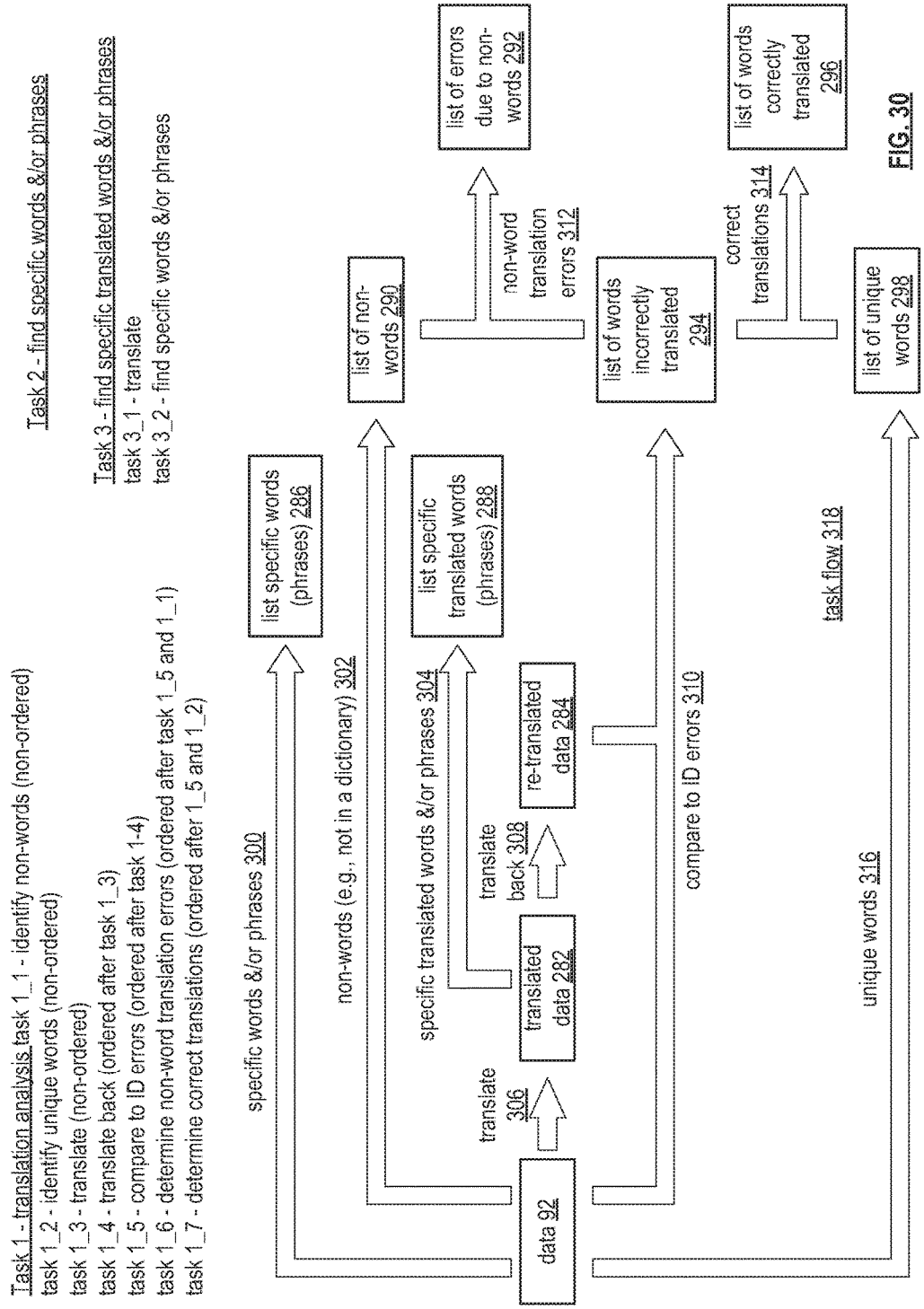
FIG. 30 is a diagram of a specific example of the distributed computing system performing tasks on stored data in accordance with the present invention.

FIG. 30 is a diagram of a specific example of a distributed computing system performing tasks on stored data as a task flow 318. In this example, selected data 92 is data 2 and selected tasks are tasks 1, 2, and 3. Task 1 corresponds to analyzing translation of data from one language to another (e.g., human language or computer language); task 2 corresponds to finding specific words and/or phrases in the data; and task 3 corresponds to finding specific translated words and/or phrases in translated data.

In this example, task 1 includes 7 sub-tasks: task 1_1—identify non-words (non-ordered); task 1_2—identify unique words (non-ordered); task 1_3—translate (non-ordered); task 1_4—translate back (ordered after task 1_3); task 1_5—compare to ID errors (ordered after task 1-4); task 1_6—determine non-word translation errors (ordered after task 1_5 and 1_1); and task 1_7—determine correct translations (ordered after 1_5 and 1_2). The sub-task further indicates whether they are an ordered task (i.e., are dependent on the outcome of another task) or non-order (i.e., are independent of the outcome of another task). Task 2 does not include sub-tasks and task 3 includes two sub-tasks: task 3_1 translate; and task 3_2 find specific word or phrase in translated data.

In general, the three tasks collectively are selected to analyze data for translation accuracies, translation errors, translation anomalies, occurrence of specific words or phrases in the data, and occurrence of specific words or phrases on the translated data. Graphically, the data 92 is translated 306 into translated data 282; is analyzed for specific words and/or phrases 300 to produce a list of specific words and/or phrases 286; is analyzed for non-words 302 (e.g., not in a reference dictionary) to produce a list of non-words 290; and is analyzed for unique words 316 included in the data 92 (i.e., how many different words are included in the data) to produce a list of unique words 298. Each of these tasks is independent of each other and can therefore be processed in parallel if desired.

The translated data 282 is analyzed (e.g., sub-task 3_2) for specific translated words and/or phrases 304 to produce a list of specific translated words and/or phrases 288. The translated data 282 is translated back 308 (e.g., sub-task 1_4) into the language of the original data to produce re-translated data 284. These two tasks are dependent on the translate task (e.g., task 1_3) and thus must be ordered after the translation task, which may be in a pipelined ordering or a serial ordering. The re-translated data 284 is then compared 310 with the original data 92 to find words and/or phrases that did not translate (one way and/or the other) properly to produce a list of incorrectly translated words 294. As such, the comparing task (e.g., sub-task 1_5) 310 is ordered after the translation 306 and re-translation tasks 308 (e.g., sub-tasks 1_3 and 1_4).

The list of words incorrectly translated 294 is compared 312 to the list of non-words 290 to identify words that were not properly translated because the words are non-words to produce a list of errors due to non-words 292. In addition, the list of words incorrectly translated 294 is compared 314 to the list of unique words 298 to identify unique words that were properly translated to produce a list of correctly translated words 296. The comparison may also identify unique words that were not properly translated to produce a list of unique words that were not properly translated. Note that each list of words (e.g., specific words and/or phrases, non-words, unique words, translated words and/or phrases, etc.,) may include the word and/or phrase, how many times it is used, where in the data it is used, and/or any other information requested regarding a word and/or phrase.

Figure 31:
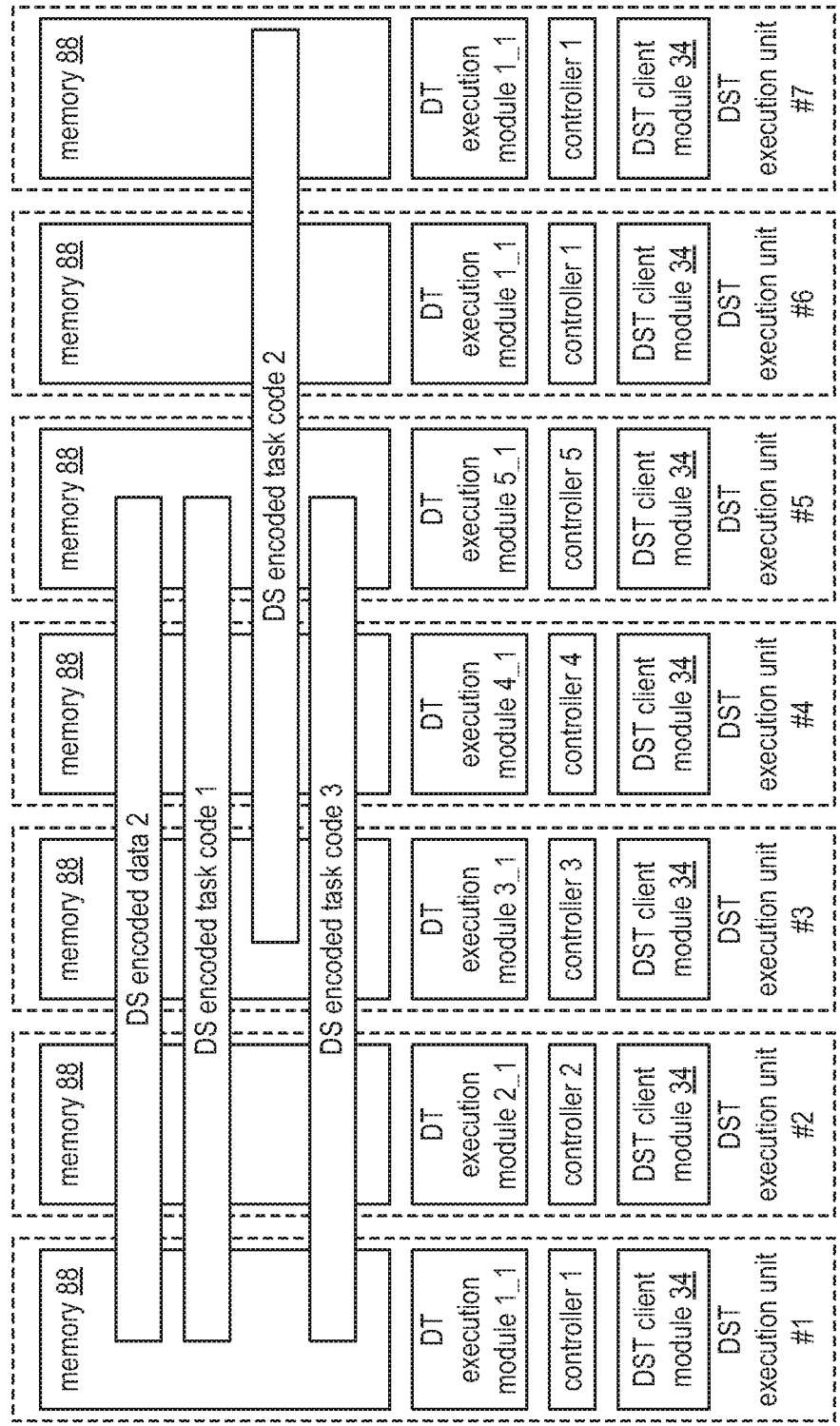
FIG. 31 is a schematic block diagram of an example of a distributed storage and task processing network (DSTN) module storing data and task codes for the example of FIG. 30 in accordance with the present invention.

FIG. 31 is a schematic block diagram of an example of a distributed storage and task processing network (DSTN) module storing data and task codes for the example of FIG. 30. As shown, DS encoded data 2 is stored as encoded data slices across the memory (e.g., stored in memories 88) of DST execution units 1-5; the DS encoded task code 1 (of task 1) and DS encoded task 3 are stored as encoded task slices across the memory of DST execution units 1-5; and DS encoded task code 2 (of task 2) is stored as encoded task slices across the memory of DST execution units 3-7. As indicated in the data storage information table and the task storage information table of FIG. 29, the respective data/task has DS parameters of 3/5 for their decode threshold/pillar width; hence spanning the memory of five DST execution units.

FIG. 32 is a diagram of an example of distributed storage and task (DST) allocation information 242 for the example of FIG. 30. The DST allocation information 242 includes data partitioning information 320, task execution information 322, and intermediate result information 324. The data partitioning information 320 includes the data identifier (ID), the number of partitions to split the data into, address information for each data partition, and whether the DS encoded data has to be transformed from pillar grouping to slice grouping. The task execution information 322 includes tabular information having a task identification field 326, a task ordering field 328, a data partition field ID 330, and a set of DT execution modules 332 to use for the distributed task processing per data partition. The intermediate result information 324 includes tabular information having a name ID field 334, an ID of the DST execution unit assigned to process the corresponding intermediate result 336, a scratch pad storage field 338, and an intermediate result storage field 340.

Continuing with the example of FIG. 30, where tasks 1-3 are to be distributedly performed on data 2, the data partitioning information includes the ID of data 2. In addition, the task distribution module determines whether the DS encoded data 2 is in the proper format for distributed computing (e.g., was stored as slice groupings). If not, the task distribution module indicates that the DS encoded data 2 format needs to be changed from the pillar grouping format to the slice grouping format, which will be done by the DSTN module. In addition, the task distribution module determines the number of partitions to divide the data into (e.g., 2_1 through 2_z) and addressing information for each partition.

The task distribution module generates an entry in the task execution information section for each sub-task to be performed. For example, task 1_1 (e.g., identify non-words on the data) has no task ordering (i.e., is independent of the results of other sub-tasks), is to be performed on data partitions 2_1 through 2_z by DT execution modules 1_1, 2_1, 3_1, 4_1, and 5_1. For instance, DT execution modules 1_1, 2_1, 3_1, 4_1, and 5_1 search for non-words in data partitions 2_1 through 2_z to produce task 1_1 intermediate results (R1-1, which is a list of non-words). Task 1_2 (e.g., identify unique words) has similar task execution information as task 1_1 to produce task 1_2 intermediate results (R1-2, which is the list of unique words).

Task 1_3 (e.g., translate) includes task execution information as being non-ordered (i.e., is independent), having DT execution modules 1_1, 2_1, 3_1, 4_1, and 5_1 translate data partitions 2_1 through 2_4 and having DT execution modules 1_2, 2_2, 3_2, 4_2, and 5_2 translate data partitions 2_5 through 2_z to produce task 1_3 intermediate results (R1-3, which is the translated data). In this example, the data partitions are grouped, where different sets of DT execution modules perform a distributed sub-task (or task) on each data partition group, which allows for further parallel processing.

Task 1_4 (e.g., translate back) is ordered after task 1_3 and is to be executed on task 1_3's intermediate result (e.g., R1-3_1) (e.g., the translated data). DT execution modules 1_1, 2_1, 3_1, 4_1, and 5_1 are allocated to translate back task 1_3 intermediate result partitions R1-3_1 through R1-3_4 and DT execution modules 1_2, 2_2, 6_1, 7_1, and 7_2 are allocated to translate back task 1_3 intermediate result partitions R1-3_5 through R1-3_z to produce task 1-4 intermediate results (R1-4, which is the translated back data).

Task 1_5 (e.g., compare data and translated data to identify translation errors) is ordered after task 1_4 and is to be executed on task 1_4's intermediate results (R4-1) and on the data. DT execution modules 1_1, 2_1, 3_1, 4_1, and 5_1 are allocated to compare the data partitions (2_1 through 2_z) with partitions of task 1-4 intermediate results partitions R1-4_1 through R1-4_z to produce task 1_5 intermediate results (R1-5, which is the list words translated incorrectly).

Task 1_6 (e.g., determine non-word translation errors) is ordered after tasks 1_1 and 1_5 and is to be executed on tasks 1_1's and 1_5's intermediate results (R1-1 and R1-5). DT execution modules 1_1, 2_1, 3_1, 4_1, and 5_1 are allocated to compare the partitions of task 1_1 intermediate results (R1-1_1 through R1-1_z) with partitions of task 1-5 intermediate results partitions (R1-5_1 through R1-5_z) to produce task 1_6 intermediate results (R1-6, which is the list translation errors due to non-words).

Task 1_7 (e.g., determine words correctly translated) is ordered after tasks 1_2 and 1_5 and is to be executed on tasks 1_2's and 1_5's intermediate results (R1-1 and R1-5). DT execution modules 1_2, 2_2, 3_2, 4_2, and 5_2 are allocated to compare the partitions of task 1_2 intermediate results (R1-2_1 through R1-2_z) with partitions of task 1-5 intermediate results partitions (R1-5_1 through R1-5_z) to produce task 1_7 intermediate results (R1-7, which is the list of correctly translated words).

Task 2 (e.g., find specific words and/or phrases) has no task ordering (i.e., is independent of the results of other sub-tasks), is to be performed on data partitions 2_1 through 2_z by DT execution modules 3_1, 4_1, 5_1, 6_1, and 7_1. For instance, DT execution modules 3_1, 4_1, 5_1, 6_1, and 7_1 search for specific words and/or phrases in data partitions 2_1 through 2_z to produce task 2 intermediate results (R2, which is a list of specific words and/or phrases).

Task 3_2 (e.g., find specific translated words and/or phrases) is ordered after task 1_3 (e.g., translate) is to be performed on partitions R1-3_1 through R1-3_z by DT execution modules 1_2, 2_2, 3_2, 4_2, and 5_2. For instance, DT execution modules 1_2, 2_2, 3_2, 4_2, and 5_2 search for specific translated words and/or phrases in the partitions of the translated data (R1-3_1 through R1-3_z) to produce task 3_2 intermediate results (R3-2, which is a list of specific translated words and/or phrases).

For each task, the intermediate result information indicates which DST unit is responsible for overseeing execution of the task and, if needed, processing the partial results generated by the set of allocated DT execution units. In addition, the intermediate result information indicates a scratch pad memory for the task and where the corresponding intermediate results are to be stored. For example, for intermediate result R1-1 (the intermediate result of task 1_1), DST unit 1 is responsible for overseeing execution of the task 1_1 and coordinates storage of the intermediate result as encoded intermediate result slices stored in memory of DST execution units 1-5. In general, the scratch pad is for storing non-DS encoded intermediate results and the intermediate result storage is for storing DS encoded intermediate results.

FIGS. 33-38 are schematic block diagrams of the distributed storage and task network (DSTN) module performing the example of FIG. 30. In FIG. 33, the DSTN module accesses the data 92 and partitions it into a plurality of partitions 1-z in accordance with distributed storage and task network (DST) allocation information. For each data partition, the DSTN identifies a set of its DT (distributed task) execution modules 90 to perform the task (e.g., identify non-words (i.e., not in a reference dictionary) within the data partition) in accordance with the DST allocation information. From data partition to data partition, the set of DT execution modules 90 may be the same, different, or a combination thereof (e.g., some data partitions use the same set while other data partitions use different sets).

For the first data partition, the first set of DT execution modules (e.g., 1_1, 2_1, 3_1, 4_1, and 5_1 per the DST allocation information of FIG. 32) executes task 1_1 to produce a first partial result 102 of non-words found in the first data partition. The second set of DT execution modules (e.g., 1_1, 2_1, 3_1, 4_1, and 5_1 per the DST allocation information of FIG. 32) executes task 1_1 to produce a second partial result 102 of non-words found in the second data partition. The sets of DT execution modules (as per the DST allocation information) perform task 1_1 on the data partitions until the "z" set of DT execution modules performs task 1_1 on the "zth" data partition to produce a "zth" partial result 102 of non-words found in the "zth" data partition.

As indicated in the DST allocation information of FIG. 32, DST execution unit 1 is assigned to process the first through "zth" partial results to produce the first intermediate result (R1-1), which is a list of non-words found in the data. For instance, each set of DT execution modules 90 stores its respective partial result in the scratchpad memory of DST execution unit 1 (which is identified in the DST allocation or may be determined by DST execution unit 1). A processing module of DST execution 1 is engaged to aggregate the first through "zth" partial results to produce the first intermediate result (e.g., R1_1). The processing module stores the first intermediate result as non-DS error encoded data in the scratchpad memory or in another section of memory of DST execution unit 1.

DST execution unit 1 engages its DST client module to slice grouping based DS error encode the first intermediate result (e.g., the list of non-words). To begin the encoding, the DST client module determines whether the list of non-words is of a sufficient size to partition (e.g., greater than a Terabyte). If yes, it partitions the first intermediate result (R1-1) into a plurality of partitions (e.g., R1-1_1 through R1-1_m). If the first intermediate result is not of sufficient size to partition, it is not partitioned.

For each partition of the first intermediate result, or for the first intermediate result, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 1-5).

In FIG. 34, the DSTN module is performing task 1_2 (e.g., find unique words) on the data 92. To begin, the DSTN module accesses the data 92 and partitions it into a plurality of partitions 1-z in accordance with the DST allocation information or it may use the data partitions of task 1_1 if the partitioning is the same. For each data partition, the DSTN identifies a set of its DT execution modules to perform task 1_2 in accordance with the DST allocation information. From data partition to data partition, the set of DT execution modules may be the same, different, or a combination thereof. For the data partitions, the allocated set of DT execution modules executes task 1_2 to produce a partial results (e.g., $1^{st}$ through "zth") of unique words found in the data partitions.

As indicated in the DST allocation information of FIG. 32, DST execution unit 1 is assigned to process the first through "zth" partial results 102 of task 1_2 to produce the second intermediate result (R1-2), which is a list of unique words found in the data 92. The processing module of DST execution 1 is engaged to aggregate the first through "zth" partial results of unique words to produce the second intermediate result. The processing module stores the second intermediate result as non-DS error encoded data in the scratchpad memory or in another section of memory of DST execution unit 1.

DST execution unit 1 engages its DST client module to slice grouping based DS error encode the second intermediate result (e.g., the list of non-words). To begin the encoding, the DST client module determines whether the list of unique words is of a sufficient size to partition (e.g., greater than a Terabyte). If yes, it partitions the second intermediate result (R1-2) into a plurality of partitions (e.g., R1-2_1 through R1-2_m). If the second intermediate result is not of sufficient size to partition, it is not partitioned.

For each partition of the second intermediate result, or for the second intermediate results, the DST client module uses the DS error encoding parameters of the data (e.g., DS parameters of data 2, which includes 3/5 decode threshold/ pillar width ratio) to produce slice groupings. The slice groupings are stored in the intermediate result memory (e.g., allocated memory in the memories of DST execution units 1-5).

In FIG. 35, the DSTN module is performing task 1_3 (e.g., translate) on the data 92. To begin, the DSTN module accesses the data 92 and partitions it into a plurality of partitions 1-z in accordance with the DST allocation information or it may use the data partitions of task 1_1 if the partitioning is the same. For each data partition, the DSTN identifies a set of its DT execution modules to perform task 1_3 in accordance with the DST allocation information (e.g., DT execution modules 1_1, 2_1, 3_1, 4_1, and 5_1 translate data partitions 2_1 through 2_4 and DT execution modules 1_2, 2_2, 3_2, 4_2, and 5_2 translate data partitions 2_5 through 2_z). For the data partitions, the allocated set of DT execution modules 90 executes task 1_3 to produce partial results 102 (e.g., $1^{st}$ through "zth") of translated data.

As indicated in the DST allocation information of FIG. 32, DST execution unit 2 is assigned to process the first through "zth" partial results of task 1_3 to produce the third intermediate result (R1-3), which is translated data. The processing module of DST execution 2 is engaged to aggregate the first through "zth" partial results of translated data to produce the third intermediate result. The processing module stores the third intermediate result as non-DS error encoded data in the scratchpad memory or in another section of memory of DST execution unit 2.

DST execution unit 2 engages its DST client module to slice grouping based DS error encode the third intermediate result (e.g., translated data). To begin the encoding, the DST client module partitions the third intermediate result (R1-3) into a plurality of partitions (e.g., R1-3_1 through R1-3_y). For each partition of the third intermediate result, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 2-6 per the DST allocation information).

As is further shown in FIG. 35, the DSTN module is performing task 1_4 (e.g., retranslate) on the translated data of the third intermediate result. To begin, the DSTN module accesses the translated data (from the scratchpad memory or from the intermediate result memory and decodes it) and partitions it into a plurality of partitions in accordance with the DST allocation information. For each partition of the third intermediate result, the DSTN identifies a set of its DT execution modules 90 to perform task 1_4 in accordance with the DST allocation information (e.g., DT execution modules 1_1, 2_1, 3_1, 4_1, and 5_1 are allocated to translate back partitions R1-3_1 through R1-3_4 and DT execution modules 1_2, 2_2, 6_1, 7_1, and 7_2 are allocated to translate back partitions R1-3_5 through R1-3_z). For the partitions, the allocated set of DT execution modules executes task 1_4 to produce partial results 102 (e.g., $1^{st}$ through "zth") of re-translated data.

As indicated in the DST allocation information of FIG. 32, DST execution unit 3 is assigned to process the first through "zth" partial results of task 1_4 to produce the fourth intermediate result (R1-4), which is retranslated data. The processing module of DST execution 3 is engaged to aggregate the first through "zth" partial results of retranslated data to produce the fourth intermediate result. The processing module stores the fourth intermediate result as non-DS error encoded data in the scratchpad memory or in another section of memory of DST execution unit 3.

DST execution unit 3 engages its DST client module to slice grouping based DS error encode the fourth intermediate result (e.g., retranslated data). To begin the encoding, the DST client module partitions the fourth intermediate result (R1-4) into a plurality of partitions (e.g., R1-4_1 through R1-4_z). For each partition of the fourth intermediate result, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 3-7 per the DST allocation information).

Figure 36:
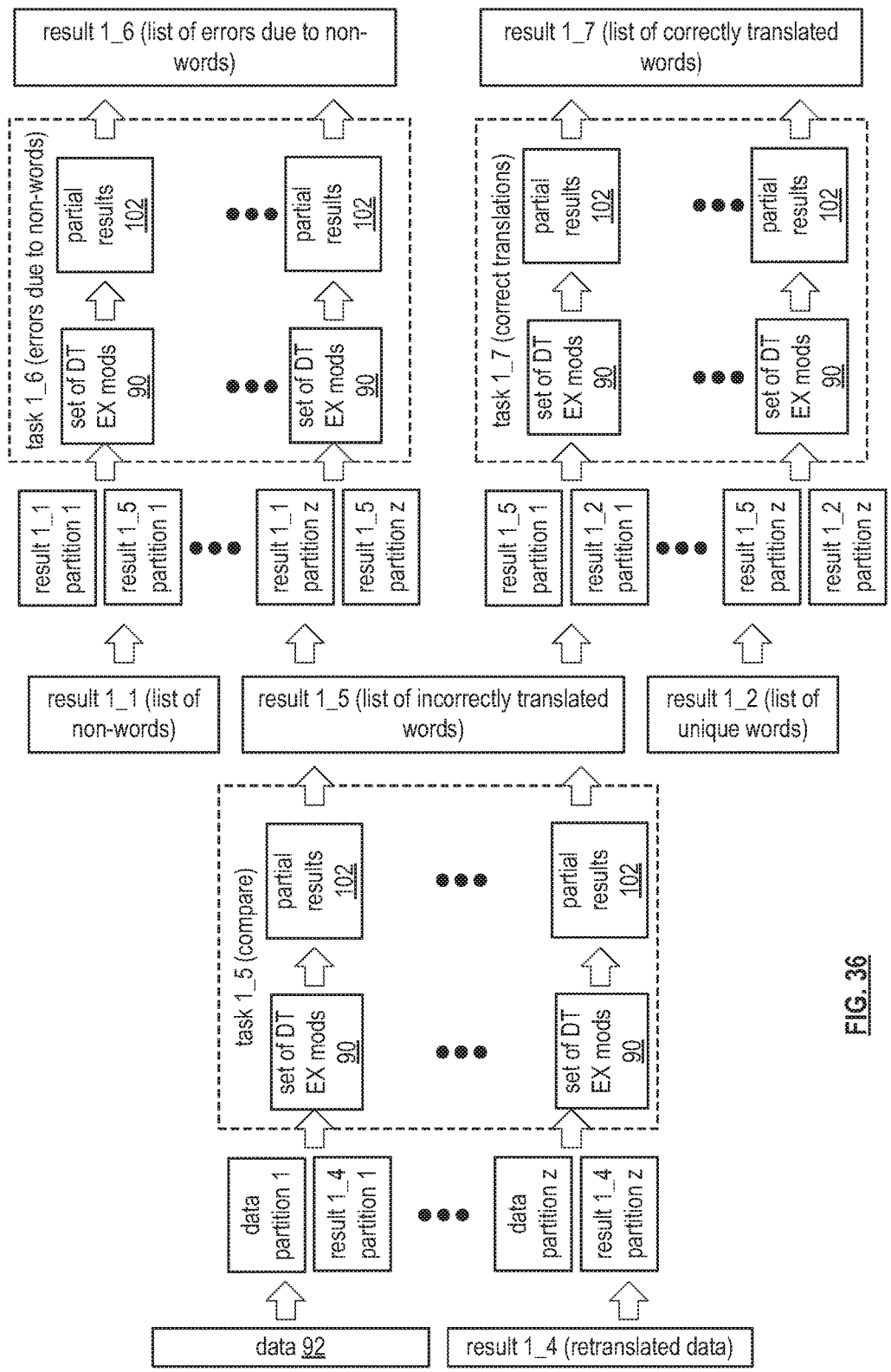

In FIG. 36, a distributed storage and task network (DSTN) module is performing task 1_5 (e.g., compare) on data 92 and retranslated data of FIG. 35. To begin, the DSTN module accesses the data 92 and partitions it into a plurality of partitions in accordance with the DST allocation information or it may use the data partitions of task 1_1 if the partitioning is the same. The DSTN module also accesses the retranslated data from the scratchpad memory, or from the intermediate result memory and decodes it, and partitions it into a plurality of partitions in accordance with the DST allocation information. The number of partitions of the retranslated data corresponds to the number of partitions of the data.

For each pair of partitions (e.g., data partition 1 and retranslated data partition 1), the DSTN identifies a set of its DT execution modules 90 to perform task 1_5 in accordance with the DST allocation information (e.g., DT execution modules 1_1, 2_1, 3_1, 4_1, and 5_1). For each pair of partitions, the allocated set of DT execution modules executes task 1_5 to produce partial results 102 (e.g., $1^{st}$ through "zth") of a list of incorrectly translated words and/or phrases.

As indicated in the DST allocation information of FIG. 32, DST execution unit 1 is assigned to process the first through "zth" partial results of task 1_5 to produce the fifth intermediate result (R1-5), which is the list of incorrectly translated words and/or phrases. In particular, the processing module of DST execution 1 is engaged to aggregate the first through "zth" partial results of the list of incorrectly translated words and/or phrases to produce the fifth intermediate result. The processing module stores the fifth intermediate result as non-DS error encoded data in the scratchpad memory or in another section of memory of DST execution unit 1.

DST execution unit 1 engages its DST client module to slice grouping based DS error encode the fifth intermediate result. To begin the encoding, the DST client module partitions the fifth intermediate result (R1-5) into a plurality of partitions (e.g., R1-5_1 through R1-5_z). For each partition of the fifth intermediate result, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 1-5 per the DST allocation information).

As is further shown in FIG. 36, the DSTN module is performing task 1_6 (e.g., translation errors due to non-words) on the list of incorrectly translated words and/or phrases (e.g., the fifth intermediate result R1-5) and the list of non-words (e.g., the first intermediate result R1-1). To begin, the DSTN module accesses the lists and partitions them into a corresponding number of partitions.

For each pair of partitions (e.g., partition R1-1_1 and partition R1-5_1), the DSTN identifies a set of its DT execution modules 90 to perform task 1_6 in accordance with the DST allocation information (e.g., DT execution modules 1_1, 2_1, 3_1, 4_1, and 5_1). For each pair of partitions, the allocated set of DT execution modules executes task 1_6 to produce partial results 102 (e.g., $1^{st}$ through "zth") of a list of incorrectly translated words and/or phrases due to non-words.

As indicated in the DST allocation information of FIG. 32, DST execution unit 2 is assigned to process the first through "zth" partial results of task 1_6 to produce the sixth intermediate result (R1-6), which is the list of incorrectly translated words and/or phrases due to non-words. In particular, the processing module of DST execution 2 is engaged to aggregate the first through "zth" partial results of the list of incorrectly translated words and/or phrases due to non-words to produce the sixth intermediate result. The processing module stores the sixth intermediate result as non-DS error encoded data in the scratchpad memory or in another section of memory of DST execution unit 2.

DST execution unit 2 engages its DST client module to slice grouping based DS error encode the sixth intermediate result. To begin the encoding, the DST client module partitions the sixth intermediate result (R1-6) into a plurality of partitions (e.g., R1-6_1 through R1-6_z). For each partition of the sixth intermediate result, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 2-6 per the DST allocation information).

As is still further shown in FIG. 36, the DSTN module is performing task 1_7 (e.g., correctly translated words and/or phrases) on the list of incorrectly translated words and/or phrases (e.g., the fifth intermediate result R1-5) and the list of unique words (e.g., the second intermediate result R1-2). To begin, the DSTN module accesses the lists and partitions them into a corresponding number of partitions.

For each pair of partitions (e.g., partition R1-2_1 and partition R1-5_1), the DSTN identifies a set of its DT execution modules 90 to perform task 1_7 in accordance with the DST allocation information (e.g., DT execution modules 1_2, 2_2, 3_2, 4_2, and 5_2). For each pair of partitions, the allocated set of DT execution modules executes task 1_7 to produce partial results 102 (e.g., $1^{st}$ through "zth") of a list of correctly translated words and/or phrases.

As indicated in the DST allocation information of FIG. 32, DST execution unit 3 is assigned to process the first through "zth" partial results of task 1_7 to produce the seventh intermediate result (R1-7), which is the list of correctly translated words and/or phrases. In particular, the processing module of DST execution 3 is engaged to aggregate the first through "zth" partial results of the list of correctly translated words and/or phrases to produce the seventh intermediate result. The processing module stores the seventh intermediate result as non-DS error encoded data in the scratchpad memory or in another section of memory of DST execution unit 3.

DST execution unit 3 engages its DST client module to slice grouping based DS error encode the seventh intermediate result. To begin the encoding, the DST client module partitions the seventh intermediate result (R1-7) into a plurality of partitions (e.g., R1-7_1 through R1-7_z). For each partition of the seventh intermediate result, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 3-7 per the DST allocation information).

In FIG. 37, the distributed storage and task network (DSTN) module is performing task 2 (e.g., find specific words and/or phrases) on the data 92. To begin, the DSTN module accesses the data and partitions it into a plurality of partitions 1-z in accordance with the DST allocation information or it may use the data partitions of task 1_1 if the partitioning is the same. For each data partition, the DSTN identifies a set of its DT execution modules 90 to perform task 2 in accordance with the DST allocation information. From data partition to data partition, the set of DT execution modules may be the same, different, or a combination thereof. For the data partitions, the allocated set of DT execution modules executes task 2 to produce partial results 102 (e.g., $1^{st}$ through "zth") of specific words and/or phrases found in the data partitions.

As indicated in the DST allocation information of FIG. 32, DST execution unit 7 is assigned to process the first through "zth" partial results of task 2 to produce task 2 intermediate result (R2), which is a list of specific words and/or phrases found in the data. The processing module of DST execution 7 is engaged to aggregate the first through "zth" partial results of specific words and/or phrases to produce the task 2 intermediate result. The processing module stores the task 2 intermediate result as non-DS error encoded data in the scratchpad memory or in another section of memory of DST execution unit 7.

DST execution unit 7 engages its DST client module to slice grouping based DS error encode the task 2 intermediate result. To begin the encoding, the DST client module determines whether the list of specific words and/or phrases is of a sufficient size to partition (e.g., greater than a Terabyte). If yes, it partitions the task 2 intermediate result (R2) into a plurality of partitions (e.g., R2_1 through R2_m). If the task 2 intermediate result is not of sufficient size to partition, it is not partitioned.

For each partition of the task 2 intermediate result, or for the task 2 intermediate results, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 1-4, and 7).

In FIG. 38, the distributed storage and task network (DSTN) module is performing task 3 (e.g., find specific translated words and/or phrases) on the translated data (R1-3). To begin, the DSTN module accesses the translated data (from the scratchpad memory or from the intermediate result memory and decodes it) and partitions it into a plurality of partitions in accordance with the DST allocation information. For each partition, the DSTN identifies a set of its DT execution modules to perform task 3 in accordance with the DST allocation information. From partition to partition, the set of DT execution modules may be the same, different, or a combination thereof. For the partitions, the allocated set of DT execution modules 90 executes task 3 to produce partial results 102 (e.g., $1^{st}$ through "zth") of specific translated words and/or phrases found in the data partitions.

As indicated in the DST allocation information of FIG. 32, DST execution unit 5 is assigned to process the first through "zth" partial results of task 3 to produce task 3 intermediate result (R3), which is a list of specific translated words and/or phrases found in the translated data. In particular, the processing module of DST execution 5 is engaged to aggregate the first through "zth" partial results of specific translated words and/or phrases to produce the task 3 intermediate result. The processing module stores the task 3 intermediate result as non-DS error encoded data in the scratchpad memory or in another section of memory of DST execution unit 7.

DST execution unit 5 engages its DST client module to slice grouping based DS error encode the task 3 intermediate result. To begin the encoding, the DST client module determines whether the list of specific translated words and/or phrases is of a sufficient size to partition (e.g., greater than a Terabyte). If yes, it partitions the task 3 intermediate result (R3) into a plurality of partitions (e.g., R3_1 through R3_m). If the task 3 intermediate result is not of sufficient size to partition, it is not partitioned.

For each partition of the task 3 intermediate result, or for the task 3 intermediate results, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 1-4, 5, and 7).

FIG. 39 is a diagram of an example of combining result information into final results 104 for the example of FIG. 30. In this example, the result information includes the list of specific words and/or phrases found in the data (task 2 intermediate result), the list of specific translated words and/or phrases found in the data (task 3 intermediate result), the list of non-words found in the data (task 1 first intermediate result R1-1), the list of unique words found in the data (task 1 second intermediate result R1-2), the list of translation errors due to non-words (task 1 sixth intermediate result R1-6), and the list of correctly translated words and/or phrases (task 1 seventh intermediate result R1-7). The task distribution module provides the result information to the requesting DST client module as the results 104.

FIGS. 40A-B are schematic block diagrams of an embodiment of a dispersed storage network (DSN) that includes a set of distributed storage and task (DST) execution (EX) units 1-8 implemented at one or more sites 1-4, the network 24 of FIG. 1, and the DST processing unit 16 of FIG. 1. Each DST execution unit may be implemented with the DST execution unit 36 of FIG. 1. Hereafter, each DST EX unit may be interchangeably referred to as a storage unit, the set of DST EX units may be interchangeably referred to as a set of storage units, and the DST processing unit 16 may be interchangeably referred to as a computing device of a plurality of computing devices of the DSN.

At least one site includes two or more DST execution (EX) units of the set of n DST execution units, where the DST processing unit 16 encodes data 362 utilizing an information dispersal algorithm (IDA) to produce a plurality of sets of n encoded data slices, where at least a write threshold number of encoded data slices of each set of encoded data slices are stored in the set of DST execution units to produce stored data, and where dispersal parameters of the IDA includes one or more of an IDA width=n, the write threshold number, and a decode threshold=k. For example, the set of DST execution units includes DST execution units 1-8 when the IDA width is 8. As another example, a site 1 includes DST execution units 1-2, a site 2 includes DST execution units 3-4, a site 3 includes DST execution units 5-6, and a site 4 includes DST execution unit 7-8 when the DSN is to include four sites with at least two DST execution units implemented at each site. Each site further includes a local area network (LAN) 360 to provide local communications between DST execution units implemented at a common site. For example, the LAN 360 implemented at site 1 provides communications between DST execution units 1-2 etc. The DSN functions to select a storage resource when storing the data 362.

FIG. 40A illustrates steps of an example of operation of the selecting of the storage resource where the computing device (e.g., the DST processing unit 16) sends to the set of storage units of the DSN, a set of write requests regarding a set of encoded data slices, where a data segment of the data 362 is dispersed storage error encoded to produce the set of encoded data slices, where each write request of the set of write requests includes a write set information table 364 that includes a listing of which storage unit of the set of storage units is being sent which encoded data slice of the set of encoded data slices for storage. The sending includes the DST processing unit 16 selecting a write threshold number of DST execution units of the set of DST execution units for storage of the set of encoded data slices. The selecting includes at least one of interpreting DST execution unit performance levels, interpreting system registry information, interpreting a predetermination, and interpreting a request. For example, the DST processing unit 16 selects DST execution units 1, 3, 4, 5, 7, and 8 when each of the selected DST execution units is associated with a favorable level of performance and the write threshold number is 6 and the IDA width=8.

Having selected the write threshold number of DST execution units, the DST processing unit 16 generates a write threshold number of write slice requests, where the write threshold number of write slice requests includes the set of encoded data slices, a set of associated slice names, and the write set information table 364. In particular, each write slice request includes the write set information table 364 and a corresponding write slice. The write set information table 364 includes, for the set of encoded data slices, a write threshold number of corresponding slice names and a write threshold number of corresponding DST execution unit identifiers. For example, for the set of encoded data slices, the write set information table 364 includes slice names 1, 3, 4, 5, 7, and 8 and identifiers for the associated DST execution units 1, 3, 4, 5, 7, and 8. The corresponding write slice includes at least one encoded data slice and an associated slice name corresponding to the selected associated DST execution unit. For example, for a write slice request 1, a corresponding write slice 1 includes a slice name 1 and an encoded data slice 1 for storage in the DST execution unit 1.

Having generated the write threshold number of write slice requests, the DST processing unit 16 sends, via the network 24, the write threshold number of write slice requests (e.g., as the set of write requests) to the selected write threshold number of DST execution units. For example, the DST processing unit 16 sends the write slice request 1 to the DST execution unit 1, a write slice request 3 to the DST execution unit 3, a write slice request 4 to the DST execution unit 4, a write slice request 5 to the DST execution unit 5, a write slice request 7 to the DST execution unit 7, and a write slice request 8 to the DST execution unit 8.

With the write requests sent to the storage units, at least some of the storage units of the set of storage units receives write requests of the set of write requests. Having received the write request, one of the storage units of the at least some of the storage units and interprets the write set information table 364 to determine that a particular encoded data slice assigned to a particular storage unit should be stored by a different storage unit. For example, the DST execution unit 1 receives the write slice request 1, interprets the write set information table 364 that indicates that the encoded data slice 1 is associated with the DST execution unit 1, and determines that the encoded data slice 1 assigned to the particular storage unit 1 (e.g., DST execution unit 1) should be stored by DST execution unit 2. The determining that the particular encoded data slice assigned to the particular storage unit should be stored by the different storage unit is discussed in greater detail with reference to FIG. 40B.

FIG. 40B illustrates further steps of the example of operation of the selecting of the storage resource where the one of the storage units facilitates storing of the particular encoded data slice in the different storage unit. The facilitating of the storing of the particular encoded data slice in the different storage unit may be accomplished utilizing a variety of storing approaches. In a first storing approach, the one of the storage units as the particular storage unit determines a soft failure of the one of the storage units, where the one of the storage units is the particular storage unit (e.g., storage unit 1 determines when the slice was sent to storage unit 1 for storage in the storage unit 1). The soft failure includes one or more of an overloading condition (e.g., DST execution unit 1 is currently too busy), a storage capacity condition (e.g., DST execution unit 1 is too full), a data rate condition (e.g., DST execution unit 1 receives slices too slowly), and a memory availability condition (e.g., DST execution unit 1 memory is not currently available, i.e., being upgraded).

Having determined the soft failure, the one of the storage unit selects the different storage unit based on an accessible factor. The accessible factor includes one or more of a type of coupling between the one of the storage units and the different storage unit (e.g., the LAN 360 connection has priority over of a WAN connection, i.e., the network 24), a reliability factor of the different storage unit (e.g., favorable reliability of the DST execution unit 2), a data rate of the different storage unit (e.g., a favorable data access speed to the DST execution unit 2), and an availability factor of the different storage unit (e.g., a favorable availability factor level of the DST execution unit 2). For example, the DST execution unit 1 selects the DST execution unit 2 for storage of encoded data slice 1 when the availability factor of the DST execution unit 2 is favorable.

Having selected the different storage unit, the one of the storage unit sends a corresponding write request of the set of write requests to the different storage unit, where the corresponding write request includes the particular encoded data slice. For example, the DST execution unit 1 and sends, via the LAN 360 at site 1, write slice request 1 that includes the encoded data slice 1 to the DST execution unit 2 for storage. Having sent the corresponding write request to the different storage unit, the one of the storage units records the transferring of the corresponding write request to the different storage unit. For example, the DST execution unit 1 issues, via the network 24, a write slice response 1 to the DST processing unit 16 to indicate that the encoded data slice 2 has been successfully stored.

In a second storing approach of the variety of storing approaches, the one of the storage units (e.g., now DST execution unit 2) determines that the particular storage unit is off-line. For example, the DST execution unit 2 receives the write slice request 1 at site 1 (e.g., where the one of the storage units is now the DST execution unit 2) and determines that the DST execution unit 1 is off-line (e.g., indicating off-line when an availability timeframe has expired without an availability response received from the DST execution unit 1, i.e., no heartbeat message within the timeframe).

Having determined that the particular storage unit is off-line from line, the one of the storage unit selects the different storage unit based on the accessible factor (e.g., another storage unit at site 1, i.e., the DST execution unit 2). Having selected the different storage unit, the one of the storage unit sends the corresponding write request of the set of write requests to the different storage unit, where the corresponding write request includes the particular encoded data slice. The sending of the corresponding write request may include the one of the storage units reading the write request sent to the particular storage unit via a connection between the one of the storage units and the particular storage unit (e.g., the LAN 360 connection at the common site 1). For example, the DST execution unit 2 sends the write slice request 1 to the different storage unit at the site 1. As another example, the DST execution unit 2 captures the write slice request 1 that includes the encoded data slice 1 for storage (e.g., sends the write slice request 1 to itself). Having sent the corresponding write request, the one of the storage units records the transferring of the corresponding write request to the different storage unit. For example, the DST execution unit 2 issues, via the network 24, the write slice response 1 to the DST processing unit 16.

Having performed at least one of the storing approaches, the one of the storage units updates the write set information table 364 to indicate that the particular encoded data slices is being stored by the different storage unit. For example, either of the DST execution unit 1 and 2 updates the write set information table 364 to indicate that the DST execution unit 2 is storing the encoded data slice 1 to produce an updated write set information table. Having produced the updated write set information table, the one of the storage unit sends, via the network 24, the updated write set information table to the DST processing unit 16 (e.g., computing device).

When recovering the stored data, the computing device sends a read request for the particular encoded data slice. For example, the DST processing unit 16 issues, via the network 24, a read slice request 1 to one or more storage units at site 1. The one of the storage units receives the read request as the particular storage unit. For example, the DST execution unit 1 receives the read slice request 1. Having received the read request, at least one of the storage units and the particular storage unit forwards the read request to the different storage unit (e.g., where the particular encoded data slice is stored). For example, the DST execution unit 1 forwards, via the LAN 360, the read slice request 1 to the DST execution unit 2. Having forwarded the read request, the different storage unit or the one of the storage units sends, via the network 24, the particular encoded data slice to the computing device in response to the read request.

In another example of recovering the stored data, the DST processing unit 16 issues, via the network 24, the read slice request 1 to one or more storage units at site 1. The particular storage unit (e.g., where the encoded data slices stored) receives the read request, where the one of the storage units is the different storage unit. Having received the read request, the particular storage unit forwards the read request to the different storage unit. Having received the read request, the different storage unit or the particular storage unit sends the particular encoded data slice to the computing device in response to the request. For example, the DST execution unit 2 sends, via the network 24, the encoded data slice 1 to the DST processing unit 16.

FIG. 40C is a flowchart illustrating an example of selecting a data storage resource. In particular, a method is presented for use in conjunction with one or more functions and features described in conjunction with FIGS. 1-39, 40A-B, and also FIG. 40C. The method includes step 380 where a computing device of one or more computing devices of a dispersed storage network (DSN) sends, to a set of storage units of the DSN, a set of write requests regarding a set of encoded data slices, where a data segment of data is dispersed storage error encoded to produce the set of encoded data slices, where each write request of the set of write requests includes a write set information table that includes a listing of which storage unit of the set of storage units is being sent which encoded data slice of the set of encoded data slices for storage.

The method continues at step 382 where at least some of the storage units of the set of storage units receives write requests of the set of write requests (e.g., the storage unit being sent a slice for storage, another storage unit). The method continues at step 384 where one of the storage units of the at least some of the storage units and interprets the write set information table to determine that a particular encoded data slice assigned to a particular storage unit should be stored by a different storage unit. For example, the particular storage unit being sent the particular encoded data slice determines that the particular encoded data slice should be stored by the different storage unit. As another example, the different storage unit determines that the particular encoded data slice should be stored by the different storage unit. As yet another example, another storage unit associated with the particular storage unit being sent the particular encoded data slice determines that the particular encoded data/be stored by the different storage unit, where the different storage unit is not the other storage unit associated with particular storage unit means of the particular encoded data slice.

The method continues at step 386 where the one of the storage units facilitates storing of the particular encoded data slice in the different storage unit. The facilitating of the storing of the particular encoded data slice in the different storage unit may be accomplished utilizing a variety of storing approaches. In a first storing approach, the one of the storage units as the particular storage unit determines a soft failure of the one of the storage units, where the one of the storage units is the particular storage unit, selects the different storage unit based on an accessible factor, sends a corresponding write request of the set of write requests to the different storage unit, where the corresponding write request includes the particular encoded data slice, and records the transferring of the corresponding write request to the different storage unit.

In a second storing approach of the variety of storing approaches, the one of the storage units determines that the particular storage unit is off-line, selects the different storage unit based on the accessible factor, sends the corresponding write request of the set of write requests to the different storage unit, where the corresponding write request includes the particular encoded data slice, and records the transferring of the corresponding write request to the different storage unit. For example, the one of the storage unit reads the write request sent to the particular storage unit via a connection between the one of the storage units and the particular storage unit (e.g., a LAN connection at a common site).

The method continues at step 388 where the one of the storage units updates the write set information table to indicate that the particular encoded data slices is being stored by the different storage unit. The method continues at step 390 where the one of the storage units sends the updated write set information table to the computing device.

When accessing the data stored as encoded data slices in the set of storage units, the computing device sends a read request for the particular encoded data slice at step 392. For example, the computing device sends the read request to the common site that includes two or more storage units. The read request may be received by the one of the storage units, the particular storage unit and/or the different storage unit. The method branches to step 400 when the read request is received by the particular storage unit. The method continues to step 394 when the request is received by the one of the storage units.

The method continues at step 394 where the one of the storage units as the particular storage unit receives the read request. The method continues at step 396 where the particular storage unit forwards the read request to the different storage unit (e.g., where the particular encoded data slice is stored). The method continues to step 398 where the different storage unit or the one of the storage unit sends the particular encoded data slice to the computing device in response to the read request. For example, the one of the storage units retrieves the particular encoded data slice from the different storage unit and sends the particular encoded data slice to the computing device. As another example, the different storage unit sends the particular encoded data slice to the computing device.

When the read request is received by the particular storage unit and the one of the storage units is the different storage unit, the particular storage unit receives the read request. The method continues at step 396 where the particular storage unit forwards the read request to the different storage unit. The method continues at step 402 where the different storage unit or the particular storage sends the particular encoded data slice to the computing device in response to the read request. For example, the particular storage units retrieves the particular encoded data slice from the different storage unit and sends the particular encoded data slice to the computing device. As another example, the different storage unit sends the particular encoded data slice to the computing device.

The method described above in conjunction with the computing device and/or storage units can alternatively be performed by other units and modules of the dispersed storage network or by other devices. In addition, at least one memory section (e.g., a non-transitory computer readable storage medium) that stores operational instructions can, when executed by one or more processing modules of one or more computing devices of the dispersed storage network (DSN), cause the one or more computing devices to perform any or all of the method steps described above.

FIGS. 41A-B are schematic block diagrams of another embodiment of a dispersed storage network (DSN) that includes a set of distributed storage and task (DST) execution (EX) units, the network 24 of FIG. 1, and the DST processing unit 16 of FIG. 1. The set of DST execution units includes a number of DST execution units in accordance with an information dispersal algorithm (IDA) width. For example, when the IDA width is 8, a set of DST execution units includes DST execution units 1-8. Each DST execution unit may be implemented utilizing the DST execution unit 36 of FIG. 1.

The DSN functions to recover data, where the data is divided into a plurality of data segments, where each data segment is associated with a revision number of the data, and each data segment is dispersed storage error encoded to produce a corresponding set of encoded data slices of a plurality of sets of encoded data slices, where each set of encoded data slices is stored in the set of DST execution units, and where each encoded data slice is associated with a unique slice name and with the revision number of the data. For example, the DST processing unit 16 generates and stores a set of slices (SLC) 1A, 2A, through 8A of a revision A of the data, another set of slices (SLC) 1B, 2B, through 8B of a revision B of the data, and yet another set of slices (SLC) 1C, 2C, through 8C of a revision C of the data, where each of the revisions A-C are stored in the set of DST execution units 1-8. Subsequent to the storage of the encoded data slices, one or more of the encoded data slices may be unavailable (e.g., corruption, missing, destroyed, inadvertently deleted, etc.). For example, the version A encoded data slices may only include encoded data slices 1, 2, 3, and 6; the version B encoded data slices may only include encoded data slices 1, 2, 4, 6, and 7; and the version C encoded data slices may include the entire set of encoded data slices 1-8 and a common subsequent time frame.

FIG. 41A illustrates steps of an example of operation of the recovering of the stored data, where the DST processing unit 16 identifies a data segment of the plurality of data segments for recovery. The identifying includes at least one of receiving a retrieve data request for the data, receiving a retrieve data request for the data segment, and identifying the data segment of the plurality of data segments for recovery. For example, the DST processing unit 16 identifies a next sequential data segment as the data segment for recovery.

Having identified the data segment for recovery, the DST processing unit 16 identifies a set of DST execution units. The identifying includes at least one of performing a lookup based on an identifier of the data segment, interpreting system registry information, and receiving DST execution unit identifiers. Having identified the set of DST execution units, the DST processing unit 16 issues a set of read prepare requests 430 to the set of identified DST execution units. The issuing includes generating the read prepare requests 430 to include a set of slice names corresponding to a set of encoded data slices of the data segment and sending, via the network 24, the set of read prepare requests 430 to the set of DST execution units. For example, the DST processing unit 16 generates and sends, via the network 24, read prepare requests 1-8 to the DST execution units 1-8.

Having sent the set of read prepare requests 430 to the set of identified DST execution units, the DST processing unit 16 receives read prepare responses 432, via the network 24, from at least some DST execution units of the set of DST execution units, where the read prepare responses 432 indicates, for each available encoded data slice, an associated slice name and revision number. For example, each DST execution unit copies, for each slice name, each revision of an available encoded data slice to a temporary memory (e.g., a high-speed memory to enable subsequent output) and issues a corresponding read prepare response to the DST processing unit 16. As a specific example, DST execution unit 1 receives the read prepare request 1 that includes a first slice name common to encoded data slices 1A, 1B, and 1C of respective revisions A-C, copies the encoded data slices 1A-1C from a primary memory (e.g., a magnetic disk drive) into the temporary memory (e.g., a solid-state memory) of the DST execution unit 1, and issues a read prepare response 1 to the DST processing unit 16, where the read prepare response 1 indicates that the encoded data slices are available for revisions A-C of the first slice name.

FIG. 41B illustrates further steps of the example of operation of the recovering of the stored data, where the DST processing unit 16 identifies, for each available revision of encoded data slices, a desired revision number for recovery based on a number of available encoded data slices associated with each available revision number. The identifying includes one of identifying a most recent revision number associated with at least a decode threshold number of encoded data slices and identifying a most recent revision number associated with at least a read threshold number of encoded data slices. For example, the DST processing unit 16 determines that the set of encoded data slices associated with the revision A does not include at least a decode threshold number of encoded data slices when the decode threshold is 5 (e.g., only four slices are available—encoded data slices 1A, 2A, 3A, and 6A). As another example, the DST processing unit 16 determines that the set of encoded data slices associated with the revision B includes a decode threshold number of encoded data slices (e.g., slices 1B, 2B, 4B, 6B, 7B) and so does the set of encoded data slices associated with the revision C, and chooses the revision B as a desired revision number for recovery when determining that revision B is newer than revision C and a latest revision number is desired. Alternatively, the DST processing unit 16 may select the revision C when an oldest revision number is desired.

Having identified the desired revision number for recovery, the DST processing unit 16 identifies a subset of DST execution unit set includes at least a decode threshold number of DST execution units associated with available encoded data slices of the desired revision number. The identifying may be based on one or more of interpreting the read prepare responses, interpreting a predetermination, interpreting system registry information, and analyzing DST execution unit performance level information. For example, the DST processing unit 16 selects the DST execution units 1, 2, 4, 6, and 7 as the subset of DST execution units when the DST execution units 1, 2, 4, 6, and 7 include the decode threshold number of encoded data slices of the desired revision number for recovery and the DST execution units 1, 2, 4, 6, and 7 are associated with favorable DST execution unit performance levels.

Having selected the subset of DST execution units, the DST processing unit 16 issues read specific requests 438 to the identified subset of DST execution units. The issuing includes generating the read specific requests 438 to include the desired revision number and associated slice name of the set of slice names, sending, via the network 24, the read specific requests to the identified subset of DST execution units and receiving a corresponding encoded data slices of the desired revision number for recovery. For example, DST execution unit 1 receives a read specific request 1 that includes the revision number B and sends, via the network 24, a read specific response 442 that includes the encoded data slice 1B to the DST processing unit 16. When the DST processing unit 16 receives at least a decode threshold number of encoded data slices associated with the desired revision from the identified subset of DST execution units, the DST processing unit 16 dispersed storage error decodes the received decode threshold number of encoded data slices to produce a recovered data segment of a plurality of recovered data segments, where the plurality of recovered data segments produces recovered data 444.

Having issued the read specific requests 438, the DST processing unit 16 issues read abandon requests 440 to remaining DST execution units of the set of DST execution units. The issuing includes generating the read abandon requests 440 to include a remaining associated slice name of the set of slice names, and sending, via the network 24, the read abandon requests 440 to the remaining DST execution units. Each DST execution unit receiving the read abandon request 440 deletes all revisions of encoded data slices of the associated slice name from the temporary memory of the DST execution unit. For example, the DST execution unit 3 receives a read abandon request 3 and deletes encoded data slices 3A and 3C from the temporary memory of the DST execution unit 3.

FIG. 41C is a flowchart illustrating an example of recovering stored data. The method includes step 450 where a processing module (e.g., of a distributed storage and task (DST) processing unit) identifies a set of slice names associated with a data segment for recovery. The identifying includes at least one of accessing a DSN directory to identify slice names associated with a data identifier of the data segment and accessing a dispersed hierarchical index to identify the slice names.

The method continues at step 452 where the processing module identifies a set of storage units associated with storage of one or more revisions of encoded data slices corresponding to the set of slice names. The identifying includes at least one of accessing the DSN directory and accessing the dispersed hierarchical index to identify storage units associated with storage of encoded data slices of the slice names.

The method continues at step 454 where the processing module issues a set of read prepare requests to the set of storage units. For example, the processing module generates the set of read prepare requests to include the set of slice names and sends the set of read prepare requests to the set of storage units. The method continues at step 456 where the processing module selects a revision number of the one or more revisions based on received read prepare responses. For example, the processing module receives the read prepare responses, interprets the received responses to identify available revisions of encoded data slices, interprets responses to identify a favorable number of available encoded data slices for each revision of the one or more revisions, and chooses a revision number associated with a desired number of available encoded data slices (e.g., a decode threshold number, a read threshold number).

The method continues at step 458 where the processing module identifies a subset of the set of storage units favorably associated with the selected revision number. For example, the processing module interprets the read prepare responses to identify storage units associated with the desired revision and chooses from the storage units associated with a desired revision that are associated with favorable performance levels.

The method continues at step 460 where the processing module issues read specific requests to the subset of storage units. For example, the processing module generates the read specific requests to include one or more of an associated slice name of the set of slice names and the desired revision number. The method continues at step 462 where the processing module issues read abandon requests to remaining storage units of the set of storage units. For example, the processing module generates the read abandon requests to include one or more of a remaining associated slice name of the set of slice names.

The method continues at step 464 where the processing module recovers the data segment from received read specific responses. For example, the processing module dispersed storage error decodes a decode threshold number of encoded data slices of the set of encoded data slices to produce a recovered data segment. Alternatively, or in addition to, the processing module repeats the process to recover further data segments for aggregation to produce recovered data.

FIG. 42A is a schematic block diagram of another embodiment of a dispersed storage network (DSN) that includes a distributed storage and task (DST) execution (EX) unit set 470, the network 24 of FIG. 1, and a plurality of scanning modules 1-M. The DST execution unit set 470 includes a set of DST execution units 1-n. Each DST execution unit includes a plurality of memories 1-M. Each DST execution unit may be implemented utilizing the DST execution unit 36 of FIG. 1. Each memory may be implemented utilizing the memory 88 of FIG. 3. Each scanning module may be implemented utilizing one or more of the DST client module 34 of FIG. 1, the processing module 84 of FIG. 3, the controller 86 of FIG. 3, and the DT execution module 90 of FIG. 3.

The DSN functions to detect a storage error, where data is dispersed storage error encoded utilizing an information dispersal algorithm (IDA) function to produce a plurality of sets of encoded data slices for storage in the set of DST execution units 1-n. Each set of encoded data slices is associated with a set of slice names. Each set of slice names falls within a particular DSN address range of a plurality of DSN address ranges 1-M associated with the DST execution unit set. Each DSN address ranges associated with a set of memories of the set of DST execution units 1-n. For example, each memory 1 of the DST execution units 1-n is included in a first set of memories and is associated with a DSN address range 1. As such, encoded data slices associated with consecutive slice names of the DSN address range 1 are stored in the first set of memories 1. A set of memories may support more than one DSN address ranges.

In an example of operation of the detecting of the storage error, each scanning module identifies an associated DSN address range of the plurality of DSN address ranges for detection of storage errors. Each scanning module may be associated with one or more DSN address ranges. The identifying includes one or more of interpreting system registry information, receiving scanning assignment information, identifying a need for scanning, interpreting an error message, and interpreting a received request. For example, the scanning module 1 identifies the DSN address range 1 for the detection of the storage errors based on interpreting the system registry information.

Having identified the associated DSN address range, each scanning module initiates scanning for the storage errors within the identified associated DSN address range utilizing a scanning rate (e.g., scan requests issued per unit of time) associated with the scanning module. The initiating includes one or more of issuing scan requests and receiving scan responses. For example, the scanning module 1 issues scan requests 1-n, where each scan request includes a list slice request, receives scan responses 1-n, where each scan response includes a list slice response, and interprets the scan responses 1-n to identify the storage errors (e.g., comparing a set of list slice responses to identify missing slices, receiving a corrupted slice information in a response).

Having initiated the scanning, the plurality of scanning modules obtains a target scanning performance level for the plurality of DSN address ranges. The plurality of scanning modules may obtain the target scanning performance level by exchanging scan coordination information 472 between the scanning modules. The scan coordination information 472 may be communicated directly or via the network 24. The obtaining may further include one or more of interpreting the system registry information, receiving the target scanning performance level, and interpreting a query response. The target scanning performance level includes at least one of an average scanning rate (e.g., sets of DSN addresses per second) and a maximum time frame for scanning through the plurality of DSN address ranges.

Having obtained the target scanning performance level, a plurality of scanning modules determines an actual scanning performance level for the plurality of DSN address ranges. The determining includes at least one of measuring the actual scanning performance levels and receiving the actual performance scanning levels. For example, each scanning module reports the actual scanning performance level associated with the scanning module to each of the plurality of scanning modules via the sharing of the scan coordination information.

Having determined the actual scanning performance level for the plurality of DSN address ranges, the plurality of scanning modules cooperatively determines, for each scanning module, an updated scanning rate based on the target scanning performance level and the actual scanning performance level. For example, when the actual scanning performance level is less than the target scanning performance level, the plurality of scanning modules determines updated scanning rates to be higher than the scanning rates such that a newly forecasted completion time frame is substantially the same as the maximum time frame for scanning through the plurality of DSN address ranges. Having determined the updated scanning rates, the plurality of scanning modules adjusts the scanning for the storage errors in accordance with the updated scanning rates.

FIG. 42B is a flowchart illustrating an example of cooperatively detecting a storage error. The method includes step 478 where each scanning module of a plurality of scanning modules identifies an associated dispersed storage network (DSN) address range of a plurality of DSN address ranges for detection of storage errors within a DSN. The identifying includes at least one of interpreting system registry information, interpreting a received message, and interpreting a request.

The method continues at step 480 where each scanning module initiates scanning for the storage errors within the identified associated DSN address range utilizing a scanning rate associated with the scanning module. For example, the scanning module obtains the scanning rate by calculating a rate based on a target completion time frame, issues list slice requests to a set of storage units associated with the DSN address range in accordance with the scanning rate, and interprets received list slice responses to identify the storage error.

The method continues at step 482 where the plurality of scanning modules obtains a target scanning performance level for the storage error detection across the plurality of DSN address ranges. The obtaining includes at least one of interpreting system registry information, receiving, interpreting a query response, and interpreting scan coordination information.

The method continues at step 484 where the plurality of scanning modules determines an actual scanning performance level for the storage error detection across the plurality of DSN address ranges. The determining includes one or more of receiving a scanning performance level associated with one or more of the plurality of scanning modules, determining an aggregate performance level of the received scanning performance levels as the actual scanning performance level, and updating scan coordination information shared with other scanning modules.

The method continues at step 486 where the plurality of scanning modules cooperatively determines, for each scanning module, an updated storage rate based on the target scanning performance level and the actual scanning performance level. The determining includes one or more of estimating a required updated scanning rate for each scanning module based on one or more of the scanning rate for the scanning module, a target scanning performance level, and the actual scanning performance level such that the estimated required updated scanning rate enables the plurality of scanning modules to substantially complete a level of desired scanning within an associated scanning time frame.

FIG. 43A is a schematic block diagram of another embodiment of a dispersed storage network (DSN) that includes a distributed storage and task (DST) execution (EX) unit set 490, and the network 24 of FIG. 1. The DST execution unit set 490 includes a set of DST execution units 1-n. Each DST execution unit may be implemented utilizing the DST execution unit 36 of FIG. 1. The DST execution unit set 490 stores one or more pluralities of sets of encoded data slices, where data is dispersed storage error encoded utilizing an information dispersal algorithm (IDA) to produce each plurality of sets of encoded data slices for storage in the DST execution unit set 1-n. For example, a set of encoded data slices 1A, 2A, 3A, through nA is stored in the set of DST execution units 1-n and another set of encoded data slices 1B, 2B, 3B, through nB is also stored in the set of DST execution units 1-n.

The DSN functions to produce a rebuilt encoded data slice when detecting a storage error. In an example of operation of the producing the rebuilt encoded data slice when detecting the storage error, a DST execution unit detects a storage error of an encoded data slice associated with the DST execution unit. The detecting includes one or more of identifying a missing encoded data slice and identifying a corrupted encoded data slice. The identifying of the missing encoded data slice includes issuing, via the network 24, list slice requests to the other DST execution units, receiving a list slice responses, and comparing the received list slice responses to identify the missing encoded data slice. For example, the DST execution unit 2 identifies the encoded data slice 2A as a missing encoded data slice storage error. The identifying of the corrupted encoded data slice includes indicating the corrupted encoded data slice when a calculated integrity value for the corrupted encoded data slice does not substantially match a stored integrity value for the corrupted encoded data slice. For example, the DST execution unit 2 identifies encoded data slice 2B as a corrupted encoded data slice storage error.

Having identified the storage error, the DST execution unit selects another DST execution unit for producing of a rebuilt encoded data slice to abate the storage error of the encoded data slice. The selecting includes identifying candidate other DST execution units of the set of DST execution units and choosing the other DST execution unit based on one or more of a DST execution unit loading level, a DST execution unit capacity level, a DST execution unit performance level, a predetermination, interpreting system registry information, and a DST execution unit rebuilding capability level. For example, the DST execution unit 2 selects the DST execution unit 1 for producing of a rebuilt encoded data slice 2A when the DST execution unit 1 is associated with a favorable DST execution unit rebuilding capability level and a favorable DST execution unit capacity level. As another example, the DST execution unit 2 selects the DST execution unit 3 for producing of a rebuilt encoded data slice 2B when the DST execution unit 3 is associated with a favorable DST execution unit loading level.

Having selected the other storage unit for producing of the rebuilt encoded data slice, the DST execution unit issues a rebuilding request to the selected other storage unit. For example, the DST execution unit 2 issues, via the network

24, a rebuilding request for the encoded data slice 2A to the DST execution unit 1 and issues, via the network 24, another rebuilding request for the encoded data slice 2B to the DST execution unit 3.

The selected other DST execution unit generates the rebuilt encoded data slice. For example, the DST execution unit 1 obtains a decode threshold number of encoded data slices of the set of encoded data slices 1A through nA from the DST execution unit set excluding the DST execution unit 2, dispersed storage error decodes the obtained decode threshold number of encoded data slices to produce a recovered data segment, and dispersed storage error encodes the recovered data segment to produce the rebuilt encoded data slice 2A. As another example, the DST execution unit 3 obtains another decode threshold number of encoded data slices of the set of encoded data slices 1B through nB from the DST execution unit set excluding the DST execution unit 2, dispersed storage error decodes the obtained other decode threshold number of encoded data slices to produce another recovered data segment, and dispersed storage error encodes the other recovered data segment to produce the rebuilt encoded data slice 2B.

Having produced the rebuilt encoded data slice, the selected other DST execution unit sends, via the network 24, the rebuilt encoded data slice to the DST execution unit for storage. For example, DST execution unit 1 sends, via the network 24, the rebuilt encoded data slice 2A to the DST execution unit 2 for storage. As another example, the DST execution unit 3 sends, via the network 24, the rebuilt encoded data slice 2B to the DST execution unit 2 for storage.

FIG. 43B is a flowchart illustrating an example of producing a rebuilt encoded data slice. The method includes step 494 where a storage unit of a set of storage units detects a storage error of encoded data slice associated with the storage unit of the set of storage units, where a set of encoded data slices stored by the set of storage units includes the encoded data slice. The detecting includes one or more of identifying a missing slice based on a slice storage pattern of the set of storage units, identifying a corrupted encoded data slice as the encoded data slice when a calculated integrity value compares unfavorably to a stored integrity value of the corrupted encoded data slice.

The method continues at step 496 where the storage unit selects another storage unit of the set of storage units for producing a rebuilt encoded data slice to abate the storage error of the encoded data slice. The selecting includes at least one of identifying candidate other storage units, obtaining performance information for the candidate other storage units, interpreting system registry information, and interpreting a rebuilding performance capability level of each candidate storage unit.

The method continues at step 498 where the storage unit issues a rebuilding request to the selected other storage unit. For example, the storage unit generates the rebuilding request to include a slice name associated with the encoded data slice. The generating may further include generating the rebuilding request to include rebuilding information, where the rebuilding information includes one or more of an encoding matrix of an information dispersal algorithm, a decoding matrix, and identities of storage units to be utilized for rebuilding utilizing a partial encoding approach.

The method continues at step 500 where the selected other storage unit generates the rebuilt encoded data slice. For example, the selected other storage unit obtains a decode threshold number of representations of encoded data slices of the set of encoded data slices, dispersed storage error decodes the decode threshold number of representations of the encoded data slices to produce a recovered data segment, and dispersed storage error encodes the recovered data segment to produce the rebuilt encoded data slice. The method continues at step 502 where the selected other storage unit sends the rebuilt encoded data slice to the storage unit for storage. For example, the selected other storage unit generates a write slice request that includes the rebuilt encoded data slice and associated slice name, and sends the write slice request to the storage unit.

FIG. 44A is a schematic block diagram of an embodiment of a decentralized agreement module 506 that includes a set of deterministic functions 1-N, a set of normalizing functions 1-N, a set of scoring functions 1-N, and a ranking function 508. Each of the deterministic function, the normalizing function, the scoring function, and the ranking function 508, may be implemented utilizing the processing module 84 of FIG. 3. The decentralized agreement module 506 may be implemented utilizing any module and/or unit of a dispersed storage network (DSN). For example, the decentralized agreement module 506 is implemented utilizing the distributed storage and task (DST) client module 34 of FIG. 1.

The decentralized agreement module 506 functions to receive a ranked scoring information request 510 and to generate ranked scoring information 514 based on the ranked scoring information request 510 and other information. The ranked scoring information request 510 includes one or more of an asset identifier (ID) 512 of an asset associated with the request, an asset type indicator, one or more location identifiers of locations (e.g., modules, units) associated with the DSN, one or more corresponding location weights (e.g., weighting factor), and a requesting entity ID. The asset includes any portion of data associated with the DSN including one or more asset types including a data object, a data record, an encoded data slice, a data segment, a set of encoded data slices, and a plurality of sets of encoded data slices. As such, the asset ID 512 of the asset includes one or more of a data name, a data record identifier, a DSN address, a source name, a slice name, and a plurality of sets of slice names.

Each location of the DSN includes an aspect of a DSN resource. Examples of locations includes one or more of a storage unit, a memory device of the storage unit, a site, a storage pool of storage units, a pillar index associated with each encoded data slice of a set of encoded data slices generated by an information dispersal algorithm (IDA), a DST client module 34 of FIG. 1, a DST processing unit 16 of FIG. 1, a DST integrity processing unit 20 of FIG. 1, a DSTN managing unit 18 of FIG. 1, a user device 12 of FIG. 1, and a user device 14 of FIG. 1.

Each location is associated with a location weight based on one or more of a resource prioritization of utilization scheme and physical configuration of the DSN. The location weight includes an arbitrary bias which adjusts a proportion of selections to an associated location such that a probability that an asset will be mapped to that location is equal to the location weight divided by a sum of all location weights for all locations of comparison. For example, each storage pool of a plurality of storage pools is associated with a location weight based on storage capacity. For instance, storage pools with more storage capacity are associated with higher location weights than others.

The other information may include a set of location identifiers and a set of location weights associated with the set of location identifiers. For example, the other information includes location identifiers and location weights associated with a set of memory devices of a storage unit when the requesting entity utilizes the decentralized agreement module to produce ranked scoring information with regards to a selection of a memory device of the set of memory devices for accessing a particular encoded data slice (e.g., where the asset ID includes a slice name of the particular encoded data slice).

The decentralized agreement module 506 outputs substantially identical ranked scoring information for each ranked scoring information request 510 that includes substantially identical content of the ranked scoring information request 510. For example, a first requesting entity issues a first ranked scoring information request to the decentralized agreement module 506 and receives first ranked scoring information. A second requesting entity issues a second ranked scoring information request to the decentralized agreement module 506 and receives second ranked scoring information. The second ranked scoring information is substantially the same as the first ranked scoring information when the second ranked scoring information request is substantially the same as the first ranked scoring information request.

As such, two or more requesting entities may independently utilize the decentralized agreement module 506 (e.g., or two agreement modules) to determine substantially identical ranked scoring information. As a specific example, the first requesting entity selects a first storage pool of a plurality of storage pools for storing a set of encoded data slices utilizing the decentralized agreement module and the second requesting entity identifies the first storage pool of the plurality of storage pools for retrieving the set of encoded data slices utilizing the decentralized agreement module.

In an example of operation, the decentralized agreement module 506 receives the ranked scoring information request 510. Each deterministic function performs a deterministic function on a combination and/or concatenation (e.g., add, append, interleave) of the asset ID 512 of the request and an associated location ID of the set of location IDs to produce an interim result. The deterministic function includes at least one of a hashing function, a hash-based message authentication code function, a mask generating function, a cyclic redundancy code function, hashing module of a number of locations, consistent hashing, rendezvous hashing, and a sponge function. As a specific example, deterministic function 2 appends a location ID 2 of a storage pool 2 to a source name as the asset ID 512 to produce a combined value and performs the mask generating function on the combined value to produce interim result 2.

With a set of interim results 1-N, each normalizing function performs a normalizing function on a corresponding interim result to produce a corresponding normalized interim result. The performing of the normalizing function includes dividing the interim result by a number of possible permutations of the output of the deterministic function to produce the normalized interim result. For example, normalizing function 2 performs the normalizing function on the interim result 2 to produce a normalized interim result 2.

With a set of normalized interim results 1-N, each scoring function performs a scoring function on a corresponding normalized interim result to produce a corresponding score. The performing of the scoring function includes dividing an associated location weight by a negative log of the normalized interim result. For example, scoring function 2 divides location weight 2 of the storage pool 2 (e.g., associated with location ID 2) by a negative log of the normalized interim result 2 to produce a score 2.

With a set of scores 1-N, the ranking function 508 performs a ranking function on the set of scores 1-N to generate the ranked scoring information 514. Performing the ranking function includes rank ordering each score with other scores of the set of scores 1-N, where a highest score is ranked first. As such, a location associated with the highest score may be considered a highest priority location for resource utilization (e.g., accessing, storing, retrieving, etc., the given asset of the request). Having generated the ranked scoring information 514, the decentralized agreement module 506 outputs the ranked scoring information 514 to the requesting entity.

FIG. 44B is a flowchart illustrating an example of selecting a resource. The method includes step 520 where a processing module (e.g., of a decentralized agreement module) receives a ranked scoring information request from a requesting entity with regards to a set of candidate resources. For each candidate resource, the method continues at step 522 where the processing module performs a deterministic function on a location identifier (ID) of the candidate resource and an asset ID of the ranked scoring information request to produce an interim result. As a specific example, the processing module combines the asset ID and the location ID of the candidate resource to produce a combined value and performs a hashing function on the combined value to produce the interim result.

For each interim result, the method continues at step 524 where the processing module performs a normalizing function on the interim result to produce a normalized interim result. As a specific example, the processing module obtains a permutation value associated with the deterministic function (e.g., maximum number of permutations of output of the deterministic function) and divides the interim result by the permutation value to produce the normalized interim result (e.g., with a value between 0 and 1).

For each normalized interim result, the method continues at step 526 where the processing module performs a scoring function on the normalized interim result utilizing a location weight associated with the candidate resource associated with the interim result to produce a score of a set of scores. As a specific example, the processing module divides the location weight by a negative log of the normalized interim result to produce the score.

The method continues at step 528 where the processing module rank orders the set of scores to produce ranked scoring information (e.g., ranking a highest value first). The method continues at step 530 where the processing module outputs the ranked scoring information to the requesting entity. The requesting entity may utilize the ranked scoring information to select one location of a plurality of locations.

FIG. 44C is a schematic block diagram of an embodiment of a dispersed storage network (DSN) that includes the distributed storage and task (DST) processing unit 16 of FIG. 1, the network 24 of FIG. 1, and distributed storage and task network (DSTN) module 22 of FIG. 1. The DSTN module 22 includes a plurality of DST execution (EX) unit pools 1-P. The DST processing unit 16 includes a decentralized agreement module 536 and the DST client module 34 of FIG. 1. The decentralized agreement module 536 may be implemented utilizing the decentralized agreement module 506 of FIG. 44A. Each DST execution unit pool includes a plurality of DST execution units. Each DST execution unit may be implemented utilizing the DST execution unit 36 of FIG. 1. Each DST execution unit may be implemented at one site of S sites. Each DST execution unit may be associated with at least one pillar of N pillars associated with an information dispersal algorithm. Each site may not include every pillar and a given pillar may be implemented at more than one site. Each DST execution unit includes a plurality of memories 1-M.

The DSN functions to receive data access requests 538, select resources of at least one DST execution unit pool for data access, utilize the selected DST execution unit pool for the data access, and issued a data access response 548 based on the data access. The selecting of the resources includes utilizing a decentralized agreement function of the decentralized agreement module 536, where a plurality of locations are ranked against each other. The selecting may include one or more of selecting one storage pool of the plurality of storage pools, selecting DST execution units at various sites of the plurality of sites, selecting a memory of the plurality of memories for each DST execution unit, and selecting combinations of memories, DST execution units, sites, pillars, and storage pools.

In an example of operation, the DST client module 34 receives the data access request 538 from a requesting entity, where the data access request 538 includes at least one of a store data request, a retrieve data request, a delete data request, a data name, and a requesting entity identifier (ID). Having received the data access request 538, the DST client module 34 determines a DSN address associated with the data access request. The DSN address includes at least one of a source name (e.g., including a vault ID and an object number associated with the data name), a data segment ID, a set of slice names, a plurality of sets of slice names. The determining includes at least one of generating (e.g., for the store data request) and retrieving (e.g., from a DSN directory) based on the data name (e.g., for the retrieve data request).

Having determined the DSN address, the DST client module 34 selects a plurality of resource levels (e.g., DST EX unit pool, site, DST execution unit, pillar, memory) associated with the DSTN module 22. The determining may be based on one or more of the data name, the requesting entity ID, a predetermination, a lookup, a DSN performance indicator, and interpreting an error message. For example, the DST client module 34 selects the DST execution unit pool as a first resource level and a set of memory devices of a plurality of memory devices as a second resource level based on a system registry lookup for a vault associated with the requesting entity.

Having selected the plurality resource levels, the DST client module 34, for each resource level, issues a ranked scoring information request 540 to the decentralized agreement module 536 utilizing the DSN address as an asset ID. The decentralized agreement module 536 performs the decentralized agreement function the asset ID based on locations of the selected resource levels, and location weights of the locations to generate ranked scoring information.

For each resource level, the DST client module 34 receives corresponding ranked scoring information 542. Having received the ranked scoring information 542, the DST client module 34 identifies one or more resources associated with the resource level based on the rank scoring information. For example, the DST client module 34 identifies a DST execution unit pool associated with a highest score and identifies a set of memory devices within DST execution units of the identified DST execution unit pool with a highest score.

Having identified the one or more resources, the DST client module 34 accesses the DSTN module 22 based on the identified one or more resources associated with each resource level. For example, the DST client module 34 issues resource access requests 544 (e.g., write slice requests when storing data, read slice requests when recovering data) to the identified DST execution unit pool, where the requests further identify identified set of memory devices. Having accessed the DSTN module 22, the DST client module 34 receives resource access responses 546 (e.g., write slice responses, read slice responses). The DST client module 34 issues the data access response 548 based on the received resource access responses 546. For example, the DST client module 34 decodes received encoded data slices to reproduce data and generates the data access response 548 to include the reproduced data.

FIG. 44D is a flowchart illustrating an example of accessing a dispersed storage network (DSN) memory. The method includes step 556 where a processing module (e.g., of a distributed storage and task (DST) client module) receives a data access request from a requesting entity. The data access request includes one or more of the storage request, retrieval request, the requesting entity identifier, and a data identifier. The method continues at step 558 where the processing module determines a DSN address associated with the data access request. For example, the processing module generates the DSN address for the storage request. As another example, the processing module performs a lookup for the retrieval request based on the data identifier.

The method continues at step 560 where the processing module selects a plurality resource levels associated with the DSN memory. The selecting may be based on one or more of a predetermination, a range of weights associated with available resources, a resource performance level, and a resource performance requirement level. For each resource level, the method continues at step 562 where the processing module determines ranked scoring information. For example, the processing module issues a ranked scoring information request to a decentralized agreement module based on the DSN address and receives corresponding ranked scoring information for the resource level.

For each resource level, the method continues at step 564 where the processing module selects one or more resources associated with the resource level based on the ranked scoring information. For example, the processing module selects a resource associated with a highest score when one resource is required. As another example, the processing module selects a plurality of resources associated with highest scores when a plurality of resources are required.

The method continues at step 566 where the processing module accesses the DSN memory utilizing the selected one or more resources for each of the plurality resource levels. For example, the processing module identifies network addressing information based on the selected resources including one or more of a storage unit Internet protocol address and a memory device identifier, generates a set of encoded data slice access requests based on the data access request and the DSN address, and sends the set of encoded data slice access requests to the DSN memory utilizing the identified network addressing information.

The method continues at step 568 where the processing module issues a data access response to the requesting entity based on one or more resource access responses from the DSN memory. For example, the processing module issues a data storage status indicator when storing data. As another example, the processing module generates the data access response to include recovered data when retrieving data.

FIG. 45A is a schematic block diagram of another embodiment of a dispersed storage network (DSN) that includes a distributed storage and task (DST) execution (EX) unit set 574, the network 24 of FIG. 1, and a plurality of rebuilding modules 1-R. The DST execution unit set 574 includes a set of DST execution units 1-n. Each DST execution unit includes a plurality of memories 1-M. Each DST execution unit may be implemented utilizing the DST execution unit 36 of FIG. 1. Each memory may be implemented utilizing the memory 88 of FIG. 3. Each rebuilding module may be implemented utilizing one or more of the DST processing unit 16 of FIG. 1, the DST execution unit 36 of FIG. 1, and the DST integrity processing unit 20 of FIG. 1. Each rebuilding module includes the DST client module 34 of FIG. 1 and a decentralized agreement module 576, where the decentralized agreement module 576 may be implemented utilizing the decentralized agreement module 506 of FIG. 44A.

The DSN functions to autonomously allocate rebuilding resources, where data is dispersed storage error encoded utilizing an information dispersal algorithm (IDA) function to produce a plurality of sets of encoded data slices for storage in the set of DST execution units 1-n. Each set of encoded data slices is associated with a set of slice names. Each set of slice names falls within a particular DSN address range of a plurality of DSN address ranges 1-M associated with the DST execution unit set 574. Each DSN address ranges associated with a set of memories of the set of DST execution units 1-n. For example, each memory 1 of the DST execution units 1-n is included in a first set of memories and is associated with a DSN address range 1. As such, encoded data slices associated with consecutive slice names of the DSN address range 1 are stored in the first set of memories 1. A set of memories may support more than one DSN address ranges.

In an example of operation of the autonomous allocation of the rebuilding resources, each rebuilding module selects a DSN address range of the plurality of DSN address ranges for rebuilding activities. Each rebuilding module may be associated with one or more DSN address ranges. The selecting includes one or more of interpreting system registry information, receiving rebuilding assignment information, identifying a need for rebuilding, interpreting an error message, a random selection, a round-robin selection, and interpreting a received request. For example, the rebuilding module 1 identifies the DSN address range 1 for the rebuilding activities based on interpreting the system registry information.

Having identified the associated DSN address range, the rebuilding module determines a rebuilding activity capacity level for the selected DS and address range. The determining includes at least one of interpreting a query response, performing a lookup, and receiving the rebuilding activity capacity level from one or more DST execution units of the set of DST execution units 1-n.

Having determined the rebuilding activity capacity level, the rebuilding module determines a maximum number of rebuilding modules for assignment to the selected DSN address range based on the rebuilding activity capacity level. The determining may be based on one or more of performing a lookup, calculating the maximum number based on historical capacity levels, and receiving the maximum number.

Having identified the maximum number of rebuilding modules, the rebuilding module identifies distributed agreement protocol function weights of available rebuilding modules (e.g., "locations" associated with the distributed agreement protocol function). The identifying includes at least one of performing a lookup, initiating a query, interpreting system registry information, interpreting a query response, and receiving. For example, the rebuilding module 1 interprets the system registry information to determine the distributed agreement protocol function weights of the rebuilding modules 1-R.

Having identified the distributed agreement protocol function weights, the DST client module 34 of the rebuilding module issues a ranked scoring information request 578 to the decentralized agreement module 576 of the rebuilding module, where the request includes the DSN address range (e.g., the asset indicating a starting source name) and the weights of the available rebuilding modules. The decentralized agreement module 576 performs a decentralized agreement protocol function on the DSN address range utilizing the weights of the available rebuilding modules to produce ranked scoring information 580. The ranked scoring information 580 includes a ranked ordering of identifiers of the available rebuilding modules with regards to conducting the rebuilding activities within the DSN address range.

The DST client module 34 identifies the maximum number of ranked rebuilding modules based on received rank scoring information 580. For example, the DST client module 34 identifies the two highest ranked rebuilding modules that include rebuilding modules 1 and 3, when the maximum number of ranked rebuilding modules is two and the rebuilding modules 1 and 3 are ranked the highest.

With the rebuilding modules included in the identification of the maximum number of ranked rebuilding modules, the DST client module of the rebuilding module facilitates the rebuilding activities within the DSN address range. The facilitating includes issuing rebuild requests 1-n to the DST execution unit set, receiving rebuild responses 1-n, and interpreting the received rebuild responses 1-n for further processing. The rebuild requests may include one or more of a list slice request, a store rebuilt slice request, a rebuilding activity capacity query, and a read slice representation request. The rebuild responses may include one or more of a list slice response, a store rebuilt slice request, a rebuilding activity capacity query response, and a read slice representation response. For example, the rebuilding module one issues, via the network 24, rebuild requests 1-n that includes list slice requests to the DST execution units 1-n, receives, via the network 24, rebuild responses 1-n that includes list slice responses, and identifies encoded data slices associated with storage errors by comparing and analyzing the list slice responses.

FIG. 45B is a flowchart illustrating an example of autonomous allocation of rebuilding resources. The method includes step 586 where a rebuilding module of a plurality of rebuilding modules (e.g., of a distributed storage and task (DST) execution unit of a plurality of DST execution units) selects a DSN address range of a plurality of DSN address ranges for potential rebuilding activities. The selecting includes at least one of identifying a next DSN address range of a list of DSN address ranges, performing a random selection, and selecting based on an interpretation of an error message.

The method continues at step 588 where the rebuilding module determines a rebuilding activity capacity level for the selected DS and address range. The determining includes at least one of issuing a query request, interpreting a query response, performing a lookup, initiating a test, interpreting test results, and accessing a historical record.

The method continues at step 590 where the rebuilding module determines a maximum number of rebuilding modules for assignment to the selected DSN address range based on the rebuilding activity capacity level. The determining includes at least one of performing a lookup based on the rebuilding activity capacity level and an expected loading level for each rebuilding module, receiving an indication of the maximum number, and calculating the maximum number utilizing the deterministic function that includes constants derived from historical records.

The method continues at step 592 where the rebuilding module identifies distributed agreement protocol function weights of the plurality of rebuilding modules. The identifying includes at least one of interpreting system registry information, initiating a query, interpreting a query response, and receiving the weights. The method continues at step 594 where the rebuilding module performs a distributed agreement protocol function on a representation of the DSN address range utilizing the distributed agreement particle function weights of the plurality of rebuilding modules to produce a rank ordered list of rebuilding module identifiers. The representation of the DSN address range includes at least one of a data identifier, a slice name, a source name, and a vault identifier. The performing includes issuing a rank scoring information request to a decentralized agreement module and receiving a ranked scoring information response that includes a ranked ordered list of rebuilding module identifiers.

When an identifier of the rebuilding module is included within a top-ranked maximum number of rebuilding module identifiers of the rank ordered list, the method continues at step 596 where the rebuilding module facilitates rebuilding activities within the DSN address range. For example, the rebuilding module indicates to activate the rebuilding module when the identifier of the rebuilding module is included in the top-ranked maximum number of rebuilding module identifiers of the rank ordered list. As another example, when activated, the rebuilding module identifies one or more rebuilding tasks associated with the rebuilding activities and initiates execution of at least some of the one or more identified rebuilding tasks. Alternatively, or in addition to, the rebuilding module updates historical records indicating actual rebuilding activity loading levels corresponding to the execution of the identified rebuilding tasks by the rebuilding module and may further update the distributed agreement protocol function weight associated with the rebuilding module based on an updated rebuilding capacity level of the rebuilding module. For example, the rebuilding module raises the distributed agreement protocol function weight associated with the rebuilding module when the updated rebuilding capacity level has increased.

FIG. 46A is a schematic block diagram of another embodiment of a dispersed storage network (DSN) that includes a distributed storage and task (DST) execution (EX) unit set 600, the network 24 of FIG. 1, and the DST processing unit 16 of FIG. 1. The DST execution unit set includes a set of DST execution units 1-n. Each DST execution unit includes a plurality of memories 1-M, a secure memory 602, and the processing module 84 of FIG. 3. Each processing module 84 includes a deterministic function module 604 capable of performing at least one deterministic function. Each DST execution unit may be implemented utilizing the DST execution unit 36 of FIG. 1. The secure memory 602 may be implemented utilizing the memory 88 of FIG. 3, implemented such that a probability of remote access is substantially zero. Each memory 1-M may be implemented utilizing the memory 88 of FIG. 3.

The DSN functions to access a set of memories for storage of data, where the data is dispersed storage error encoded utilizing an information dispersal algorithm (IDA) function to produce a plurality of sets of encoded data slices for storage in the set of DST execution units 1-n. Each set of encoded data slices is associated with a set of slice names. Each set of slice names corresponds to a particular combination of memories of each of the DST execution units in accordance with the deterministic function. For example, a first set of memories includes the memory 1 of the DST execution unit 1, the memory 3 of the DST execution unit 2, the memory 10 of the DST execution unit 3, etc. As such, a set of encoded data slices may be associated with different memories of each of the DST execution units and encoded data slices of consecutive slice names may be associated with different sets of memories to provide a system security improvement.

In an example of operation of the accessing of the set of memories, a DST execution unit of the set of DST execution units receives an access request that includes a slice name 606 corresponding to an encoded data slice. The access request may include one of a write slice request, a read slice request, a delete slice request, and a list slice request. For example, the DST execution unit 1 receives an access request 1 that includes a write slice request for an encoded data slice of a slice name 1.

Having received the access request, the processing module 84 of the DST execution unit obtains a secure seed 608 associated with the DST execution unit. The secure seed 608 includes a predetermined number that is associated with the DST execution unit that may be utilized to seed the deterministic function such that the deterministic function produces an output that is unique as compared to utilization of another secure seed for a given common input. The obtaining includes at least one of retrieving the secure seed 608 from the secure memory 602 and recovering the secure seed 608 from the set of DST execution units 1-n (e.g., recovery a decode threshold number of encoded seed slices corresponding to the secure seed, dispersed storage error decoding the decode threshold number of encoded seed slices to reproduce the secure seed 608).

The DST execution unit may generate the secure seed 608 once for the DST execution unit (e.g., upon initial deployment of the DST execution unit). The generating includes utilizing a cryptographically strong pseudorandom number generator to produce a random number as the secure seed 608. As such, each DST execution unit may generate a unique secure seed that is stored in the corresponding secure memory of each of the DST execution units without external access.

Having obtained the secure seed 608, the deterministic function module 604 performs the deterministic function on the slice name 606 of the access request utilizing the secure seed 608 to produce a memory selection 610 where (e.g., an output indicating a value between 1-M). The deterministic function includes one or more of a hashing function, a hash based message authentication code function, a mask generating function, a logical function, and a sponge function. For example, the deterministic function module of the DST execution unit 1 performs the hash based message authentication code on the slice name 1 utilizing the secure seed 608 of the DST execution unit 1 as an encryption key to produce an intermediate value and performs a mask generating function on the intermediate value to produce the memory selection 610 with a value of 2 to select memory 2.

Having produced the memory selection 610, the DST execution unit accesses a memory corresponding to the memory selection 610 in accordance with the access request. For example, the DST execution unit 1 accesses the memory 2 to store the encoded data slice associated with the slice name of 1. Substantially simultaneously, the DST execution unit 2 may produce a corresponding memory selection to select the memory 11 of the DST execution unit 2 for storage of another encoded data slice associated with a slice name of 2, where the set of encoded data slices includes the encoded data slice of the slice name 1 and encoded data slice of the slice name 2. As such, for a given slice name, each DST execution unit will access a consistent memory for subsequent access requests, where each of the DST execution units likely utilizes a different memory (e.g., memory 2, memory 11, etc., rather than all memory 1 of each DST execution unit).

FIG. 46B is a flowchart illustrating an example of selecting a memory for accessing encoded data slices. The method includes step 616 where a processing module of a storage unit (e.g., of a distributed storage and task (DST) execution unit) receives an access request that includes a slice name corresponding to an encoded data slice. The receiving includes at least one of receiving a write slice request, receiving a read slice request, receiving a delete slice request, and receiving a list slice request. The receiving further includes interpreting the access request to extract the slice name.

The method continues at step 618 where the processing module obtains a secure seed associated with the slice name. The obtaining includes at least one of retrieving the secure seed from a local secure memory and recovering the secure seed from a dispersed storage network (DSN) memory. The obtaining may further include, when the secure seed does not exist, the processing module generating the secure seed and storing the secure seed in one or more of the local secure memory and the DSN memory.

The method continues at step 620 where the processing module performs a deterministic function on the received slice name utilizing the secure seed to produce a memory selection. The performing may include selecting the deterministic function based on one or more of a predetermination, a slice name, a lookup, and a function identifier of the access request. The performing further includes execution of the selected deterministic function on the received slice name utilizing the secure seed to see the deterministic function to produce the memory selection.

The method continues at step 622 where the processing module identifies a memory associated with the memory selection. The identifying includes at least one of performing a lookup utilizing the memory selection to produce a memory identifier, performing a reducing function on the memory selection to produce the memory identifier, and combining the memory selection with a memory constant to produce the memory identifier.

The method continues at step 624 where the processing module accesses the identified memory in accordance with the access request. The accessing includes at least one of storing the encoded data slice in the identified memory when the access request includes the write slice request, retrieving encoded data slice from the identified memory when the access request includes the read slice request, deleting the encoded data slice from the identified memory when the access request includes the delete slice request, and performing a slice integrity and/or listing function on the encoded data slice from the identified memory when the access request includes the list slice request.

FIGS. 47A-B are schematic block diagrams of another embodiment of a dispersed storage network (DSN) that includes a distributed storage and task (DST) execution (EX) unit set 630, the network 24 of FIG. 1, and the DST processing unit 16 of FIG. 1. The DST execution unit set 630 includes a set of DST execution units 1-n. Each DST execution unit includes at least one memory 88 of FIG. 3. Each DST execution unit may be implemented utilizing the DST execution unit 36 of FIG. 1. The DSN functions to efficiently store encoded data slices, where data is dispersed storage error encoded utilizing an information dispersal algorithm (IDA) function to produce a plurality of sets of encoded data slices for storage in the DST execution unit set.

FIG. 47A illustrates an example of operation of the efficient storage of the encoded data slices where the DST processing 16 sends, via the network 24, access requests that includes each set of the plurality of sets of encoded data slices to the set of DST execution units 1-n for storage of the plurality of sets of encoded data slices. Each DST execution unit may store an encoded data slice (e.g., associated with a common pillar) of two or more sets of encoded data slices as a group of encoded data slices in a common file within a file system of the DST execution unit. The DST execution unit stores each encoded data slice of the group of encoded data slices at a unique file offset within the common file in the memory 88 of the DST execution unit and produces local slice mapping information within the file system of the DST execution unit to associate each encoded data slice with a corresponding unique file offset. For example, the set of DST execution units 1-n stores a set of encoded data slices A1, A2, through An at a file offset of 0 within a file 1 in the memory 88 of each of the DST execution units, stores another set of encoded data slices B1, B2, through Bn at a file offset of 1 within the file 1 in the memory 88 of each of the DST execution units, stores yet another set of encoded data slices C1, C2, through Cn at a file offset of 2 within the file 1 in the memory 88 of each of the DST execution units, and stores a further set of encoded data slices D1, D2, through Dn at a file offset of 3 within the file 1 in the memory 88 of each of the DST execution units.

Having stored the encoded data slices in the set of DST execution units 1-n, each DST execution unit receives another access request that includes a delete slice request, where the delete slice request includes a slice name corresponding to a stored encoded data slice for deletion. The receiving includes receiving the delete slice request and interpreting the delete slice request to extract the slice name. For the example, the DST execution unit 1 receives another access request 1 that includes a delete slice request for encoded data slice B1.

Having received the delete slice request, the DST execution unit identifies a corresponding file identifier and file offset based on the slice name and the local slice mapping information. For example, the DST execution unit 1 identifies the file 1 and offset 1 corresponding to the encoded data slice B1 based on the local slice mapping information.

FIG. 47B illustrates further steps of the example of operation of the efficient storage of the encoded data slices where the DST execution unit facilitates releasing a portion of memory corresponding to storage of the encoded data slice of the delete slice request based on the file identifier and the file offset. The facilitating includes identifying the portion of the memory based on the file identifier and the file offset. For example, the DST execution unit 1 utilizes the file identifier 1 and the file offset 1 to access a file system table to retrieve an identifier for the portion of the memory (e.g., a physical memory designator for the memory 88, a block identifier, a track identifier, etc.) and issues a memory release request to a file system, where the memory release request includes the identifier of the portion of the memory. As such, a memory usage efficiency improvement may be provided by freeing up the portion of the memory for subsequent utilization (e.g., utilization for storage of a subsequently received encoded data slice for storage).

Having facilitated the releasing of the portion of the memory corresponding to the storage of the encoded data slice, the DST execution unit facilitates modifying the local slice mapping information based on the releasing of the portion of the memory to produce updated local slice mapping information in accordance with a modification approach. The modification approach includes one of hole punching and range collapsing. The modifying may include selecting the modification approach (e.g., interpreting a request, interpreting a predetermination). As a specific example, when the range collapsing approach is utilized, the DST execution unit reassigns the file offset to a next encoded data slice of the common file (e.g., associate a physical memory location of a next portion of the memory corresponding to the next encoded data slice over to the file offset; i.e., encoded data slice C1 is associated with file offset 1) and reassigns each subsequent file offset to a corresponding next encoded data slice through a last utilized of said associated with a last encoded data slice (i.e., encoded data slice D1 is associated with file offset 2). The modifying may further include indicating that a new last offset is available (e.g., file offset 3). As another specific example, when the hole punching approach is utilized, the DST execution unit indicates that the portion of the memory associated with the file offset 1 is available for subsequent reassignment.

FIG. 47C is a flowchart illustrating an example of efficiently storing encoded data slices. The method includes step 636 where a processing module of a storage unit (e.g., of a distributed storage and task (DST) execution unit) receives a delete slice request for encoded data slice, where a plurality of encoded data slices are packed into a common file at a corresponding plurality of file offsets, where the common file is stored in a memory, and where the plurality of encoded data slices includes the encoded data slice. The receiving includes interpreting the delete slice request to extract a slice name of the encoded data slice.

The method continues at step 638 where the processing module identifies a file offset of the plurality of offsets, where the file offset corresponds to the encoded data slice in accordance with a slice mapping. For example, the processing module performs a lookup within the slice mapping utilizing the slice name to identify one or more of a filename of the common file and the file offset corresponding to the slice name.

The method continues at step 640 where the processing module facilitates releasing a portion of the memory to a file system, where the portion of the memory is associated with the identified file offset. For example, the processing module issues a release memory request to the file system, where the release memory request includes one or more of a filename of the common file, the file offset, and an identified portion of the memory that corresponds to storage of encoded data slice.

The method continues at step 642 where the processing module facilitates modifying the slice mapping based on the releasing of the portion of the memory. The facilitating may include selecting a modification approach (e.g., hole punching, range collapsing) based on one or more of the request, interpreting a portion of system registry information, a storage efficiency indicator, and a storage efficiency goal. The facilitating further includes implementing the selected modification approach. As a specific example, when the selected approach includes the hole punching approach, the processing module implements the modification approach by indicating that the portion of the memory associated with the file offset is available for new use. As another specific example, when the selected approach includes the range collapsing approach, the processing module implements the modification approach by re-associating each subsequent sequential encoded data slice with a decremented file offset value.

FIG. 48A is a schematic block diagram of another embodiment of a dispersed storage network (DSN) that includes a distributed storage and task (DST) execution (EX) unit set 650, the network 24 of FIG. 1, and a rebuilding module 652. Each DST execution unit includes a plurality of memory portions 1-M, where one or more memory portions are associated with a common memory device. A memory portion may include one or more of a memory sector, a memory block, a memory track, and a memory cell. Each memory device may be implemented utilizing the memory 88 of FIG. 3. The rebuilding module 652 may be implemented utilizing the rebuilding module of FIG. 45A.

The DSN functions to identify an encoded data slice for rebuilding, where data is dispersed storage error encoded to produce a plurality of sets of encoded data slices, where each set of encoded data slices includes an information dispersal algorithm (IDA) width number n of encoded data slices, where a plurality of sets of slice names is generated that are associated with the plurality of sets of encoded data slices, and where the plurality of sets of encoded data slices and the associated plurality of sets of slice names are stored in the DST execution units 1-n. In an example of operation of the identifying of the encoded data slice for rebuilding, a DST execution unit detects a physical storage failure associated with a memory portion of the DST execution unit. The detecting includes at least one of initiating a memory test, interpreting a memory test result, interpreting a received error message, and determining that a calculated storage integrity value of the memory portion compares unfavorably with a stored integrity value of the memory portion. For example, DST execution unit 1 indicates that memory portion 2 of the DST execution unit 1 is associated with the physical storage failure when detecting that the memory portion 2 is associated with a memory failure (e.g., a lost memory block, a failed memory device, etc.).

Having detected the physical storage failure, the DST execution unit identifies the memory portion to produce a memory portion identifier. The identifying includes producing the memory portion identifier to include one or more of a memory identifier, a black identifier, a track identifier, etc., based on the detecting of the physical storage failure.

Having identified the memory portion, the DST execution unit identifies one or more encoded data slices associated with the memory portion to produce one or more slice names. As a specific example, the DST execution unit 1 accesses a physical location to slice name table utilizing the memory portion identifier 2 to extract the one or more slice names. As another specific example, the DST execution unit 1 identifies one or more corrupted encoded data slices associated with the memory portion 2.

Having identified the one or more encoded data slices, the DST execution unit selects which encoded data slices of the identified one or more encoded data slices associated with the memory portion require rebuilding. The selecting includes performing an integrity check. For example, the DST execution unit 1 indicates selecting each of the one or more encoded data slices when the DST execution unit 1 determines that calculated integrity values for the one or more encoded data slices compares unfavorably to stored integrity values for the one or more encoded data slices. Having identified which encoded data slices require rebuilding, the DST execution unit issues, via the network 24, rebuilding information to the rebuilding module 652, where the rebuilding information includes the identified encoded data slices that require rebuilding. For example, the DST execution unit 1 issues, via the network 24, rebuilding information 1 to the rebuilding module 652, where the rebuilding information 1 includes slice names of the selected one or more encoded data slices.

FIG. 48B is a flowchart illustrating an example of identifying an encoded data slice for rebuilding. The method includes step 656 where a processing module of a storage unit (e.g., of a distributed storage and task (DST) execution unit) detects a physical storage failure associated with a memory portion of the storage unit. The detecting includes at least one of interpreting a memory test result, interpreting a received error message, and detecting corruption within the memory portion.

The method continues at step 658 where the processing module identifies the memory portion to produce a memory portion identifier. The identifying may be based on one or more of the detecting of the storage failure, performing a lookup, and interpreting the error message. The method continues at step 660 where the processing module identifies one or more encoded data slices associated with the memory portion to produce one or more slice names. For example, the processing module accesses a physical location to slice name table utilizing the memory portion identifier. As another example, the processing module identifies one or more corrupted encoded data slices associated with the memory portion.

The method continues at step 662 where the processing module selects encoded data slices of the identified one or more encoded data slices for rebuilding. For example, the processing module verifies corruption of the one or more encoded data slices to produce the selected encoded data slices (e.g., by facilitating performing of an integrity check function). The method continues at step 664 where the processing module issues rebuilding information to a rebuilding module, where the rebuilding information includes identifiers of the selected encoded data slices for rebuilding. For example, the processing module generates the rebuilding information to include slice names of the selected encoded data slices and sends the rebuilding information to at least one of the rebuilding module, a DST integrity processing unit, and a DST execution unit, a DST processing unit. Alternatively, or in addition to, the processing module facilitates rebuilding of the selected encoded data slices and stores rebuilt encoded data slices in another memory portion of the storage unit.

FIG. 49A is a schematic block diagram of another embodiment of a dispersed storage network (DSN) that includes a distributed storage and task (DST) execution (EX) unit set 670 and the network 24 of FIG. 1. The DST execution unit set includes a set of DST execution units 1-n. Each DST execution unit includes a set of memories 1-M and at least one spare memory 672. Each of the memories and the at least one spare memory 672 may be implemented utilizing the memory 88 of FIG. 3. Each DST execution unit may be implemented utilizing the DST execution unit 36 of FIG. 1.

The DSN functions to store rebuilt encoded data slices, where data is dispersed storage error encoded utilizing an information dispersal algorithm (IDA) to produce a plurality of sets of an IDA width number n number of encoded data slices for storage in the set of DST execution units 1-n. For example, a first set of encoded data slices 1-1, 2-1, through n−1 is stored in the memories 1 of each of the DST execution units 1-n, a second set of encoded data slices 1-2, 2-2, through n−2 is stored in the memories 2 of each of the DST execution units 1-n, through an Mth set of encoded data slices 1-M, 2-M, through n-M is stored in the memories M of each of the DST execution units 1-n.

In an example of operation of the storing of the rebuilt encoded data slices, a DST execution unit detects a physical storage failure associated with a memory of the DST execution unit, where the memories associated with a sub-DSN address range and where a DSN address range of the DST execution unit includes the sub-DSN address range. The detecting includes at least one of interpreting an error message, interpreting a query response, and interpreting a test result. For example, the DST execution unit 1 interprets the test result to detect a memory failure associated with memory 2.

Having detected the physical storage failure, the DST execution unit identifies an available spare memory 672 of the DST execution unit. The identifying includes at least one of interpreting an associated list, initiating a query, interpreting a query response, and interpreting system registry information.

Having identified the available spare memory 672, the DST execution unit updates slice mapping information to associate the identified available spare memory 672 with the sub-DSN address range and to disassociate the memory with the sub-DSN address range. The updating includes one or more of recovering the slice mapping information, modifying the slice mapping information to produce the updated slice mapping information, and storing the updated slice mapping information.

Having updated the slice mapping information, the DST execution unit facilitates rebuilding one or more encoded data slices associated with the DST execution unit to produce one or more rebuilt encoded data slices. For example, for each encoded data slice, the DST execution unit 1 identifies a decode threshold number of encoded data slices of a set of encoded data slices that includes the encoded data slice, obtains representations of the decode threshold number of encoded data slices (e.g., receives slices, via the network 24, as slice representations 2-n; receives encoded partial slices as the slice representations), decodes the representations of the decode threshold number of encoded data slices to produce a recovered data segment, and dispersed storage error encodes the recovered data segment to produce the rebuilt encoded data slice.

Having produced the one or more rebuilt encoded data slices, the DST execution unit facilitates storing of the one or more rebuilt encoded data slices in the spare memory 672. The storing includes writing the one or more rebuilt encoded data slices in the spare memory 672 and further updating the slice mapping information to indicate that the one or more rebuilt encoded data slices are available for retrieval from the spare memory 672.

FIG. 49B is a flowchart illustrating an example of storing rebuilt encoded data slices. The method includes step 676 where a processing module of a storage unit (e.g., of a distributed storage and task (DST) execution unit) of a set of storage units of a dispersed storage network (DSN) detects a physical storage failure associated with a memory of the storage unit, where the memories associated with a sub-DSN address range. The detecting includes at least one of interpreting an error message, interpreting a query response, and interpreting a test result. The detecting may further include upon detection of the physical storage failure, accessing a slice mapping information utilizing an identifier of the memory to produce the sub-DSN address range.

The method continues at step 678 where the processing module selects an available spare memory of the storage unit. The selecting includes at least one of identifying one or more available spare memories of the storage unit; and choosing the available spare memory from the identified one or more available spare memories based on one or more of a capacity level, an estimated performance level, and a compatibility factor (e.g., similar to associated memories of other storage units of the set of storage units).

The method continues at step 680 where the processing module updates slice mapping information to associate the selected available spare memory with the sub-DSN address range. For example, the processing module updates a local table that includes the slice mapping information to associate the sub-DSN address range with the selected spare memory and to disassociate the sub-DSN address range from the memory.

The method continues at step 682 where the processing module facilitates rebuilding of one or more encoded data slices associated with the sub-DSN address range to produce one or more rebuilt encoded data slices. The facilitating includes at least one of rebuilding locally and issuing a rebuilding request to a rebuilding agent. As a specific example, when rebuilding locally, the processing module obtains a decode threshold number of slice representations of a set of encoded data slices that includes an encoded data slice for rebuilding, decodes the obtained slice representations to reproduce a data segment, and encodes the reproduced data segment to produce the rebuilt encoded data slice.

The method continues at step 684 where the processing module facilitates storing of the one or more rebuilt encoded data slices in the spare memory. As a specific example, when rebuilding locally, the processing module facilitate storage of the one or more rebuilt encoded data slices in the spare memory. As another specific example, when utilizing the rebuilding agent, the processing module issues an instruction to the rebuilding agent to send the one or more rebuilt encoded data slices to the storage unit for storage in the spare memory.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "operably coupled to", "coupled to", and/or "coupling" includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

As may also be used herein, the terms "processing module", "processing circuit", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

The present invention has been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

The present invention may have also been described, at least in part, in terms of one or more embodiments. An embodiment of the present invention is used herein to illustrate the present invention, an aspect thereof, a feature thereof, a concept thereof, and/or an example thereof. A physical embodiment of an apparatus, an article of manufacture, a machine, and/or of a process that embodies the present invention may include one or more of the aspects, features, concepts, examples, etc., described with reference to one or more of the embodiments discussed herein. Further, from figure to figure, the embodiments may incorporate the same or similarly named functions, steps, modules, etc., that may use the same or different reference numbers and, as such, the functions, steps, modules, etc., may be the same or similar functions, steps, modules, etc., or different ones.

While the transistors in the above described figure(s) is/are shown as field effect transistors (FETs), as one of ordinary skill in the art will appreciate, the transistors may be implemented using any type of transistor structure including, but not limited to, bipolar, metal oxide semiconductor field effect transistors (MOSFET), N-well transistors, P-well transistors, enhancement mode, depletion mode, and zero voltage threshold (VT) transistors.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of the various embodiments of the present invention. A module includes a processing module, a functional block, hardware, and/or software stored on memory for performing one or more functions as may be described herein. Note that, if the module is implemented via hardware, the hardware may operate independently and/or in conjunction software and/or firmware. As used herein, a module may contain one or more sub-modules, each of which may be one or more modules.

While particular combinations of various functions and features of the present invention have been expressly described herein, other combinations of these features and functions are likewise possible. The present invention is not limited by the particular examples disclosed herein and expressly incorporates these other combinations.

What is claimed is:

1. A method comprises:
   receiving, by a storage unit of a set of storage units of a dispersed storage network (DSN) from a computing device of the DSN, a write request of a set of write requests regarding an encoded data slice of a set of encoded data slices, wherein a data segment of data is dispersed storage error encoded to produce the set of encoded data slices, wherein the write request includes a write set information table that includes a listing of which storage unit of the set of storage units is being sent which encoded data slice of the set of encoded data slices for storage therein;
   interpreting, by the storage unit, the write set information table to determine that a particular encoded data slice assigned to a particular storage unit should be stored by a different storage unit; and
   facilitating, by the storage unit, storing of the particular encoded data slice in the different storage unit.

2. The method of claim 1 further comprises:
   determining, by the storage unit, a soft failure of the particular storage unit, wherein the storage unit is the particular storage unit;
   selecting, by the storage unit, the different storage unit based on an accessible factor;
   sending, by the storage unit, the write request to the different storage unit, wherein the write request includes the particular encoded data slice, and wherein the encoded data slice is the particular encoded data slice; and
   recording, by the storage unit, a transfer of the write request to the different storage unit.

3. The method of claim 2 further comprises:
   the soft failure including one or more of: an overloading condition, a storage capacity condition, a data rate condition, and a memory availability condition; and
   the accessible factor including one or more of: type of coupling between the storage unit and the different storage unit, a reliability factor of the different storage unit, a data rate of the different storage unit, and an availability factor of the different storage unit.

4. The method of claim 1 further comprises:
   determining, by the storage unit, that the particular storage unit is off-line;
   selecting, by the storage unit, the different storage unit based on an accessible factor;
   sending, by the storage unit, a corresponding write request of the set of write requests to the different storage unit, wherein the corresponding write request includes the particular encoded data slice; and
   recording, by the storage unit, the transferring of the corresponding write request to the different storage unit.

5. The method of claim 4 further comprises:
   reading, by the storage unit, the write request sent to the particular storage unit via a connection between the storage unit and the particular storage unit.

6. The method of claim 1 further comprises:
   updating, by storage unit, the write set information table to indicate that the particular encoded data slice is being stored by the different storage unit; and
   sending, by the storage unit, the updated write set information table to the computing device.

7. The method of claim 1 further comprises:
   receiving, by the storage unit from the computing device, a read request for the particular encoded data slice, wherein the storage unit is the particular storage unit, and wherein the encoded data slice is the particular encoded data slice;
   forwarding, by the storage unit, the read request to the different storage unit; and
   sending, by the different storage unit or the storage unit, the particular encoded data slice to the computing device in response to the read request.

8. A storage unit of a set of storage units of a dispersed storage network (DSN), the storage unit comprises:

an interface;

memory; and a processing module operably coupled to the memory and the interface, wherein the processing module is operable to:

receive, from a computing device of the DSN, a write request of a set of write requests regarding an encoded data slice of a set of encoded data slices, wherein a data segment of data is dispersed storage error encoded to produce the set of encoded data slices, wherein the write request includes a write set information table that includes a listing of which storage unit of the set of storage units is being sent which encoded data slice of the set of encoded data slices for storage therein;

interpret the write set information table to determine that a particular encoded data slice assigned to a particular storage unit should be stored by a different storage unit; and facilitate storing of the particular encoded data slice in the different storage unit.

9. The storage unit of claim 8, wherein the processing module is further operable to:

determine a soft failure of the particular storage unit, wherein the storage unit is the particular storage unit;

select the different storage unit based on an accessible factor;

send the write request to the different storage unit, wherein the write request includes the particular encoded data slice, and wherein the encoded data slice is the particular encoded data slice; and record a transfer of the write request to the different storage unit.

10. The storage unit of claim 9 further comprises:

the soft failure including one or more of: an overloading condition, a storage capacity condition, a data rate condition, and a memory availability condition; and the accessible factor including one or more of: type of coupling between the storage unit and the different storage unit, a reliability factor of the different storage unit, a data rate of the different storage unit, and an availability factor of the different storage unit.

11. The storage unit of claim 8, wherein the processing module is further operable to:

determine that the particular storage unit is off-line;

select the different storage unit based on an accessible factor;

send a corresponding write request of the set of write requests to the different storage unit, wherein the corresponding write request includes the particular encoded data slice; and record the transferring of the corresponding write request to the different storage unit.

12. The storage unit of claim 11, wherein the processing module is further operable to:

read the write request sent to the particular storage unit via a connection between the storage unit and the particular storage unit.

13. The storage unit of claim 8, wherein the processing module is further operable to:

update the write set information table to indicate that the particular encoded data slice is being stored by the different storage unit; and send the updated write set information table to the computing device.

14. The storage unit of claim 8, wherein the processing module is further operable to:

receive a read request for the particular encoded data slice, wherein the storage unit is the particular storage unit, and wherein the encoded data slice is the particular encoded data slice;

forward the read request to the different storage unit; and send the particular encoded data slice to the computing device in response to the read request.

* * * * *